(12) United States Patent
Yokoyama et al.

(10) Patent No.: US 9,578,718 B2
(45) Date of Patent: Feb. 21, 2017

(54) METHOD FOR MANUFACTURING LIGHT-EMITTING ELEMENT AND DEPOSITION APPARATUS

(71) Applicant: Semiconductor Energy Laboratory Co., Ltd., Kanagawa-ken (JP)

(72) Inventors: Kohei Yokoyama, Kanagawa (JP); Hisao Ikeda, Kanagawa (JP); Shinichi Hirasa, Kanagawa (JP); Yasuhiro Jinbo, Kanagawa (JP); Natsuko Takase, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 759 days.

(21) Appl. No.: 13/870,246

(22) Filed: Apr. 25, 2013

(65) Prior Publication Data

US 2013/0295275 A1    Nov. 7, 2013

(30) Foreign Application Priority Data

May 4, 2012    (JP) .................................. 2012-105543
May 4, 2012    (JP) .................................. 2012-105544
Mar. 15, 2013    (JP) .................................. 2013-053385

(51) Int. Cl.
| | | |
|---|---|---|
| *H05B 33/10* | (2006.01) | |
| *C23C 14/24* | (2006.01) | |
| *C23C 14/54* | (2006.01) | |
| *C23C 14/56* | (2006.01) | |
| *H01L 51/00* | (2006.01) | |
| *H01L 51/56* | (2006.01) | |

(52) U.S. Cl.
CPC ............. *H05B 33/10* (2013.01); *C23C 14/24* (2013.01); *C23C 14/54* (2013.01); *C23C 14/564* (2013.01); *H01L 51/001* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,770,562 B2 | 8/2004 | Yamazaki et al. | |
| 6,776,880 B1 | 8/2004 | Yamazaki | |
| 7,059,928 B2 | 6/2006 | Ikeda | |
| 7,258,768 B2 | 8/2007 | Yamazaki | |
| 7,416,464 B2 | 8/2008 | Ikeda | |
| 7,482,631 B2 | 1/2009 | Yamazaki et al. | |
| 7,638,168 B2 | 12/2009 | Boroson et al. | |
| 8,278,135 B2 | 10/2012 | Yamazaki et al. | |
| 8,563,333 B2 | 10/2013 | Yamazaki et al. | |
| 2002/0108572 A1* | 8/2002 | Yamazaki ............... C23C 14/12 118/715 |
| 2006/0003087 A1* | 1/2006 | Takase ..................... H01J 9/02 427/64 |
| 2010/0031878 A1 | 2/2010 | Priddy et al. | |
| 2010/0035371 A1* | 2/2010 | Yamazaki ............. C23C 14/048 438/29 |

FOREIGN PATENT DOCUMENTS

| | | |
|---|---|---|
| CN | 001717764 A | 1/2006 |
| JP | 2001-102170 | 4/2001 |
| JP | 2005-050804 A | 2/2005 |
| JP | 2005-276704 A | 10/2005 |
| JP | 2008-069459 A | 3/2008 |
| JP | 2009-076818 A | 4/2009 |
| JP | 2009-516072 | 4/2009 |
| JP | 2011-210562 A | 10/2011 |
| JP | 2011-246785 A | 12/2011 |
| JP | 2012-46780 | 3/2012 |
| KR | 2011-0033655 A | 3/2011 |
| WO | WO 2004/064453 A1 | 7/2004 |
| WO | WO 2007/058775 A2 | 5/2007 |
| WO | WO 2012/008275 A1 | 1/2012 |

OTHER PUBLICATIONS

Chinese Office Action re Application No. CN 201310159721.2, dated Jul. 28, 2016.

* cited by examiner

*Primary Examiner* — Shamim Ahmed
*Assistant Examiner* — Bradford Gates
(74) *Attorney, Agent, or Firm* — Husch Blackwell LLP

(57) ABSTRACT

In order to provide a highly reliable organic EL element, a first step in which a deposition material is heated and vaporized in a deposition chamber in which the pressure is reduced and a second step in which a layer included in an EL layer is deposited in the deposition chamber are performed while exhaustion is performed and the partial pressure of water in the deposition chamber is measured with a mass spectrometer. Alternatively, the deposition chamber in the deposition apparatus includes a deposition material chamber and is connected to an exhaust mechanism. The deposition material chamber is separated from the deposition chamber by a sluice valve, includes a deposition material holding portion including a heating mechanism, and is connected to a mass spectrometer and an exhaust mechanism.

23 Claims, 29 Drawing Sheets

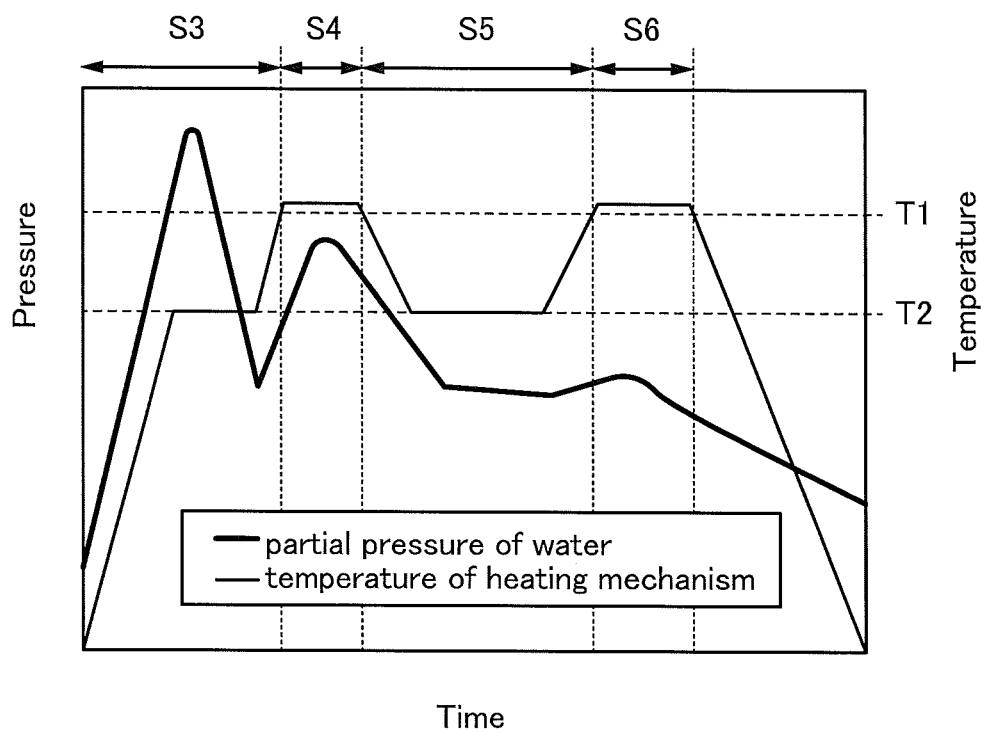

FIG. 5A
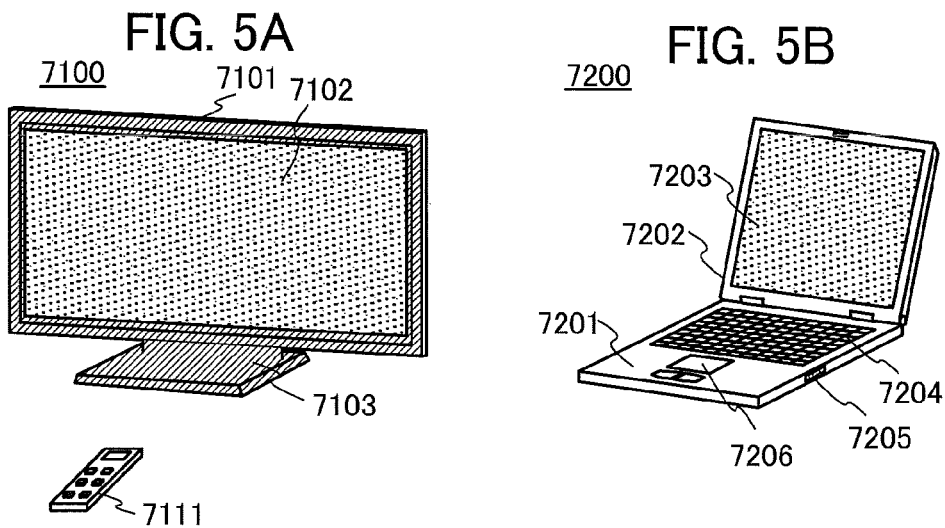
FIG. 5B
FIG. 5C
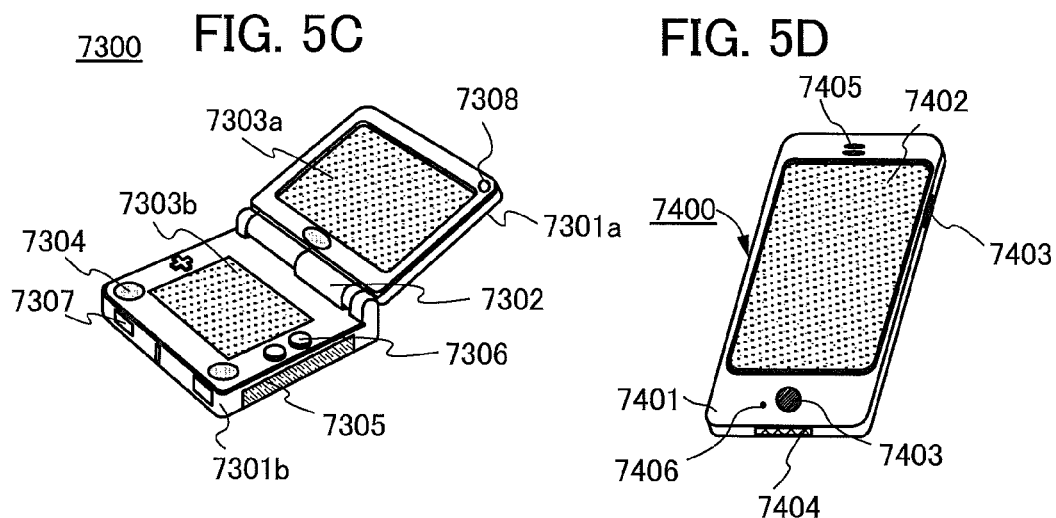
FIG. 5D
FIG. 5E
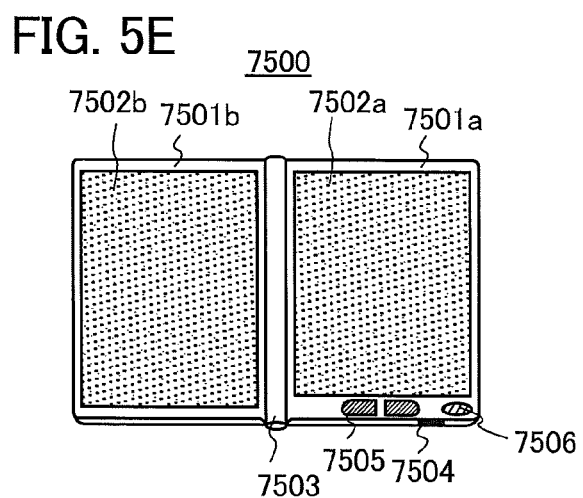

METHOD FOR MANUFACTURING LIGHT-EMITTING ELEMENT AND DEPOSITION APPARATUS

BACKGROUND OF THE INVENTION

1. Field of the Invention

The present invention relates to a method for manufacturing a light-emitting element using an organic electroluminescence (EL) phenomenon (hereinafter such a light-emitting element is also referred to as an organic EL element). The present invention also relates to a deposition apparatus used for manufacture of the organic EL element.

2. Description of the Related Art

An organic EL element has been actively researched and developed. In a fundamental structure of the organic EL element, a layer containing a light-emitting organic compound (EL layer) is interposed between a pair of electrodes. The organic EL element has attracted attention as a next-generation flat panel display element owing to characteristics such as feasibility of being thinner and lighter, high speed response to input signals, and capability of direct current low voltage driving. In addition, a display using an organic EL element has a feature that it is excellent in contrast and image quality, and has a wide viewing angle. Further, the organic EL element has been attempted to be applied as a light source such as a backlight of a liquid crystal display and a lighting device because the organic EL element is a plane light source.

It is known that an organic compound or a metal material used for the organic EL element easily reacts with impurities such as moisture and oxygen and easily deteriorates. The organic compound or the metal material reacts with the impurities, whereby the lifetime of the organic EL element is largely shortened.

Therefore, in the case where an organic EL element is formed, a technique by which a process of removing moisture and the like on a surface of a lower electrode, forming an EL layer and an upper electrode thereover, and sealing is performed without exposure to the atmosphere is required. For example, a multi-chamber or in-line thin film formation device by which formation of an EL layer, formation of an upper electrode, and sealing can be performed is known (Patent Document 1).

REFERENCE

Patent Document

[Patent Document 1] Japanese Published Patent Application No. 2001-102170

SUMMARY OF THE INVENTION

In the case where a deposited film included in an organic EL element is formed, by reduction in pressure in a deposition chamber, heating of a deposition material, or the like, impurities such as moisture in the deposition material are exhausted to the deposition chamber. When the deposited film is affected by these impurities, reliability of an organic EL element to be manufactured is decreased (the lifetime is shortened).

One embodiment of the present invention is to provide a highly reliable organic EL element. Another embodiment of the present invention is to provide a deposition apparatus by which a highly reliable organic EL element can be manufactured.

One embodiment of the present invention is a method for manufacturing a light-emitting element including a layer containing a light-emitting organic compound (EL layer) between a pair of electrodes (organic EL element). In the method, a first step in which moisture in a deposition material placed in a deposition chamber is exhausted to the outside of the deposition chamber and a second step in which a layer included in an EL layer is deposited using the deposition material are performed while the partial pressure of water in the deposition chamber is measured with a mass spectrometer.

Even when the deposition material is heated for sufficient time in the first step, moisture is not sufficiently released from the deposition material depending on the heating temperature in some cases. In this case, when the deposition is performed in the second step by vaporizing the deposition material to deposit at a temperature higher than the heating temperature, moisture left in the deposition material is released from the deposition material. Therefore, in one embodiment of the present invention, the deposition material is heated and partly vaporized in the first step. Thus, moisture in the deposition material can be sufficiently removed. Further, when the deposition material is vaporized in the second step, the amount of moisture released from the deposition material is small.

While the partial pressure of water is measured with the mass spectrometer, moisture in the deposition material is exhausted to the outside of the deposition chamber; thus, it is confirmed that moisture is sufficiently removed from the deposition material and the deposition chamber, and then, the deposition can be performed. Consequently, a layer to be deposited can have less moisture, which enables a highly reliable organic EL element to be manufactured.

One embodiment of the present invention is a method for manufacturing a light-emitting element including a layer containing a light-emitting organic compound between a pair of electrodes over a substrate. In the method, a first step in which a deposition material is heated and vaporized in a deposition chamber in which the pressure is reduced and a second step in which a layer included in the layer containing a light-emitting organic compound is deposited in the deposition chamber after the substrate is carried into the deposition chamber are performed while exhaustion is performed and the partial pressure of water in the deposition chamber is measured with a mass spectrometer.

One embodiment of the present invention is a method for manufacturing a light-emitting element including a layer containing a light-emitting organic compound between a pair of electrodes. In the method, a first step in which a deposition material is heated and vaporized in a deposition chamber in which the pressure is reduced and a second step in which a layer included in the layer containing a light-emitting organic compound is deposited in the deposition chamber are performed while exhaustion is performed and the partial pressure of water in the deposition chamber is measured with a mass spectrometer. At the start of the second step, the partial pressure of water is lower than the average partial pressure of water in the first step.

Note that in this specification and the like, vaporization includes not only a phenomenon in which liquid changes to gas (evaporation or boiling) but also a phenomenon in which a solid directly changes to gas (sublimation).

Further, in this specification and the like, the partial pressure is measured with a mass spectrometer.

By the first step, moisture is released from the deposition material to the inside of the deposition chamber, and the partial pressure of water in the deposition chamber is increased. After that, reduction in the amount of moisture in the deposition material gradually reduces the amount of moisture released from the deposition material and moisture is exhausted to the outside of the deposition chamber, whereby the partial pressure of water in the deposition chamber is decreased. Then, after the partial pressure of water in the deposition chamber becomes lower than the average partial pressure of water in the first step, as the second step, the deposition material is heated and the layer included in the EL layer is deposited.

In one embodiment of the present invention, the partial pressure of water in the deposition chamber can be checked with the mass spectrometer in real time. Thus, a film included in an organic EL element can be formed in a deposition chamber in which the partial pressure of water is sufficiently lowered.

In the above method for manufacturing an organic EL element, the average partial pressure of water in the second step is preferably lower than the average partial pressure of water in the first step.

In the above method for manufacturing an organic EL element, the heating temperature in the first step is preferably higher than or equal to the heating temperature in the second step.

The above method for manufacturing an organic EL element preferably includes a step of heating the deposition material at a temperature lower than temperatures at which the deposition material is vaporized in the deposition chamber in which the pressure is reduced before the first step.

In particular, it is preferable that in the deposition chamber in which the pressure is reduced, the deposition material be heated at a temperature at which the deposition material is not vaporized, and after the partial pressure of water in the deposition chamber becomes the maximum value, the first step be started.

Since the deposition material is heated at a temperature higher than or equal to temperatures at which the deposition material is vaporized in the first step, the deposition material is wasted owing to the vaporization. Further, by heating for a long time or at a high temperature, the deposition material deteriorates in some cases.

Therefore, in the method for manufacturing a light-emitting element according to one embodiment of the present invention, the deposition material is heated at a temperature at which the deposition material is not vaporized to remove moisture and then, the first step (heating the deposition material at a temperature higher than or equal to the temperatures at which the deposition material is vaporized) is performed, whereby moisture which cannot be removed in the previous heating is removed from the deposition material. Thus, the amount of the deposition material vaporized in the first step can be reduced, and consumption of the deposition material can be suppressed. Further, deterioration of the deposition material, which is caused by long-time high temperature heating, can be suppressed.

The above method for manufacturing an organic EL element preferably includes a period during which the deposition material is not heated or a period during which the deposition material is heated at a temperature lower than temperatures at which the deposition material is vaporized between the first step and the second step.

In particular, in the first step after the partial pressure of water in the deposition chamber becomes the maximum value, the method preferably includes a period during which the deposition material is not heated or a period during which the deposition material is heated at a temperature lower than temperatures at which the deposition material is vaporized.

By stopping heating or setting the heating temperature to temperatures at which the deposition material is not vaporized, vaporization of the deposition material is stopped. Even when the heating is stopped (or the heating temperature is lowered), the deposition material is in a high-temperature state; thus, impurities such as moisture in the deposition material are continuously removed. Further, impurities such as moisture removed from the deposition material continue to be exhausted to the outside of the deposition chamber. Thus, the amount of the deposition material vaporized in the first step can be reduced, and consumption of the deposition material can be suppressed. Further, deterioration of the deposition material, which is caused by long-time high temperature heating, can be suppressed.

In the above method for manufacturing an organic EL element, in the first step, by vaporization of the deposition material, a deposited film is preferably formed over a substrate. The deposited film formed over the substrate can be retrieved and reused as a deposition material. Consequently, the deposition material can be saved, which is preferable.

In the above method for manufacturing an organic EL element, the first step is preferably performed while a wall of the deposition chamber is heated. In addition, the wall of the deposition chamber is preferably heated before the first step.

The temperature of the wall of the deposition chamber is preferably high because impurities such as moisture are easily released from the wall and exhausted to the outside of the deposition chamber.

In the above method for manufacturing an organic EL element, the wall of the deposition chamber is preferably cooled before the second step. In addition, the second step is preferably performed while the wall of the deposition chamber is cooled.

When the temperature of the wall of the deposition chamber is set to low, impurities such as moisture are hardly released from the wall. This is preferable because impurities such as moisture attached to the wall can be prevented from being released from the wall and entering a film during deposition.

In the above method for manufacturing an organic EL element, the second step is preferably performed in the deposition chamber in which the partial pressure of water ($^{18}H_2O$) is lower than or equal to $1\times10^{-4}$ Pa.

Here, a layer containing a material having high reactivity such as lithium easily reacts with impurities such as moisture. Further, when a light-emitting layer contains impurities, properties of the light-emitting element tend to be remarkably affected. For those reasons, in manufacture of such a layer, it is preferable that the second step be performed in a deposition chamber in which the partial pressure of water is lower than or equal to $2\times10^{-5}$ Pa, more preferably lower than or equal to $1\times10^{-5}$ Pa.

Further, oxygen is also an impurity affecting reliability of an organic EL element. Therefore, at the start of the second step, the partial pressure of oxygen atoms ($^{16}O$) is preferably lower than the average partial pressure of oxygen atoms in the first step. The second step is performed in the deposition chamber in which the partial pressure of oxygen atoms is lower than or equal to $2\times10^{-6}$ Pa.

In the above method for manufacturing an organic EL element, the mass spectrometer is preferably a quadrupole mass spectrometer.

One embodiment of the present invention is a deposition apparatus including a deposition chamber which includes a deposition material holding portion provided with a heating mechanism and is connected to an exhaust mechanism and a mass spectrometer and a control portion which controls the heating mechanism in accordance with the partial pressure of water in the deposition chamber measured with the mass spectrometer.

One embodiment of the present invention is a deposition apparatus including a deposition chamber which includes a deposition material holding portion provided with a heating mechanism, a mechanism which heats a wall, and a mechanism which cools the wall, and is connected to an exhaust mechanism and a mass spectrometer.

In the deposition apparatus, the mass spectrometer is preferably a quadrupole mass spectrometer.

The deposition chamber included in the deposition apparatus according to one embodiment of the present invention includes a deposition material chamber and is connected to an exhaust mechanism. The deposition material chamber is separated from the deposition chamber by a sluice valve, includes a deposition material holding portion provided with a heating mechanism, and is connected to a mass spectrometer and an exhaust mechanism.

While the partial pressure of water ($^{18}H_2O$) in the deposition material chamber is measured with the quadrupole mass spectrometer in a state where the sluice valve is closed, the deposition material is heated with the heating mechanism. Impurities such as moisture are released from the heated deposition material and exhausted to the outside of the deposition material chamber through the exhaust mechanism. Then, after it is confirmed that the partial pressure of water in the deposition material chamber is sufficiently low, the sluice valve is opened. Since the amount of moisture in the deposition material chamber is sufficiently reduced, diffusion of impurities such as moisture into the deposition chamber after the sluice valve is opened can be suppressed.

In a state where the sluice valve is opened, a deposited film is formed using the deposition material over a substrate carried into the deposition chamber. Since impurities such as moisture in the deposition material are sufficiently reduced, the deposited film can have less moisture. Further, since the amount of moisture in the deposition material chamber is sufficiently reduced and then the sluice valve is opened, moisture derived from the deposition material is hardly contained in the deposition chamber. Consequently, the deposited film formed in the deposition chamber can have less moisture, which enables a highly reliable organic EL element to be manufactured.

One embodiment of the present invention is a deposition apparatus including a deposition chamber which is connected to a first exhaust mechanism and includes a deposition material chamber. The deposition material chamber is separated from the deposition chamber by a sluice valve and connected to a mass spectrometer and a second exhaust mechanism, and includes a deposition material holding portion provided with a heating mechanism.

In the above deposition apparatus, the deposition material chamber preferably includes a mechanism which heats an inner wall of the deposition material chamber. In the above deposition apparatus, the deposition material chamber preferably includes a mechanism which cools the inner wall of the deposition material chamber. In the above deposition apparatus, the deposition chamber preferably includes a mechanism which heats the inner wall of the deposition chamber. In the above deposition apparatus, the deposition chamber preferably includes a mechanism which cools the inner wall of the deposition chamber. In the above deposition apparatus, the deposition chamber is preferably connected to a mass spectrometer. In the above deposition apparatus, the mass spectrometer connected to the deposition material chamber is preferably a quadrupole mass spectrometer. In the above deposition apparatus, the mass spectrometer connected to the deposition chamber is preferably a quadrupole mass spectrometer.

One embodiment of the present invention is a method for manufacturing a light-emitting element by the above deposition apparatus, the light-emitting element including a layer containing a light-emitting organic compound between a pair of electrodes. In the method, a first step in which a deposition material held by the deposition material holding portion is heated with the heating mechanism in the deposition material chamber in which the pressure is reduced, which is separated from the deposition chamber in which the pressure is reduced by closing the sluice valve, and a second step in which the sluice valve is opened are performed while exhaustion is performed with the first exhaust mechanism and the second exhaust mechanism and a partial pressure of water in the deposition material chamber is measured with the mass spectrometer; then, a layer included in the layer containing a light-emitting organic compound is deposited using the deposition material over a substrate in the deposition chamber. At the start of the second step, the partial pressure of water in the deposition material chamber is lower than the average partial pressure of water in the first step.

One embodiment of the present invention is a method for manufacturing a light-emitting element by the above deposition apparatus, the light-emitting element including a layer containing a light-emitting organic compound between a pair of electrodes. In the method, a first step in which a deposition material held by the deposition material holding portion is heated with the heating mechanism in the deposition material chamber in which the pressure is reduced, which is separated from the deposition chamber in which the pressure is reduced by closing the sluice valve, and a second step in which the sluice valve is opened are performed while exhaustion is performed with the first exhaust mechanism and the second exhaust mechanism and a partial pressure of water in the deposition material chamber is measured with the mass spectrometer; then, a layer included in the layer containing a light-emitting organic compound is deposited using the deposition material over a substrate in the deposition chamber. At the start of the second step, the partial pressure of water in the deposition material chamber is lower than or equal to $1 \times 10^{-4}$ Pa.

In the above method for manufacturing a light-emitting element, the temperature of the heating mechanism in the first step is preferably higher than or equal to temperatures at which the deposition material is vaporized.

According to one embodiment of the present invention, while the partial pressure of water is measured with the mass spectrometer, moisture in the deposition material is exhausted to the outside of the deposition chamber; thus, it is confirmed that moisture is sufficiently removed from the deposition material and the deposition chamber, and then, the deposition is performed. Consequently, a layer to be deposited can have less moisture, which enables a highly reliable organic EL element to be provided.

In the deposition chamber included in the deposition apparatus according to one embodiment of the present invention, impurities such as moisture which are contained in the deposition material can be sufficiently removed in the deposition material chamber in advance; thus, diffusion of moisture derived from the deposition material into the deposition chamber can be suppressed. Consequently, the deposited film formed in the deposition chamber can have less moisture, which enables a highly reliable organic EL element to be manufactured.

BRIEF DESCRIPTION OF THE DRAWINGS

In the accompanying drawings:
FIG. 1 shows an example of a deposition method;
FIGS. 5A to 5E illustrate examples of electronic devices.

DETAILED DESCRIPTION OF THE INVENTION

Figure 2A:
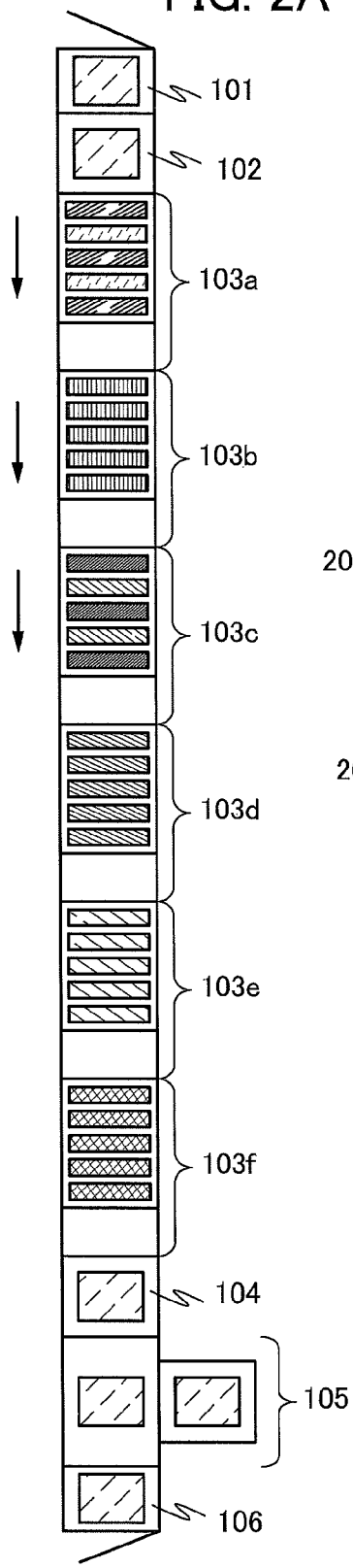
FIGS. 2A and 2B illustrate examples of deposition apparatuses.

Embodiments of the present invention will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.
(Embodiment 1)

In this embodiment, a deposition apparatus according to one embodiment of the present invention and a method for manufacturing a light-emitting element according to one embodiment of the present invention are described with reference to FIG. 1, FIGS. 2A and 2B, and FIGS. 3A to 3C.

In the method for manufacturing a light-emitting element according to one embodiment of the present invention, a first step of heating a deposition material to be vaporized in a deposition chamber in which the pressure is reduced and a second step of depositing a layer included in an EL layer in the deposition chamber are performed while exhaustion is performed and the partial pressure of water in the deposition chamber is measured with a mass spectrometer. In addition, at the start of the second step, the partial pressure of water is lower than the average partial pressure of water in the first step.

Even when a deposition material is heated for sufficient time in the first step, moisture is not sufficiently released from the deposition material depending on the heating temperature in some cases. In this case, when the deposition is performed in the second step by vaporizing the deposition material to deposit at a temperature higher than the heating temperature, moisture left in the deposition material is released from the deposition material. Therefore, in the method for manufacturing a light-emitting element according to one embodiment of the present invention, the deposition material is heated and partly vaporized in the first step. Thus, moisture in the deposition material is exhausted to the inside of the deposition chamber and then to the outside of the deposition chamber. Further, when the deposition material is vaporized in the second step, the amount of moisture released from the deposition material is small.

Then, after the partial pressure of water in the deposition chamber becomes lower than the average partial pressure of water in the first step, in the second step, the deposition material is heated to deposit the layer included in the EL layer. Thus, the deposited layer can have less moisture, which enables a highly reliable light-emitting element to be manufactured.

<<Deposition Apparatus>>

First, a deposition apparatus is described with which a light-emitting element can be manufactured by the method for manufacturing a light-emitting element according to one embodiment of the present invention.

For example, a light-emitting element can be manufactured with an in-line deposition apparatus or a multi-chamber deposition apparatus by the method for manufacturing a light-emitting element according to one embodiment of the present invention. The method for manufacturing a light-emitting element according to one embodiment of the present invention can be applied as long as at least one deposition chamber in such a deposition apparatus is connected to a mass spectrometer and an exhaust mechanism and includes a heating mechanism for heating a deposition material.

Figure 2B:
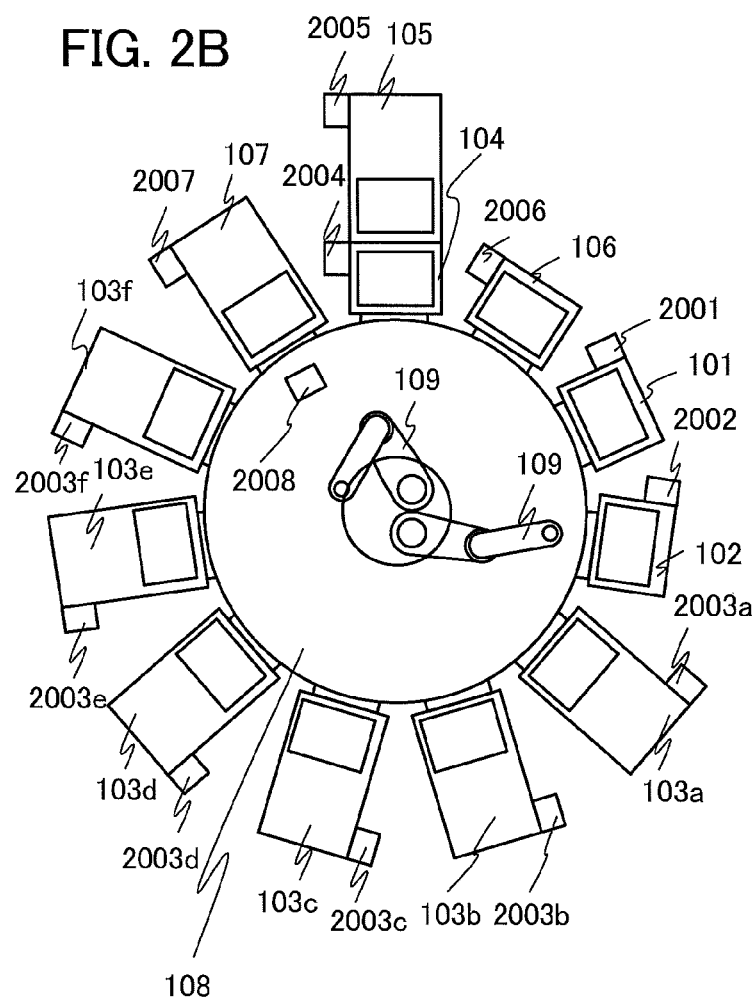

Deposition apparatuses according to one embodiment of the present invention are illustrated in FIGS. 2A and 2B.

FIG. 2A illustrates an in-line deposition apparatus. The deposition apparatus in FIG. 2A includes a load lock chamber 101, a pretreatment chamber 102, a plurality of deposition chambers (a deposition chamber 103a, a deposition chamber 103b, a deposition chamber 103c, a deposition chamber 103d, a deposition chamber 103e, and a deposition chamber 103f), a delivery chamber 104, a posttreatment chamber 105, and a load lock chamber 106.

Each chamber includes an exhaust mechanism that can control its inside pressure. Further, each chamber may include a gas introduction mechanism that can adjust the atmosphere of the inside.

The exhaust mechanisms are selected in accordance with usage of respective chambers. The exhaust mechanism may be one including a pump having an adsorption unit, such as a cryopump, a sputtering ion pump, or a titanium sublimation pump, one including a turbo molecular pump provided with a cold trap, or the like.

The load lock chamber 101 is connected to the exhaust mechanism. After a substrate is transferred to the load lock chamber 101 which is under atmospheric pressure, the pressure of the inside of the chamber is reduced with the exhaust mechanism.

In the pretreatment chamber 102, heat treatment or the like can be performed to remove impurities attached to the substrate.

In the plurality of deposition chambers, layers included in a light-emitting element can be deposited. In the deposition apparatus according to one embodiment of the present invention, at least one deposition chamber has a structure where the chamber is connected to a mass spectrometer and includes a heating mechanism for heating a deposition material. All of the deposition chambers may have the structure. Each of the deposition chambers includes a buffer portion and is connected to the adjacent deposition chamber with the buffer portion provided therebetween. By providing the buffer portion, a phenomenon in which a deposition material blown off from the adjacent deposition chamber is mixed into the film during deposition can be prevented.

The delivery chamber 104 is connected to the exhaust mechanism Through this chamber, the substrate placed in an environment under reduced pressure can be transferred to an environment under different pressure, e.g., atmospheric pressure.

The substrate provided with the light-emitting element is transferred to the posttreatment chamber 105. Further, a sealing substrate or the like can be transferred from the outside of the deposition apparatus. In the posttreatment chamber 105, the light-emitting element is sealed so as not to be exposed to the atmosphere. The posttreatment chamber 105 described in this embodiment includes two chambers, i.e., a substrate storage chamber and a sealing chamber. When the light-emitting element is sealed, the sealing chamber is in an inert atmosphere or a reduced-pressure atmosphere. The reduced-pressure atmosphere is, for example, an atmosphere in which the pressure is lower than or equal to 100 Pa, preferably lower than or equal to 1 Pa.

Then, the substrate with which sealing of the light-emitting element is completed can be transferred from the load lock chamber 106.

FIG. 2B illustrates a multi-chamber deposition apparatus. The deposition apparatus in FIG. 2B includes the load lock chamber 101, the pretreatment chamber 102, the plurality of deposition chambers (the deposition chamber 103a, the deposition chamber 103b, the deposition chamber 103c, the deposition chamber 103d, the deposition chamber 103e, and the deposition chamber 103f), the delivery chamber 104, the posttreatment chamber 105, the load lock chamber 106, a substrate standby chamber 107, a transfer chamber 108, and substrate transfer mechanisms 109.

The load lock chamber 101 is connected to an exhaust mechanism 2001. After a substrate is transferred to the load lock chamber 101 which is under atmospheric pressure, the pressure of the inside of the chamber is reduced with the exhaust mechanism 2001.

The pretreatment chamber 102 is connected to an exhaust mechanism 2002. In the pretreatment chamber 102, heat treatment or the like can be performed to remove impurities attached to the substrate.

In the plurality of deposition chambers, layers included in a light-emitting element can be deposited. The deposition chambers are connected to respective exhaust mechanisms (see exhaust mechanisms 2003a to 2003f in FIG. 2B). In the deposition apparatus according to one embodiment of the present invention, at least one deposition chamber has a structure where the chamber is connected to a mass spectrometer and includes a heating mechanism for heating a deposition material. All the deposition chambers may have the structure.

As the mass spectrometer, a deflection (magnetic) mass spectrometer or a non-deflection mass spectrometer can be used. Examples of the deflection mass spectrometer include a single-focusing mass spectrometer, a double-focusing mass spectrometer, and a cycloidal mass spectrometer, and examples of the non-deflection mass spectrometer include a time-of-flight mass spectrometer, an omegatron, and a quadrupole mass spectrometer.

As the mass spectrometer, a quadrupole mass spectrometer is preferably used. A quadrupole mass spectrometer includes a small analysis unit and thus is easily placed in a desired position. In addition, a quadrupole mass spectrometer can scan at high speed and has high sensitivity in a low-mass region.

The delivery chamber 104 is connected to the exhaust mechanism 2004. Through this chamber, the substrate placed in an environment under reduced pressure can be transferred to an environment under different pressure, e.g., atmospheric pressure.

The posttreatment chamber 105 is connected to an exhaust mechanism 2005. The substrate provided with the light-emitting element is transferred to the posttreatment chamber 105. Further, a sealing substrate or the like can be transferred from the outside of the deposition apparatus. In the posttreatment chamber 105, the light-emitting element is sealed so as not to be exposed to the atmosphere. The posttreatment chamber 105 is in an inert atmosphere or a reduced-pressure atmosphere.

The load lock chamber 106 is connected to an exhaust mechanism 2006. The substrate with which sealing of the light-emitting element is completed can be transferred from the load lock chamber 106.

The substrate standby chamber 107 is connected to an exhaust mechanism 2007. In the substrate standby chamber 107, the substrate in a manufacturing process of a light-emitting element can be in a standby state.

The transfer chamber 108 is connected to an exhaust mechanism 2008. The transfer chamber 108 serves as a delivery chamber for transferring a substrate from one chamber to another chamber.

In this embodiment, the load lock chamber 101 is a chamber in which a substrate holder which stores an untreated substrate is placed, and the load lock chamber 106 is a chamber in which a substrate holder which stores a treated substrate is placed. However, the deposition apparatus according to one embodiment of the present invention is not limited thereto, and carrying out and carrying in of the substrate may be performed with one load lock chamber.

Figure 3A:
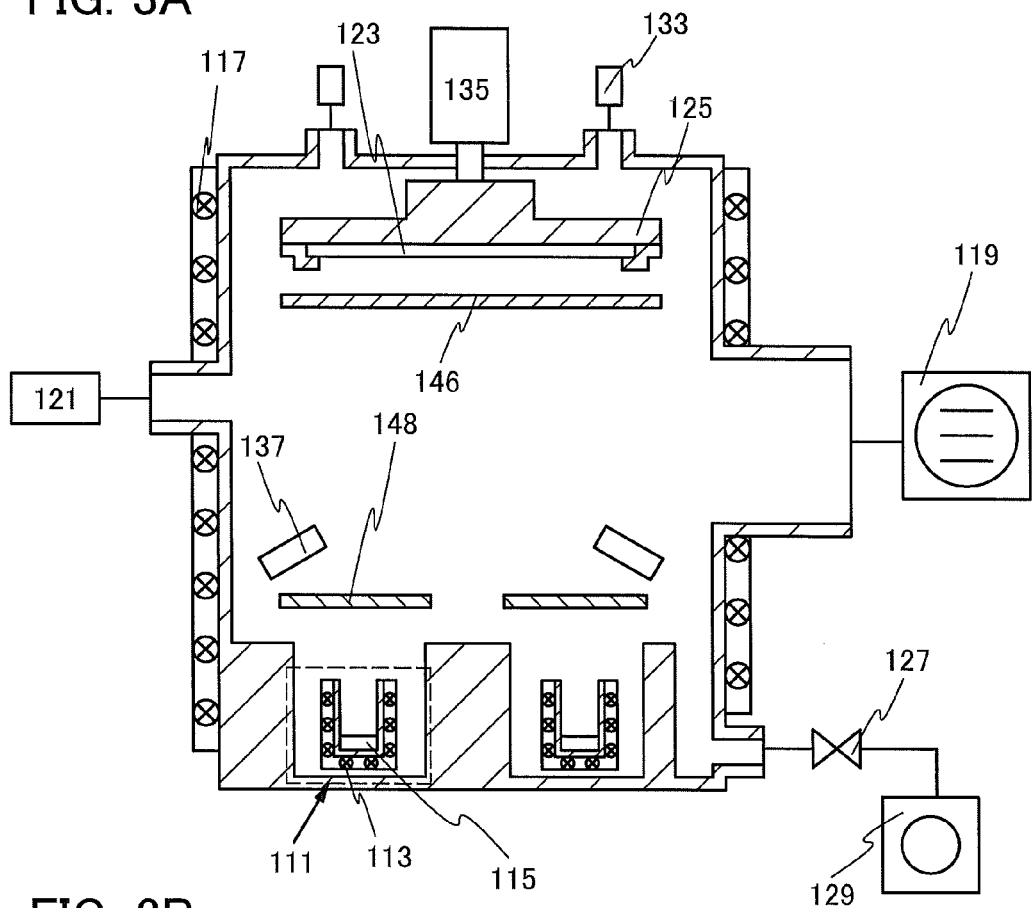
FIGS. 3A to 3C illustrate examples of deposition chambers.
Figure 3B:
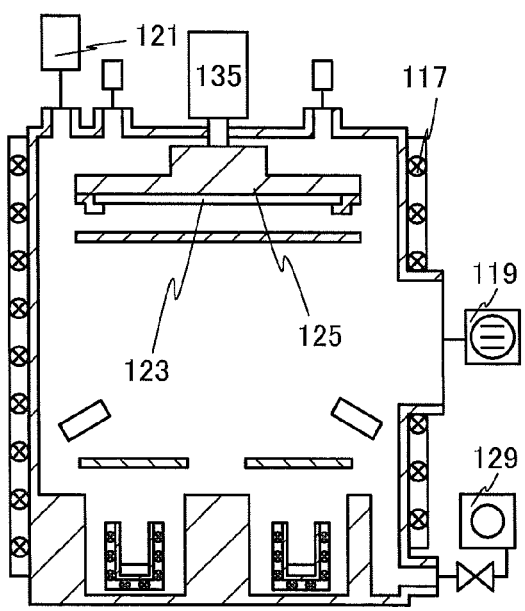
Figure 3C:
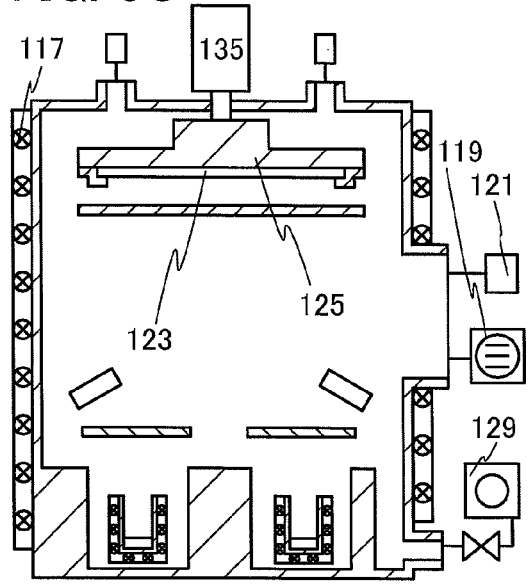

Next, examples of the structure of the deposition chamber are illustrated in FIGS. 3A to 3C. Each of the deposition chambers in FIGS. 3A to 3C includes a deposition material holding portion 111 provided with a heating mechanism 113 and is connected to an exhaust mechanism 119 and a quadrupole mass spectrometer 121.

FIG. 3A illustrates the case where the quadrupole mass spectrometer 121 is provided on a sidewall of the deposition chamber. FIG. 3B illustrates the case where the quadrupole mass spectrometer 121 is provided on the upper wall of the deposition chamber. The quadrupole mass spectrometer 121 is preferably provided in the vicinity of a substrate holding portion 125 or a substrate 123 as illustrated in FIGS. 3A and 3B, in which case, the amount of moisture in the vicinity of the substrate 123 can be measured more accurately. Further, the shortest distance between the quadrupole mass spectrometer 121 and the substrate holding portion 125 is preferably shorter than that between the quadrupole mass spectrometer 121 and the deposition material holding portion 111.

Alternatively, the quadrupole mass spectrometer 121 may be provided in the vicinity of the exhaust mechanism 119 as illustrated in FIG. 3C. Note that at least one quadrupole mass spectrometer 121 is connected to one deposition chamber, and a plurality of quadrupole mass spectrometers 121 may be connected to one deposition chamber.

In the deposition chambers in FIGS. 3A to 3C, while the partial pressure of water is measured with the quadrupole mass spectrometer 121, a deposition material can be heated with the heating mechanism 113 and vaporized. After it is confirmed that water in the deposition material can be sufficiently removed, a deposited film can be formed over the substrate; thus, the deposited film can have less moisture, which enables a highly reliable light-emitting element to be manufactured.

In addition, with the use of the quadrupole mass spectrometer 121, the partial pressure of oxygen atoms or the like may be measured.

As the exhaust mechanism connected to the deposition chamber, at least the exhaust mechanism 119 directly connected to the deposition chamber is provided. In addition, the exhaust mechanism 129 connected to the deposition chamber through a pipe 127 may be provided. The exhaust mechanism 129 may be connected to another deposition chamber or the like through a pipe. In this case, the exhaust mechanism 119 can evacuate the deposition chamber more highly than the exhaust mechanism 129.

FIGS. 3A to 3C each illustrate an example where the deposition material 115 put in a container is held by the deposition material holding portion 111. As a container for storing the deposition material, a crucible or a plate of a substance having small heat capacity (tungsten, molybdenum, or the like) can be used. With the use of the heating mechanism 113, the deposition material 115 is heated. The heated deposition material 115 is vaporized and deposited on the substrate 123.

Note that a plurality of deposition material holding portions 111 may be provided in one deposition chamber. When different deposition materials are set in the deposition material holding portions 111, a plurality of substances can be vaporized and deposited at the same time (can be co-deposited) in the deposition chamber.

Further, FIGS. 3A to 3C each illustrate an example where the substrate 123 and a mask are held by the substrate holding portion 125. The substrate 123 (and the mask) is rotated by a substrate rotating mechanism 135, so that uniformity of deposition can be increased. The substrate rotating mechanism 135 may also serve as a substrate transfer mechanism.

Further, the deposition chamber may include an imaging unit 133 such as a CCD camera. With the imaging unit 133, the positions of the substrate 123 and the mask can be checked.

Furthermore, in the deposition chamber, the thickness of a film deposited on a substrate surface can be estimated from results of measurements by a film thickness measurement mechanism 137. The film thickness measurement mechanism 137 includes a crystal oscillator, for example.

In order to control deposition of a vaporized deposition material, the deposition apparatus preferably includes a shutter by which a substrate and a container are separated from each other until the vaporization speed of the deposition material is stabilized. FIGS. 3A to 3C each illustrate an example where shutters 146 and 148 by which the substrate and the container are separated from each other are provided in the deposition apparatus.

The deposition chamber preferably includes a mechanism which heats the inner wall or a mechanism which cools the inner wall. In this embodiment, the deposition chamber includes a heating mechanism 117 and a cooling mechanism (not illustrated). The inner wall is preferably formed using a material having high thermal conductivity. Further, as the heating mechanism 117, it is possible to use a small tube heater formed using a heating wire or the like. As the cooling mechanism, a small tube to which a refrigerant is introduced or the like is used. Note that in order to perform the measurements accurately with the quadrupole mass spectrometer 121, it is preferable that a heating mechanism or a cooling mechanism be not provided in the vicinity of a connection with the quadrupole mass spectrometer 121.

When the temperature of the wall of the deposition chamber is increased, impurities such as moisture are easily released from the wall and exhausted to the outside of the deposition chamber. Accordingly, for example, in the first step in the method for manufacturing a light-emitting element according to one embodiment of the present invention, the inner wall of the deposition chamber is preferably heated with a mechanism which heats the inner wall of the deposition chamber.

In contrast, when the temperature of the wall of the deposition chamber is lowered, impurities such as moisture are hardly released from the wall and diffusion of impurities into the deposition chamber can be suppressed. Accordingly, for example, in the second step in the method for manufacturing an organic EL element according to one embodiment of the present invention, the inner wall of the deposition chamber is preferably cooled with a mechanism which cools the inner wall of the deposition chamber. Consequently, entry of impurities to a film during deposition can be suppressed.

Further, the deposition apparatus according to one embodiment of the present invention may include a control portion connected to the quadrupole mass spectrometer 121 and the heating mechanism 113 included in the deposition material holding portion 111. The control portion can control the temperature of the heating mechanism 113 included in the deposition material holding portion 111 in accordance with the partial pressure of water measured with the quadrupole mass spectrometer 121.

Specifically, a practitioner sets a condition of timing of proceeding from a certain step to the next step with the control portion in advance. For example, the condition is set so that the control portion is operated to change the temperature of the heating mechanism 113 to a temperature for the next step after the value of the partial pressure of water measured with the quadrupole mass spectrometer 121 becomes the maximum value for predetermined minutes or after the value thereof is less than a certain value (for example, $1 \times 10^{-4}$ Pa) is shown for predetermined minutes. Thus, even when a practitioner does not continuously observe the apparatus or the mass spectrometer, the control portion is automatically operated in a deposition chamber with the partial pressure of water suitable to each step, which is preferable. Further, in order to control the whole deposition apparatus, the control portion may be further connected to the substrate transfer mechanism or the like.

<<Method for Manufacturing Light-Emitting Element>>

As described above, a feature of the method for manufacturing a light-emitting element according to one embodiment of the present invention lies in a step of forming a layer included in an EL layer. One embodiment of the present invention may be applied only to formation of one layer included in an EL layer or formation of a plurality of layers included in an EL layer. One embodiment of the present invention is particularly preferably applied to formation of all layers included in an EL layer. Examples of the structures and materials of a light-emitting element which can be manufactured according to one embodiment of the present invention are described in Embodiment 3 in detail.

An example of the case where a first film included in the EL layer is deposited in the deposition chamber in FIG. 3A is described below with reference to FIG. 1.

<Step S1: Placement of Deposition Material>

First, in the deposition chamber exposed to the atmosphere, a deposition material is placed in the deposition material holding portion 111. Atmospheric components such as moisture and oxygen are attached to this deposition material. In other words, impurities with respect to an organic EL element are contained.

<Step S2: Reduction in Pressure in Deposition Chamber>

Next, the pressure in the deposition chamber is reduced with the exhaust mechanism 119. Consequently, atmospheric components such as moisture and oxygen in the deposition chamber are exhausted to the outside of the deposition chamber. Here, the pressure in the deposition chamber is preferably lower than or equal to $10^{-4}$ Pa.

Then, before Step S3, the partial pressure of water in the deposition chamber is started to be measured with the quadrupole mass spectrometer 121 (corresponding to the origin in FIG. 1).

<Step S3: Heating of Deposition Material (at Low Temperature)>

Next, the deposition material 115 is heated with the heating mechanism 113 included in the deposition material holding portion 111. The temperature of the heating mechanism 113 in Step S3 is set to a temperature at which the deposition material 115 is not vaporized. In FIG. 1, the highest temperature T2 in Step S3 is lower than temperatures T1 at which the deposition material 115 is vaporized. Thus, the deposition material 115 is not vaporized and impurities such as moisture and oxygen in the deposition material 115 are released to the inside of the deposition chamber. The impurities released to the inside of the deposition chamber are exhausted to the outside of the deposition chamber through the exhaust mechanism 119.

The moisture removed from the deposition material 115 is diffused into the deposition chamber; accordingly, the partial pressure of water in the deposition chamber is temporarily increased. After that, the partial pressure of water is decreased due to reduction in the amount of moisture exhausted from the deposition material 115 to the inside of the deposition chamber and the exhaust of moisture through the exhaust mechanism 119. The process preferably proceeds to Step S4 after the partial pressure of water measured with the quadrupole mass spectrometer 121 becomes the maximum value.

It is preferable that impurities which can be removed in Step S3 be removed in advance because, in that case, the amount of a deposition material vaporized at the time of removal of impurities can be reduced and the used amount of the deposition material can be reduced. Further, deterioration of the deposition material, which is caused by long-time high temperature heating, can be suppressed.

<Step S4: Heating of Deposition Material (at High Temperature)>

In Step S4, the deposition material 115 is heated at a higher temperature than that in Step S3. Specifically, the deposition material 115 is heated at a temperature higher than the temperatures T1 at which the deposition material 115 is vaporized. The temperature of the heating mechanism 113 is preferably higher than or equal to a temperature of the heating mechanism 113 (deposition temperature) in Step S6. As the temperature of the deposition material 115 is higher, impurities such as moisture and oxygen in the deposition material 115 are more easily released. Thus, impurities which cannot be removed in Step S3 can be removed from the deposition material 115. The impurities exhausted to the inside of the deposition chamber are exhausted to the outside of the deposition chamber through the exhaust mechanism 119.

Further, before Step S4, a substrate is preferably transferred to the deposition chamber. After the substrate is transferred to the deposition chamber by a substrate transfer mechanism, Step S4 is conducted, whereby a vaporized deposition material is deposited on the substrate. A deposited film on the substrate can be reused as a deposition material. Consequently, a loss of a deposition material due to the removal of impurities contained in the deposition material can be reduced, which is preferable.

The moisture removed from the deposition material 115 is diffused into the deposition chamber; accordingly, the partial pressure of water in the deposition chamber is temporarily increased. After that, the partial pressure of water is decreased due to reduction in the amount of moisture exhausted from the deposition material 115 to the inside of the deposition chamber and the exhaust of moisture through the exhaust mechanism 119. The process preferably proceeds to the next step after the partial pressure of water measured with the quadrupole mass spectrometer 121 becomes the maximum value.

<Step S5: Stop of Heating of Deposition Material (at High Temperature)>

After that, the temperature of the heating mechanism 113 is set to a temperature at which the deposition material 115 is not vaporized or sublimed, or the heating is stopped. Thus, vaporization of the deposition material 115 is stopped.

After Step S4, Step S6 may be performed without performing Step S5; however, even when the heating is stopped (or the temperature of the heating mechanism 113 is lowered), the deposition material 115 is in a high-temperature state and thus moisture in the deposition material 115 is continuously removed. Further, moisture removed from the deposition material 115 continues to be exhausted to the outside of the deposition chamber. Thus, the amount of a deposition material vaporized at the time of removal of impurities can be reduced, and the used amount of the deposition material can be reduced. Further, deterioration of the deposition material, which is caused by long-time high temperature heating, can be suppressed.

Note that in a period from Step S2 to Step S5, impurities exhausted to the inside of the deposition chamber are adsorbed to the inner wall of the deposition chamber in some cases. Accordingly, it is preferable that the wall of the deposition chamber be heated with a mechanism which heats the wall of the deposition chamber because, in that case, release of impurities attached to the wall of the deposition chamber and exhaust of the impurities to the outside of the deposition chamber can be promoted. Heating of the wall of the deposition chamber may be performed at any time as long as it is performed between Step S2 and Step S6.

<Step S6: Formation of First Film>

The substrate 123 is carried in. A first film is formed over the substrate 123 in a deposition chamber in which the partial pressure of water is lower than the average partial pressure of water measured with the quadrupole mass spectrometer 121 in Step S4.

A lower electrode of the light-emitting element is formed over the substrate 123 in advance. Further, another layer included in the EL layer may be formed.

The average partial pressure of water in Step S6 is preferably lower than the average partial pressure of water in Step S4.

Further, Step S6 is preferably performed in a deposition chamber in which the partial pressure of water is lower than or equal to $1 \times 10^{-4}$ Pa.

Here, a layer containing a material having high reactivity such as lithium easily reacts with water. Further, when a light-emitting layer contains impurities, properties of the light-emitting element tend to be remarkably affected. For those reasons, in the case where the first film is a layer containing a material having high reactivity or a light-emitting layer, it is preferable that the deposition be performed in a deposition chamber in which the partial pressure of water is lower than or equal to $2 \times 10^{-5}$ Pa, more preferably lower than or equal to $1 \times 10^{-5}$ Pa.

Further, reliability of a light-emitting element is decreased because of not only water but also oxygen. Therefore, it is preferable that the first film be formed over the substrate 123 in a deposition chamber in which the partial pressure of oxygen atoms is lower than the average partial pressure of oxygen atoms measured with the quadrupole mass spectrometer 121 in Step S4. The average partial pressure of oxygen atoms in Step S6 is preferably lower than the average partial pressure of oxygen atoms in Step S4. In particular, Step S6 is preferably conducted in a deposition chamber in which the partial pressure of oxygen atoms is lower than or equal to $2 \times 10^{-6}$ Pa.

Note that when impurities attached to the inner wall of the deposition chamber are released in Step S6, the impurities are diffused into the deposition chamber and further mixed into the first film, so that a light-emitting element having a short lifetime is manufactured in some cases. Accordingly, it is preferable that Step S6 be performed while the inner wall of the deposition chamber is cooled with a mechanism which cools the wall of the deposition chamber. Further, it is preferable that the inner wall of the deposition chamber be cooled before Step S6.

In the above-described manufacturing method, the layer included in the EL layer is formed after moisture is sufficiently removed from the deposition material and the deposition chamber. Thus, the layer included in the EL layer can have less moisture, which enables a highly reliable light-emitting element to be manufactured.

This embodiment can be freely combined with any of the other embodiments.

(Embodiment 2)

In this embodiment, a deposition apparatus according to one embodiment of the present invention and a method for manufacturing a light-emitting element according to one embodiment of the present invention which are different from those in Embodiment 1 are described with reference to FIGS. 2A and 2B, FIG. 28, and FIGS. 29A to 29E.

<<Deposition Apparatus>>

First, a deposition apparatus according to one embodiment of the present invention is described.

The deposition apparatus according to one embodiment of the present invention includes a deposition chamber which is connected to an exhaust mechanism and includes a deposition material chamber. The deposition material chamber is separated from the deposition chamber by a sluice valve and connected to a mass spectrometer and an exhaust mechanism, and includes a deposition material holding portion provided with a heating mechanism.

In the deposition chamber, impurities such as moisture in a deposition material can be sufficiently removed in the deposition material chamber in advance; thus, diffusion of moisture derived from the deposition material into the deposition chamber can be suppressed and a deposited film formed in the deposition chamber can have less moisture, which enables a highly reliable light-emitting element to be manufactured. With the use of the deposition chamber, only one layer included in an EL layer may be formed or a plurality of layers included in the EL layer may be formed. In particular, with the use of the deposition chamber, all the layers included in the EL layer are preferably formed.

The deposition apparatus according to one embodiment of the present invention includes at least one deposition chamber and may include a plurality of deposition chambers. Further, a deposition chamber having a structure different from the above structure may be further included.

Embodiment 1 can be referred to for details of the deposition apparatuses in FIGS. 2A and 2B according to one embodiment of the present invention.

Figure 28:
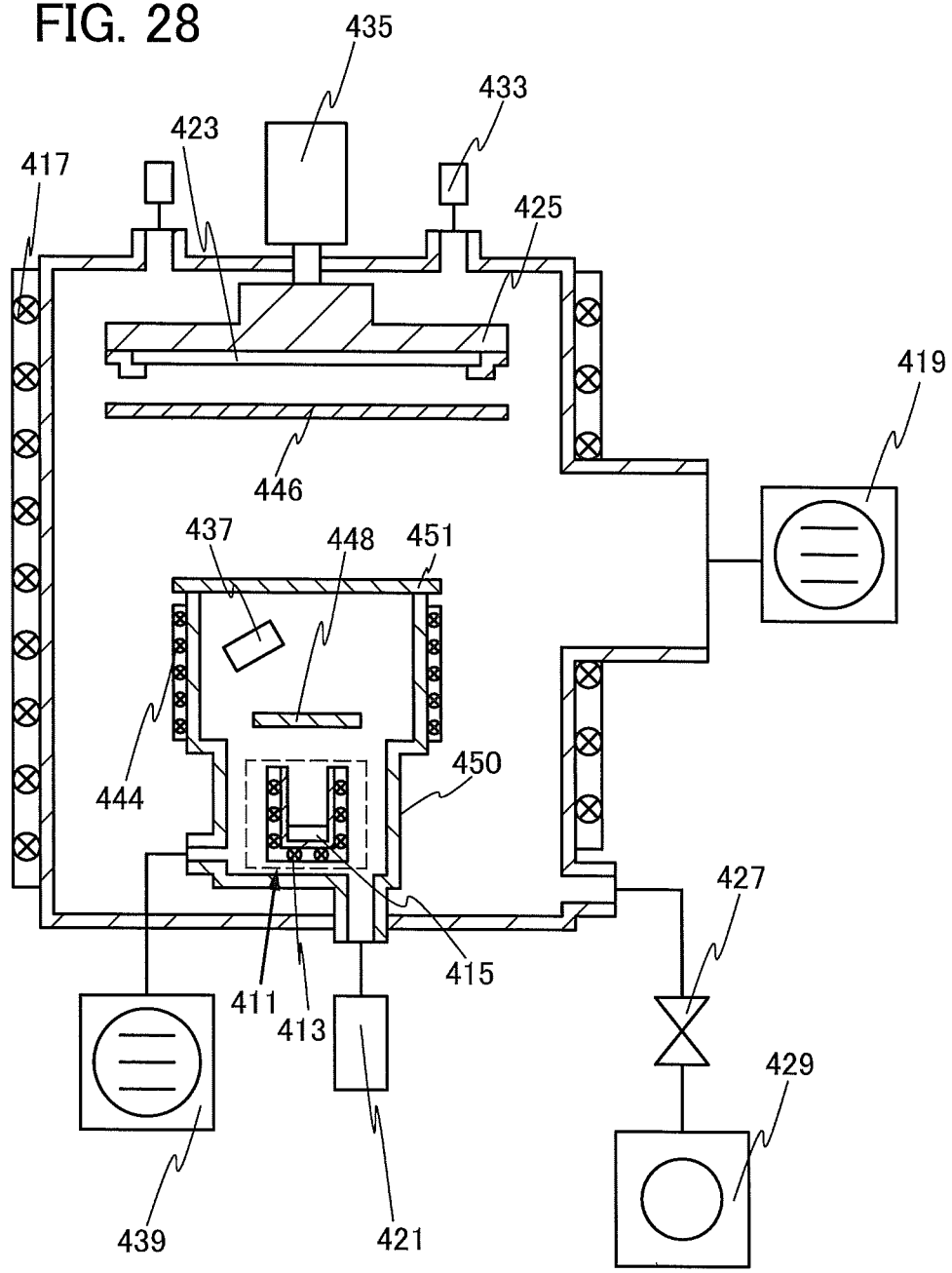
FIG. 28 illustrates an example of a deposition chamber.

Next, FIG. 28 exemplifies the structure of the deposition chamber which is connected to the exhaust mechanism and includes the deposition material chamber. Note that the deposition material chamber is separated from the deposition chamber by the sluice valve and connected to the mass spectrometer and the exhaust mechanism, and includes the deposition material holding portion provided with the heating mechanism.

The deposition chamber in FIG. 28 is connected to an exhaust mechanism 419 and includes a deposition material chamber 450.

As the exhaust mechanism connected to the deposition chamber, at least the exhaust mechanism 419 directly connected to the deposition chamber is provided. In addition, an exhaust mechanism 429 connected to the deposition chamber through a pipe 427 may be provided. The exhaust mechanism 429 may be connected to another deposition chamber, the deposition material chamber 450, or the like through a pipe. In this case, the exhaust mechanism 419 can evacuate the deposition chamber more highly than the exhaust mechanism 429.

Further, FIG. 28 illustrates an example where a substrate 423 and a mask are held by a substrate holding portion 425. The substrate 423 (and the mask) is rotated by a substrate rotating mechanism 435, so that uniformity of deposition can be increased. The substrate rotating mechanism 435 may also serve as a substrate transfer mechanism.

Further, the deposition chamber may include an imaging unit 433 such as a CCD camera. With the imaging unit 433, the positions of the substrate 423 and the mask can be checked.

The deposition material chamber 450 is separated from the deposition chamber by a sluice valve 451 (a door valve, a gate valve, or the like) and connected to a quadrupole mass spectrometer 421 and an exhaust mechanism 439, and includes a deposition material holding portion 411 provided with a heating mechanism 413.

As the exhaust mechanism connected to the deposition material chamber 450, at least the exhaust mechanism 439 directly connected to the deposition material chamber is provided.

FIG. 28 illustrates the case where the sluice valve 451 is closed. By opening the sluice valve 451, the upper wall of the deposition material chamber 450 does not hinder formation of the deposited film over the substrate. In the case where a sidewall of the deposition material chamber 450 also hinders the formation, the sidewall of the deposition material chamber 450 may have a structure in which the position thereof can be moved so as not to hinder the formation. Further, by closing the sluice valve 451, the atmosphere of the deposition material chamber 450 and the atmosphere of the deposition chamber can be different. Since the sluice valve 451 has high airtightness, in the case where the sluice valve 451 is closed, the deposition material chamber 450 can be regarded as an isolated chamber (a sealed space).

FIG. 28 illustrates an example where the deposition material 415 put in a container is held by the deposition material holding portion 411. As a container for storing the deposition material, a crucible or a plate of a substance having small heat capacity (tungsten, molybdenum, or the like) can be used. With the use of the heating mechanism 413, the deposition material 415 is heated.

Note that a plurality of deposition material holding portions may be provided in one deposition chamber. One deposition material chamber may include one deposition material holding portion or a plurality of deposition material holding portions. When different deposition materials are set in the deposition material holding portions, a plurality of substances can be vaporized and deposited at the same time (can be co-deposited) in the deposition chamber.

Further, the thickness of a film deposited on a substrate surface can be estimated from results of measurements by a film thickness measurement mechanism 437. The film thickness measurement mechanism 437 may include a crystal oscillator, for example. The film thickness measurement mechanism 437 may be provided outside the deposition material chamber 450 (inside the deposition chamber).

Note that in order to control deposition of a vaporized deposition material, a shutter 446 or 448 by which the substrate and the container are separated from each other may be provided.

The deposition material chamber 450 preferably includes a mechanism which heats an inner wall or a mechanism which cools the inner wall. In this embodiment, the deposition material chamber 450, includes a heating mechanism 444 and a cooling mechanism (not illustrated). The inner wall is preferably formed using a material having high thermal conductivity. It is possible to use a small tube heater formed using a heating wire or the like as the heating mechanism 444. As the cooling mechanism, a small tube to which a refrigerant is introduced or the like is used.

When the temperature of the wall of the deposition material chamber 450 is increased, impurities such as moisture are easily released from the wall and exhausted to the outside of the deposition material chamber. Accordingly, the inner wall is preferably heated, for example, when impurities are exhausted to the outside of the deposition material chamber 450 with the use of the exhaust mechanism 439 by closing the sluice valve 451 and heating the deposition material 415.

In contrast, when the temperature of the wall of the deposition material chamber 450 is lowered, impurities such as moisture are hardly released from the wall and diffusion of impurities into the deposition material chamber 450 and the deposition chamber can be suppressed. Therefore, for example, the inner wall is preferably cooled when the sluice valve 451 is opened and the deposited film is formed on the substrate. Thus, entry of impurities to a film during deposition can be suppressed.

Also the deposition chamber preferably includes a mechanism which heats an inner wall or a mechanism which cools the inner wall. In this embodiment, the deposition chamber includes a heating mechanism 417 and a cooling mechanism (not illustrated).

Further, the deposition chamber may be connected to a mass spectrometer.

In the deposition chamber in FIG. 28, while the partial pressure of water in the deposition material chamber 450 is measured with the quadrupole mass spectrometer 421 in a state where the sluice valve 451 is closed, the deposition material 415 is heated with the heating mechanism 413. Impurities such as moisture are released from the heated deposition material 415 and exhausted to the outside of the deposition material chamber 450 through the exhaust mechanism 439. Then, after it is confirmed that the partial pressure of water in the deposition material chamber 450 is sufficiently low, the sluice valve 451 is opened. Since the amount of moisture in the deposition material chamber 450 is sufficiently reduced, diffusion of impurities such as moisture into the deposition chamber after the sluice valve 451 is opened can be suppressed.

In a state where the sluice valve 451 is opened, a deposited film is formed using the deposition material 415 over the substrate 423 carried into the deposition chamber. Since impurities such as moisture in the deposition material 415 are sufficiently reduced in the deposition material chamber 450, the deposited film can have less moisture. Further, since the amount of moisture in the deposition material chamber 450 is sufficiently reduced and then the sluice valve 451 is opened, moisture derived from the deposition material is hardly contained in the deposition chamber. Consequently, the deposited film formed in the deposition chamber can have less moisture, which enables a highly reliable organic EL element to be manufactured.

In addition, with the quadrupole mass spectrometer 421, the partial pressure of oxygen atoms ($^{16}O$) or the like in the deposition material chamber 450 may be measured.

Further, the deposition apparatus according to one embodiment of the present invention may include a control portion connected to the quadrupole mass spectrometer 421 and the heating mechanism 413 included in the deposition material holding portion 411. The control portion can control the temperature of the heating mechanism 413 included in the deposition material holding portion 411 in accordance with the partial pressure of water measured with the quadrupole mass spectrometer 421.

Specifically, a practitioner sets a condition of timing of proceeding from a certain step to the next step with the control portion in advance. For example, the condition is set so that the control portion is operated to change the temperature of the heating mechanism 413 to a temperature for the next step after the value of the partial pressure of water measured with the quadrupole mass spectrometer 421 becomes the maximum value for predetermined minutes or after the value thereof is less than a certain value (for example, $1\times10^{-4}$ Pa) is shown for predetermined minutes. Thus, even when a practitioner does not continuously observe the apparatus or the mass spectrometer, the control portion is automatically operated in a deposition material chamber with the partial pressure of water suitable to each step, which is preferable. Further, in order to control the whole deposition apparatus, the control portion may be further connected to the sluice valve 451, a substrate transfer mechanism, or the like.

<<Method for Manufacturing Light-Emitting Element>>

An example of the case where a first film included in an EL layer is deposited in the deposition chamber in FIG. 28 is described below. Examples of the structure and material of a light-emitting element manufactured according to one embodiment of the present invention are described in Embodiment 3 in detail.

<Step S1: Placement of Deposition Material>

First, in the deposition material chamber 450 exposed to the atmosphere, the deposition material 415 is placed in the deposition material holding portion 411. Atmospheric components such as moisture and oxygen are attached to this deposition material 415. In other words, impurities with respect to an organic EL element are contained.

Note that in the case where the deposition chamber and the deposition material chamber 450 are under reduced pressure, the deposition material chamber 450 is preferably exposed to the atmosphere after the sluice valve 451 is closed. By closing the sluice valve 451 and exposing only the deposition material chamber 450 to the atmosphere, contamination in a wide space due to exposure of the whole deposition chamber to the atmosphere can be prevented. Compared to the case where the whole deposition chamber is exposed to the atmosphere and then evacuated to reduce the pressure thereof, the case where only the deposition material chamber 450 is exposed to the atmosphere and evacuated to reduce the pressure thereof is preferable because the required time is short.

<Step S2: Reduction in Pressure in Deposition Material Chamber>

Next, the pressure in the deposition material chamber 450 is reduced with the exhaust mechanism 439. Consequently, atmospheric components such as moisture and oxygen in the deposition material chamber 450 are exhausted to the outside of the deposition material chamber 450. Here, the pressure in the deposition material chamber 450 is preferably lower than or equal to $10^{-4}$ Pa.

Then, before Step S3, the partial pressure of water in the deposition material chamber 450 is started to be measured with the quadrupole mass spectrometer 421.

<Step S3: Heating of Deposition Material>

Next, the deposition material 415 is heated with the heating mechanism 413 included in the deposition material holding portion 411. Thus, impurities such as moisture and oxygen in the deposition material 415 are released to the inside of the deposition material chamber 450. The impurities released to the inside of the deposition material chamber 450 are exhausted to the outside of the deposition material chamber 450 through the exhaust mechanism 439.

The moisture removed from the deposition material 415 is diffused into the deposition material chamber 450; accordingly, the partial pressure of water in the deposition material chamber 450 is temporarily increased. After that, the partial pressure of water is decreased due to reduction in the amount of moisture exhausted from the deposition material 415 to the inside of the deposition material chamber 450 and exhaust of moisture through the exhaust mechanism 439.

At this time, the temperature of the heating mechanism 413 is preferably higher than or equal to temperatures at which the deposition material 415 is vaporized, more preferably higher than or equal to the temperature of the heating mechanism 413 (deposition temperature) in Step S4. As the temperature of the deposition material 415 is higher, impurities such as moisture and oxygen in the deposition material 415 are easily released. Therefore, in Step S3, heating is performed at a temperature higher than or equal to the temperature of the heating mechanism 413 in Step S4, so that release of impurities from the deposition material during deposition can be suppressed.

In particular, it is preferable that impurities which can be removed at a temperature lower than or equal to the temperatures at which the deposition material 415 is vaporized be removed, and then the temperature be increased to higher than or equal to the temperature at which the deposition material 415 is vaporized. The amount of a deposition material vaporized at the time of the removal of impurities can be reduced, and the used amount of the deposition material can be reduced. Further, the deterioration of the deposition material, which is caused by long-time high temperature heating, can be suppressed.

Further, the deposition material vaporized in Step S3 is attached to the inner wall of the deposition material chamber 450 or the sluice valve 451 in some cases. When the inner wall or the sluice valve has a layered structure and a layer to which the deposition material is attached can be detached at the time of exposure to the atmosphere, a film attached to the layer can be reused as a deposition material. Consequently, a loss of a deposition material due to the removal of impurities contained in the deposition material can be reduced, which is preferable Before Step S4, vaporization of the deposition material 415 is preferably stopped by setting the temperature of the heating mechanism 413 to a temperature at which the deposition material 415 is not vaporized or sublimed or by stopping heating.

Even when the heating is stopped (or the temperature of the heating mechanism 413 is lowered), the deposition material 415 is in a high-temperature state and thus moisture in the deposition material 415 is continuously removed. Further, moisture removed from the deposition material 415 continues to be exhausted to the outside of the deposition material chamber 450. Thus, the amount of a deposition material vaporized at the time of removal of impurities can be reduced, and the used amount of the deposition material can be reduced. Further, deterioration of the deposition material, which is caused by long-time high temperature heating, can be suppressed.

Note that in a period from Step S2 to Step S3, impurities exhausted to the inside of the deposition material chamber 450 are adsorbed to the inner wall of the deposition material chamber 450 in some cases. Accordingly, it is preferable that the wall of the deposition material chamber 450 be heated with a mechanism which heats the wall of the deposition material chamber 450 because, in that case, release of impurities attached to the wall of the deposition material chamber 450 and exhaust of the impurities to the outside of the deposition material chamber 450 can be promoted. Heating of the wall of the deposition material chamber 450 may be performed at any time as long as it is performed between Step S2 and Step S3.

Before Step S4, the inside of the deposition chamber is set to reduced pressure. Here, the pressure in the deposition chamber is preferably lower than or equal to $10^{-4}$ Pa.

The substrate 423 is carried in. A lower electrode of the light-emitting element is formed over the substrate 423 in advance. Further, another layer included in the EL layer may be formed.

<Step S4: Opening of Sluice Valve>

It is confirmed that the partial pressure of water measured with the quadrupole mass spectrometer 421 is sufficiently low, and then, the sluice valve 451 is opened.

For example, it is preferable that the sluice valve 451 be opened after the partial pressure of water becomes lower than the average partial pressure of water in Step S3. Alternatively, it is preferable that the sluice valve 451 be opened after the partial pressure of water becomes lower than or equal to $1\times10^{-4}$ Pa.

Here, a layer containing a material having high reactivity such as lithium easily reacts with water. Further, when a light-emitting layer contains impurities, properties of the light-emitting element tend to be remarkably affected. For those reasons, in the case where the first film is a layer containing a material having high reactivity or a light-emitting layer, it is preferable that the sluice valve 451 be opened after the partial pressure of water becomes lower than or equal to $2\times10^{-5}$ Pa, more preferably lower than or equal to $1\times10^{-5}$ Pa.

Further, reliability of a light-emitting element is decreased because of not only water but also oxygen. Therefore, the sluice valve 451 is preferably opened when the partial pressure of oxygen atoms is lower than the average partial pressure of oxygen atoms measured with the quadrupole mass spectrometer 421 in Step S3.

Note that when impurities attached to the inner wall of the deposition material chamber 450 are released after Step S4, the impurities may be diffused into the deposition chamber and further mixed into the first film, which may result in manufacture of a light-emitting element having a short lifetime. Accordingly, it is preferable that steps after Step S4 be performed while the inner wall of the deposition material chamber 450 is cooled with a mechanism which cools the wall of the deposition material chamber 450. Further, before Step S4, the inner wall of the deposition material chamber 450 is preferably cooled.

In the above-described manufacturing method, the sluice valve 451 is opened after moisture is sufficiently removed from the deposition material and the deposition material chamber 450. Thus, diffusion of moisture derived from the deposition material into the deposition chamber can be suppressed and a deposited film formed in the deposition chamber can have less moisture, which enables a highly reliable light-emitting element to be manufactured.

FIGS. 29A to 29E each illustrate a structure of a deposition chamber, which is different from that in FIG. 28, and a method for manufacturing a light-emitting element with the deposition chamber.

Figure 29A:
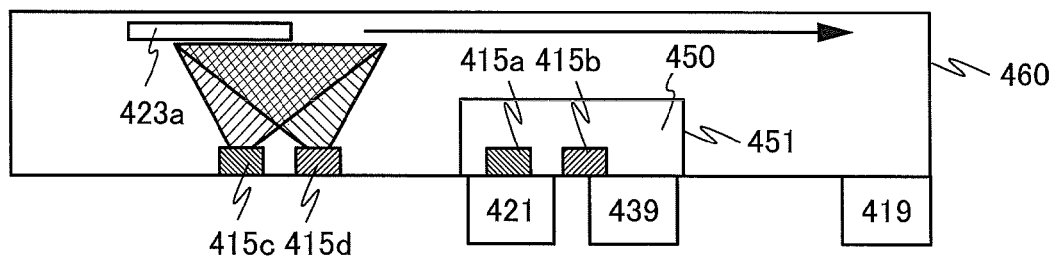
FIGS. 29A to 29E illustrate an example of a deposition method.

The deposition material chamber 450 in FIG. 29A includes a deposition material 415a and a deposition material 415b each held by a deposition material holding portion. Further, a deposition chamber 460 includes, outside the deposition material chamber 450, a deposition material 415c and a deposition material 415d each held by a deposition material holding portion. Note that the deposition materials 415a to 415d may be the same material or different materials.

By closing the sluice valve 451, while keeping the pressure of the outside of the deposition material chamber 450 under reduced pressure, only the inside of the deposition material chamber 450 can be exposed to the atmosphere.

The deposition material chamber 450 is connected to the exhaust mechanism 439 and the quadrupole mass spectrometer 421.

Figure 29B:
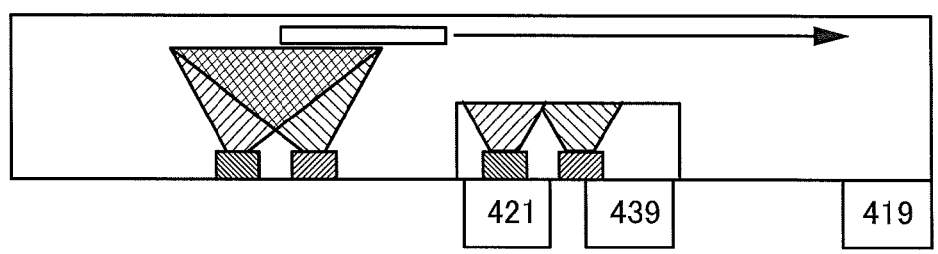

Thus, as illustrated in FIG. 29B, while a deposited film is formed using the deposition material 415c and the deposition material 415d over the substrate 423a, impurities such as moisture in the deposition material 415a and the deposition material 415b can be removed by heating the deposition material 415a and the deposition material 415b.

Figure 29C:
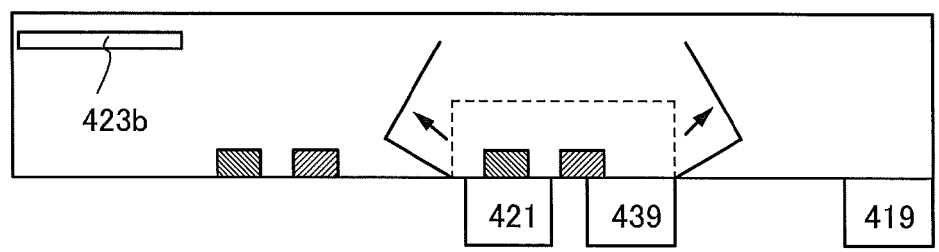

When the remaining amount of the deposition material 415c and the remaining amount of the deposition material 415d become small, heating is stopped. Note that movement of a substrate 423b over which a deposited film is formed next is also stopped. Then, the sluice valve 451 is opened (FIG. 29C). In this case, not only the sluice valve 451 but also the sidewall of the deposition material chamber 450 is movable.

Figure 29D:
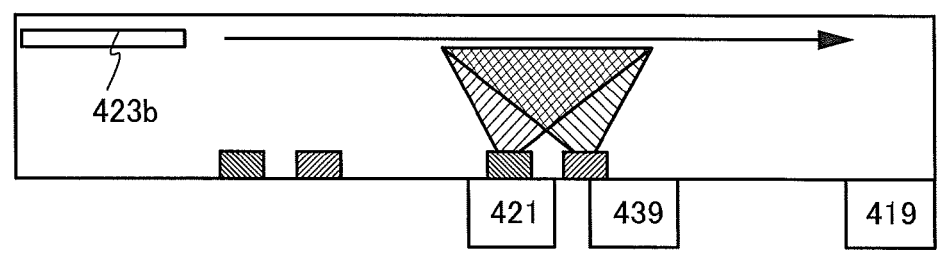

Then, a deposited film is formed over the substrate 423b with the use of the deposition material 415a and the deposition material 415b from which impurities are sufficiently removed in the deposition material chamber 450 (FIG. 29D).

Figure 29E:
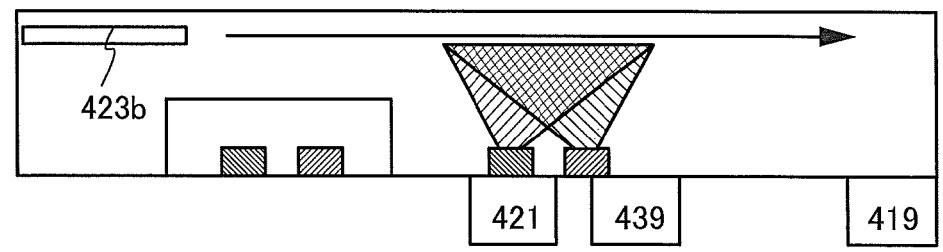

Note that in the case where the deposition material 415c and the deposition material 415d are provided in another deposition material chamber, after a sluice valve is closed, the inside of the deposition material chamber can be exposed to the atmosphere and replacement of materials or the like can be performed (FIG. 29E).

As described above, a deposition apparatus to which one embodiment of the present invention is applied is preferable because a deposited film can be formed in parallel with removal of impurities such as moisture in a deposition material and thus, a light-emitting element can be efficiently manufactured.

Further, even when a small amount of a deposition material is placed in one deposition material holding portion, the process efficiency of an apparatus is not decreased, so that deterioration of the deposition material due to long-time heating or the like can be suppressed, which is preferable.

This embodiment can be freely combined with any of the other embodiments.

(Embodiment 3)

In this embodiment, examples of a light-emitting element manufactured according to one embodiment of the present invention are described with reference to FIGS. 4A to 4F.

Each of the light-emitting elements shown in this embodiment includes a pair of electrodes (a first electrode and a second electrode) and an EL layer(s) provided between the pair of electrodes. One of the pair of electrodes serves as an anode and the other serves as a cathode. The EL layer(s) includes at least a light-emitting layer. Among the EL layer(s), a layer formed using a material that can be deposited can be formed by application of one embodiment of the present invention. As the material that can be deposited, for example, a low-molecular compound and an inorganic compound can be given.

In a light-emitting element manufactured by application of one embodiment of the present invention, the amount of contained impurities such as moisture is reduced. Therefore, a highly reliable light-emitting element can be obtained.

One embodiment of the present invention can be applied to the case where a light-emitting element with any of a top emission structure, a bottom emission structure, and a dual emission structure is manufactured.

Figure 4A:
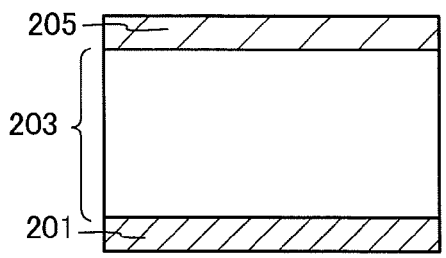
FIGS. 4A to 4F illustrate examples of light-emitting elements.

A light-emitting element illustrated in FIG. 4A includes an EL layer 203 between a first electrode 201 and a second electrode 205. In this embodiment, the first electrode 201 serves as the anode, and the second electrode 205 serves as the cathode.

When a voltage higher than the threshold voltage of the light-emitting element is applied between the first electrode 201 and the second electrode 205, holes are injected to the EL layer 203 from the first electrode 201 side and electrons are injected to the EL layer 203 from the second electrode 205 side. The injected electrons and holes are recombined in the EL layer 203 and a light-emitting substance contained in the EL layer 203 emits light.

The EL layer 203 includes at least a light-emitting layer, as described above. In addition to the light-emitting layer, the EL layer 203 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 203, either a low molecular compound or a high molecular compound can be used, and an inorganic compound may also be used.

Figure 4B:
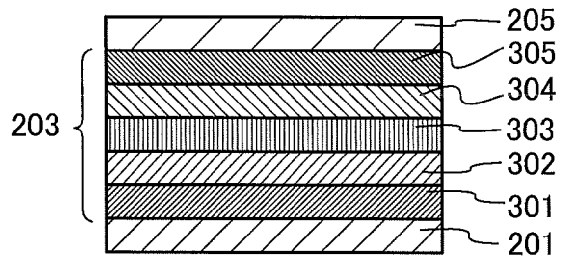

A specific example of a structure of the EL layer 203 is illustrated in FIG. 4B. In the EL layer 203 illustrated in FIG. 4B, a hole-injection layer 301, a hole-transport layer 302, a light-emitting layer 303, an electron-transport layer 304, and an electron-injection layer 305 are stacked in this order from the first electrode 201 side.

Figure 4C:
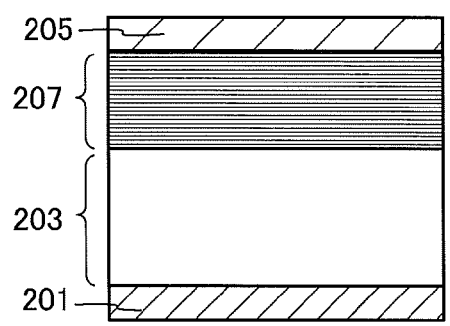

A light-emitting element illustrated in FIG. 4C includes the EL layer 203 between the first electrode 201 and the second electrode 205, and further includes an intermediate layer 207 between the EL layer 203 and the second electrode 205.

Figure 4D:
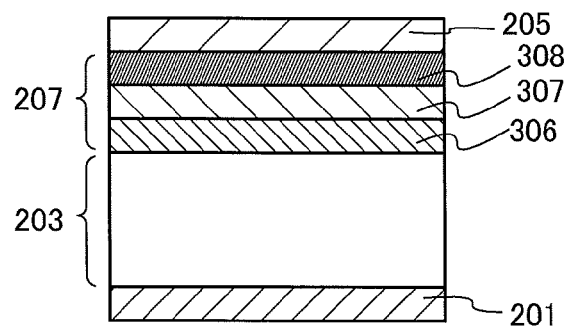

A specific example of a structure of the intermediate layer 207 is illustrated in FIG. 4D. The intermediate layer 207 includes at least a charge-generation region 308. In addition to the charge-generation region 308, the intermediate layer 207 may further include an electron-relay layer 307 and an electron-injection buffer layer 306.

When a voltage higher than the threshold voltage of the light-emitting element is applied between the first electrode 201 and the second electrode 205, holes and electrons are generated in the charge-generation region 308, and the holes move into the second electrode 205 and the electrons move into the electron-relay layer 307. The electron-relay layer 307 has a high electron-transport property and immediately transfers the electrons generated in the charge-generation region 308 to the electron-injection buffer layer 306. The electron-injection buffer layer 306 reduces a barrier to electron injection into the EL layer 203, so that the efficiency of the electron injection into the EL layer 203 is increased. Thus, the electrons generated in the charge-generation region 308 are injected into the LUMO level of the EL layer 203 through the electron-relay layer 307 and the electron-injection buffer layer 306.

In addition, the electron-relay layer 307 can prevent reaction at the interface between a substance contained in the charge-generation region 308 and a substance contained in the electron-injection buffer layer 306. Thus, it is possible to prevent interaction such as damaging the functions of the charge-generation region 308 and the electron-injection buffer layer 306.

Figure 4E:
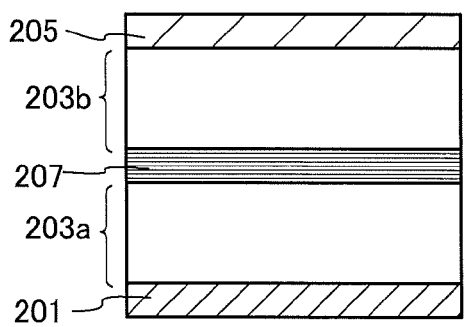
Figure 4F:
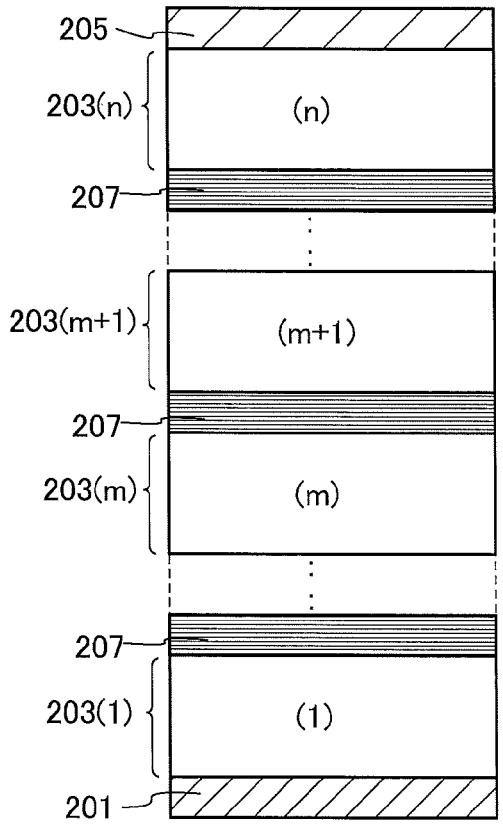

As illustrated in light-emitting elements in FIGS. 4E and 4F, a plurality of EL layers may be stacked between the first electrode 201 and the second electrode 205. In this case, the intermediate layer 207 is preferably provided between the stacked EL layers. For example, the light-emitting element illustrated in FIG. 4E includes the intermediate layer 207 between a first EL layer 203a and a second EL layer 203b. The light-emitting element illustrated in FIG. 4F includes n EL layers (n is a natural number of 2 or more), and the intermediate layer 207 is provided between the stacked EL layers.

The following will show behaviors of electrons and holes in the intermediate layer 207 between the EL layer 203($m$) and the EL layer 203($m$+1). When a voltage higher than the threshold voltage of the light-emitting element is applied between the first electrode 201 and the second electrode 205, holes and electrons are generated in the intermediate layer 207, and the holes move into the EL layer 203($m$+1) provided on the second electrode 205 side and the electrons move into the EL layer 203($m$) provided on the first electrode 201 side. The holes injected into the EL layer 203($m$+1) are recombined with the electrons injected from the second electrode 205 side, so that a light-emitting substance contained in the EL layer 203($m$+1) emits light. Further, the electrons injected into the EL layer 203($m$) are recombined with the holes injected from the first electrode 201 side, so that a light-emitting substance contained in the EL layer 203($m$) emits light. Thus, the holes and electrons generated in the intermediate layer 207 cause light emission in the respective EL layers.

Note that the EL layers can be provided in contact with each other as long as the same structure as the intermediate layer is formed therebetween. For example, when the charge-generation region is formed over one surface of an EL layer, another EL layer can be provided in contact with the surface.

Further, by forming EL layers to emit light of different colors from each other, a light-emitting element as a whole can provide light emission of a desired color. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. That is, white light emission can be obtained by mixture of light from materials whose emission colors are complementary colors. This can be applied to a light-emitting element having three or more EL layers.

FIGS. 4A to 4F can be used in an appropriate combination. For example, the intermediate layer 207 can be provided between the second electrode 205 and the EL layer 203(n) in FIG. 4F.

Examples of materials which can be used for each layer will be described below. Note that each layer is not limited to a single layer, but may be a stack of two or more layers.

<Anode>

The electrode serving as the anode (the first electrode 201) can be formed using one or more kinds of conductive metals, alloys, conductive compounds, and the like. In particular, it is preferable to use a material with a high work function (4.0 eV or more). Examples include indium tin oxide (ITO), indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal material (e.g., titanium nitride).

When the anode is in contact with the charge-generation region, any of a variety of conductive materials can be used regardless of their work functions; for example, aluminum, silver, an alloy containing aluminum, or the like can be used.

<Cathode>

The electrode serving as the cathode (the second electrode 205) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

When the cathode is in contact with the charge-generation region, any of a variety of conductive materials can be used regardless of their work functions; for example, ITO or indium tin oxide containing silicon or silicon oxide can be used.

The light-emitting element may have a structure in which one of the anode and the cathode is formed using a conductive film that transmits visible light and the other is formed using a conductive film that reflects visible light, or a structure in which both the anode and the cathode are formed using conductive films that transmit visible light.

The conductive film that transmits visible light can be formed using, for example, indium oxide, ITO, indium zinc oxide, zinc oxide, or zinc oxide to which gallium is added. Alternatively, a film of a metal material such as gold, platinum, nickel, tungsten, chromium, molybdenum, iron, cobalt, copper, palladium, or titanium, or a nitride of any of these metal materials (e.g., titanium nitride) formed thin so as to have a light-transmitting property can be used. Further alternatively, graphene or the like may be used.

The conductive film that reflects visible light can be formed using, for example, a metal material such as aluminum, gold, platinum, silver, nickel, tungsten, chromium, molybdenum, iron, cobalt, copper, or palladium; an aluminum-containing alloy (aluminum alloy) such as an alloy of aluminum and titanium, an alloy of aluminum and nickel, or an alloy of aluminum and neodymium; or a silver-containing alloy such as an alloy of silver and copper. An alloy of silver and copper is preferable because of its high heat resistance. Further, lanthanum, neodymium, or germanium may be added to the metal material or the alloy.

The electrodes may be formed separately by a vacuum evaporation method or a sputtering method. Alternatively, when a silver paste or the like is used, a coating method or an inkjet method may be used.

<Hole-Injection Layer 301>

The hole-injection layer 301 contains a substance with a high hole-injection property.

Examples of the substance with a high hole-injection property include metal oxides such as molybdenum oxide, vanadium oxide, ruthenium oxide, tungsten oxide, and manganese oxide, phthalocyanine-based compounds such as phthalocyanine ($H_2Pc$) and copper(II) phthalocyanine (CuPc), and the like.

Alternatively, it is possible to use a high molecular compound such as poly(N-vinylcarbazole) (abbreviation: PVK), poly(4-vinyltriphenylamine) (abbreviation: PVTPA), or a high molecular compound to which acid is added, such as poly(3,4-ethylenedioxythiophene)/poly(styrenesulfonic acid) (PEDOT/PSS).

The hole-injection layer 301 may serve as the charge-generation region. When the hole-injection layer 301 in contact with the anode serves as the charge-generation region, a variety of conductive materials can be used for the anode regardless of their work functions. Materials contained in the charge-generation region will be described later.

<Hole-Transport Layer 302>

The hole-transport layer 302 contains a substance with a high hole-transport property.

The substance with a high hole-transport property is preferably a substance with a property of transporting more holes than electrons, and is especially preferably a substance with a hole mobility of $10^{-6}$ cm$^2$/Vs or more. For example, it is possible to use any of a variety of compounds such as an aromatic amine compound such as 4,4'-bis[N-(1-naphthyl)-N-phenylamino]biphenyl (abbreviation: NPB or α-NPD) or 4-phenyl-4'-(9-phenylfluoren-9-yl)triphenylamine (abbreviation: BPAFLP), a carbazole derivative such as 4,4'-di(N-carbazolyl)biphenyl (abbreviation: CBP), 9-[4-(10-phenyl-9-anthryl)phenyl]-9H-carbazole (abbreviation: CzPA), or 9-phenyl-3-[4-(10-phenyl-9-anthryl)phenyl]-9H-carbazole (abbreviation: PCzPA), an aromatic hydrocarbon compound such as 2-tert-butyl-9,10-di(2-naphthyl)anthracene (abbreviation: t-BuDNA), 9,10-di(2-naphthyl)anthracene (abbreviation: DNA), or 9,10-diphenylanthracene (abbreviation: DPAnth), or a high molecular compound such as PVK or PVTPA.

<Light-Emitting Layer 303>

For the light-emitting layer 303, a light-emitting substance such as a fluorescent compound, which exhibits fluorescence, or a phosphorescent compound, which exhibits phosphorescence, can be used.

Examples of the fluorescent compound that can be used for the light-emitting layer 303 include N,N'-bis[4-(9H-carbazol-9-yl)phenyl]-N,N-diphenylstilbene-4,4'-diamine (abbreviation: YGA2S), N-(9,10-diphenyl-2-anthryl)-N,9-diphenyl-9H-carbazol-3-amine (abbreviation: 2PCAPA), and rubrene.

Examples of the phosphorescent compound that can be used for the light-emitting layer 303 include metallo-organic complexes such as bis[2-(4',6'-difluorophenyl)pyridinato-N, $C^{2'}$]iridium(III)picolinate (abbreviation: FIrpic), tris(2-phenylpyridinato-N,$C^{2'}$)iridium(III) (abbreviation: Ir(ppy)$_3$), and (acetylacetonato)bis(3,5-dimethyl-2-phenylpyrazinato) iridium(III) (abbreviation: Ir(mppr-Me)$_2$(acac)).

Note that the light-emitting layer 303 may have a structure in which any of the above light-emitting substances (a guest material) is dispersed in another substance (a host material). As the host material, a variety of kinds of materials can be used, and it is preferable to use a substance which has a lowest unoccupied molecular orbital level (LUMO level) higher than that of the guest material and has a highest occupied molecular orbital level (HOMO level) lower than that of the guest material.

With a structure in which a guest material is dispersed in a host material, crystallization of the light-emitting layer 303 can be suppressed. Further, concentration quenching due to high concentration of the guest material can be suppressed.

As the host material, the above-described substance having a high hole-transport property (e.g., an aromatic amine compound or a carbazole derivative), a substance having a high electron-transport property (e.g., a metal complex having a quinoline skeleton or a benzoquinoline skeleton or a metal complex having an oxazole-based ligand or a thiazole-based ligand), which will be described later, or the like can be used. Specifically, a metal complex such as tris(8-quinolinolato)aluminum(III) (abbreviation: Alq) or bis(2-methyl-8-quinolinolato)(4-phenylphenolato)aluminum(III) (abbreviation: BAlq), a heterocyclic compound such as 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP), a condensed aromatic compound such as CzPA, DNA, t-BuDNA, or DPAnth, an aromatic amine compound such as NPB, or the like can be used.

Alternatively, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

Further, when a plurality of light-emitting layers are provided and emission colors of the layers are made different, light emission of a desired color can be obtained from the light-emitting element as a whole. For example, the emission colors of first and second light-emitting layers are complementary in a light-emitting element having the two light-emitting layers, so that the light-emitting element can be made to emit white light as a whole. Further, the same applies to a light-emitting element having three or more light-emitting layers.

<Electron-Transport Layer 304>

The electron-transport layer 304 contains a substance with a high electron-transport property.

The substance with a high electron-transport property is preferably an organic compound having a property of transporting more electrons than holes, and is especially preferably a substance with an electron mobility of $10^{-6}$ cm$^2$/Vs or more.

As the substance having a high electron-transport property, for example, a metal complex having a quinoline skeleton or a benzoquinoline skeleton, such as Alq or Balq, or a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Alternatively, TAZ, BPhen, BCP, or the like can be used.

<Electron-Injection Layer 305>

The electron-injection layer 305 contains a substance with a high electron-injection property.

Examples of the substance with a high electron-injection property include an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Further alternatively, any of the above-described substances that are used to form the electron-transport layer 304 can be used.

<Charge-Generation Region>

The charge-generation region included in the hole-injection layer and the charge-generation region 308 each contain a substance with a high hole-transport property and an acceptor substance (electron acceptor). Note that the acceptor substance is preferably added so that the mass ratio of the acceptor substance to the substance with a high hole-transport property is 0.1:1 to 4.0:1.

The charge-generation region is not limited to a structure in which a substance with a high hole-transport property and an acceptor substance are contained in the same film, and may have a structure in which a layer containing a substance with a high hole-transport property and a layer containing an acceptor substance are stacked. Note that in the case of a stacked-layer structure in which the charge-generation region is provided on the cathode side, the layer containing the substance with a high hole-transport property is in contact with the cathode, and in the case of a stacked-layer structure in which the charge-generation region is provided on the anode side, the layer containing the acceptor substance is in contact with the anode.

The substance with a high hole-transport property is preferably an organic compound having a property of transporting more holes than electrons, and is especially preferably an organic compound with a hole mobility of $10^{-6}$ cm$^2$/Vs or more.

Specifically, it is possible to use any of the substances with a high hole-transport property shown as substances that can be used for the hole-transport layer 302, such as aromatic amine compounds such as NPB and BPAFLP, carbazole derivatives such as CBP, CzPA, and PCzPA, aromatic hydrocarbon compounds such as t-BuDNA, DNA, and DPAnth, and high molecular compounds such as PVK and PVTPA.

Examples of the acceptor substance include organic compounds, such as 7,7,8,8-tetracyano-2,3,5,6-tetrafluoroquinodimethane (abbreviation: F$_4$-TCNQ) and chloranil, oxides of transition metals, and oxides of metals that belong to Groups 4 to 8 in the periodic table. Specifically, vanadium oxide, niobium oxide, tantalum oxide, chromium oxide, molybdenum oxide, tungsten oxide, manganese oxide, and rhenium oxide are preferable since their electron-accepting property is high. In particular, use of molybdenum oxide is preferable because of its stability in the atmosphere, a low hygroscopic property, and easily handling.

<Electron-Injection Buffer Layer 306>

The electron-injection buffer layer 306 contains a substance with a high electron-injection property. The electron-injection buffer layer 306 facilitates electron injection from the charge-generation region 308 into the EL layer 203. As the substance with a high electron-injection property, any of the above-described substances can be used. Alternatively, the electron-injection buffer layer 306 may contain any of the above-described substances with a high electron-transport property and donor substances.

<Electron-Relay Layer 307>

The electron-relay layer 307 immediately accepts electrons drawn out by the acceptor substance in the charge-generation region 308.

The electron-relay layer 307 contains a substance with a high electron-transport property. As the substance with a high electron-transport property, a phthalocyanine-based material or a metal complex having a metal-oxygen bond and an aromatic ligand is preferably used.

As the phthalocyanine-based material, specifically, it is possible to use CuPc or vanadyl 2,9,16,23-tetraphenoxy-29H,31H-phthalocyanine (PhO-VOPc).

As the metal complex having a metal-oxygen bond and an aromatic ligand, a metal complex having a metal-oxygen double bond is preferably used. A metal-oxygen double bond has an acceptor property; thus, electrons can transfer (be donated and accepted) more easily.

As the metal complex having a metal-oxygen bond and an aromatic ligand, a phthalocyanine-based material is also preferably used.

As the phthalocyanine-based material, a phthalocyanine-based material having a phenoxy group is preferably used. Specifically, a phthalocyanine derivative having a phenoxy group, such as PhO-VOPc, is preferably used. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 307 may further contain any of the above-described donor substances. When the donor substance is contained in the electron-relay layer 307, electrons can transfer easily and the light-emitting element can be driven at a lower voltage.

The LUMO levels of the substance with a high electron-transport property and the donor substance are preferably −5.0 eV to −3.0 eV, i.e., between the LUMO level of the acceptor substance contained in the charge-generation region 308 and the LUMO level of the substance with a high electron-transport property contained in the electron-transport layer 304 (or the LUMO level of the EL layer 203 in contact with the electron-relay layer 307 or with the electron-injection buffer layer 306). When a donor substance is contained in the electron-relay layer 307, as the substance with a high electron-transport property, a substance with a LUMO level higher than the acceptor level of the acceptor substance contained in the charge-generation region 308 can be used.

The above-described layers included in the EL layer 203 and the intermediate layer 207 can be faulted separately by any of the following methods: an evaporation method (including a vacuum evaporation method), a transfer method, a printing method, an inkjet method, a coating method, and the like.

This embodiment can be freely combined with any of the other embodiments.

(Embodiment 4)

In this embodiment, examples of electronic devices and lighting devices to which one embodiment of the present invention is applied are described with reference to FIGS. 5A to 5E and FIGS. 6A and 6B.

By use of a light-emitting element manufactured according to one embodiment of the present invention, a passive matrix light-emitting device or an active matrix light-emitting device in which driving of the light-emitting element is controlled by a transistor (hereinafter referred to as a light-emitting device according to one embodiment of the present invention) can be manufactured. The light-emitting device can be applied to an electronic device, a lighting device, or the like. The light-emitting device used for an electronic device and a lighting device of this embodiment has high reliability because a light-emitting element manufactured according to one embodiment of the present invention is included.

Examples of the electronic device using a light-emitting device to which one embodiment of the present invention is applied is used include: television sets (also called TV or television receivers); monitors for computers or the like; cameras such as digital cameras or digital video cameras; digital photo frames; mobile phones (also called cellular phones or portable telephones); portable game machines; portable information terminals; audio playback devices; and large game machines such as pachinko machines. Specific examples of these electronic devices and lighting devices are illustrated in FIGS. 5A to 5E and FIGS. 6A and 6B.

FIG. 5A illustrates an example of a television device. In a television device 7100, a display portion 7102 is incorporated in a housing 7101. The display portion 7102 is capable of displaying images. The light-emitting device according to one embodiment of the present invention can be used for the display portion 7102. In addition, here, the housing 7101 is supported by a stand 7103.

The television device 7100 can be operated by an operation switch of the housing 7101 or a separate remote controller 7111. With operation keys of the remote controller 7111, channels and volume can be controlled and images displayed on the display portion 7102 can be controlled. Further, the remote controller 7111 may be provided with a display portion for displaying data output from the remote controller 7111.

Note that the television device 7100 is provided with a receiver, a modem, and the like. With the receiver, general television broadcasting can be received. Furthermore, when the television device 7100 is connected to a communication network with or without wires via the modem, one-way (from a sender to a receiver) or two-way (between a sender and a receiver or between receivers) information communication can be performed.

FIG. 5B illustrates an example of a computer. A computer 7200 includes a main body 7201, a housing 7202, a display portion 7203, a keyboard 7204, an external connecting port 7205, a pointing device 7206, and the like. Note that this computer is manufactured using the light-emitting device according to one embodiment of the present invention for the display portion 7203.

FIG. 5C illustrates an example of a portable game machine. A portable game machine 7300 includes two housings, a housing 7301*a* and a housing 7301*b*, which are connected with a joint portion 7302 so that the portable game machine can be opened or folded. A display portion 7303*a* is incorporated in the housing 7301*a* and a display portion 7303*b* is incorporated in the housing 7301*b*. In addition, the portable game machine illustrated in FIG. 5C includes a speaker portion 7304, a recording medium insertion portion 7305, operation keys 7306, a connection terminal 7307, a sensor 7308 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, vibration, smell, or infrared ray), an LED lamp, a microphone, and the like. It is needless to say that the structure of the portable game machine is not limited to the above as long as the light-emitting device according to one embodiment of the present invention is used for at least either the display portion 7303*a* or the display portion 7303*b*, or both of them. The portable game machine may be provided with other accessories as appropriate. The portable game machine in FIG. 5C has a function of reading a program or data stored in a recording medium to display it on the display portion, and a function of sharing information with another portable game machine by wireless communication. The portable game machine illustrated in FIG. 5C can have a variety of functions without limitation to the above.

FIG. 5D illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is manufactured using the light-emitting device according to one embodiment of the present invention for the display portion 7402.

When the display portion 7402 of the mobile phone 7400 illustrated in FIG. 5D is touched with a finger or the like, data can be input into the mobile phone 7400. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the cellular phone is placed horizontally or vertically for a landscape mode or a portrait mode).

The screen modes are switched by touching the display portion 7402 or operating the operation button 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

FIG. 5E illustrates an example of a fordable tablet terminal (in an open state). A tablet terminal 7500 includes a housing 7501a, a housing 7501b, a display portion 7502a, and a display portion 7502b. The housing 7501a and the housing 7501b are connected by a hinge 7503 and can be opened and closed along the hinge 7503. The housing 7501a includes a power switch 7504, operation keys 7505, a speaker 7506, and the like. Note that the tablet terminal 7500 is manufactured using the light-emitting device according to one embodiment of the present invention for either the display portion 7502a or the display portion 7502b, or both of them.

Part of the display portion 7502a or the display portion 7502b, in which data can be input by touching displayed operation keys can be used as a touch panel region. For example, the entire area of the display portion 7502a can display keyboard buttons and serve as a touch panel while the display portion 7502b can be used as a display screen.

Figure 6A:
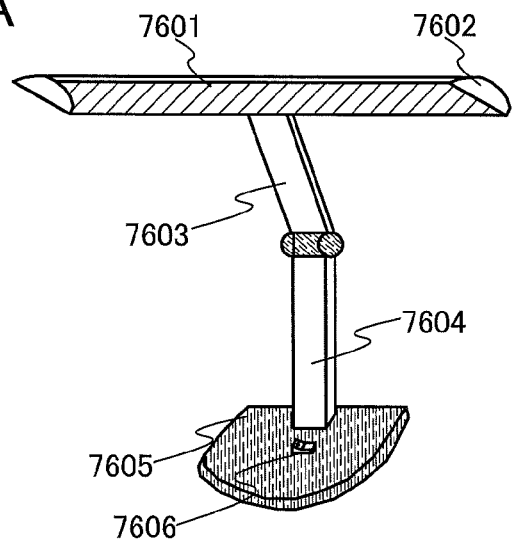
FIGS. 6A and 6B illustrate examples of lighting devices.

FIG. 6A illustrates a desk lamp including a lighting portion 7601, a shade 7602, an adjustable arm 7603, a support 7604, a base 7605, and a power switch 7606. The desk lamp is manufactured using the light-emitting device according to one embodiment of the present invention for the lighting portion 7601. Note that a lamp includes a ceiling light, a wall light, and the like in its category.

Figure 6B:
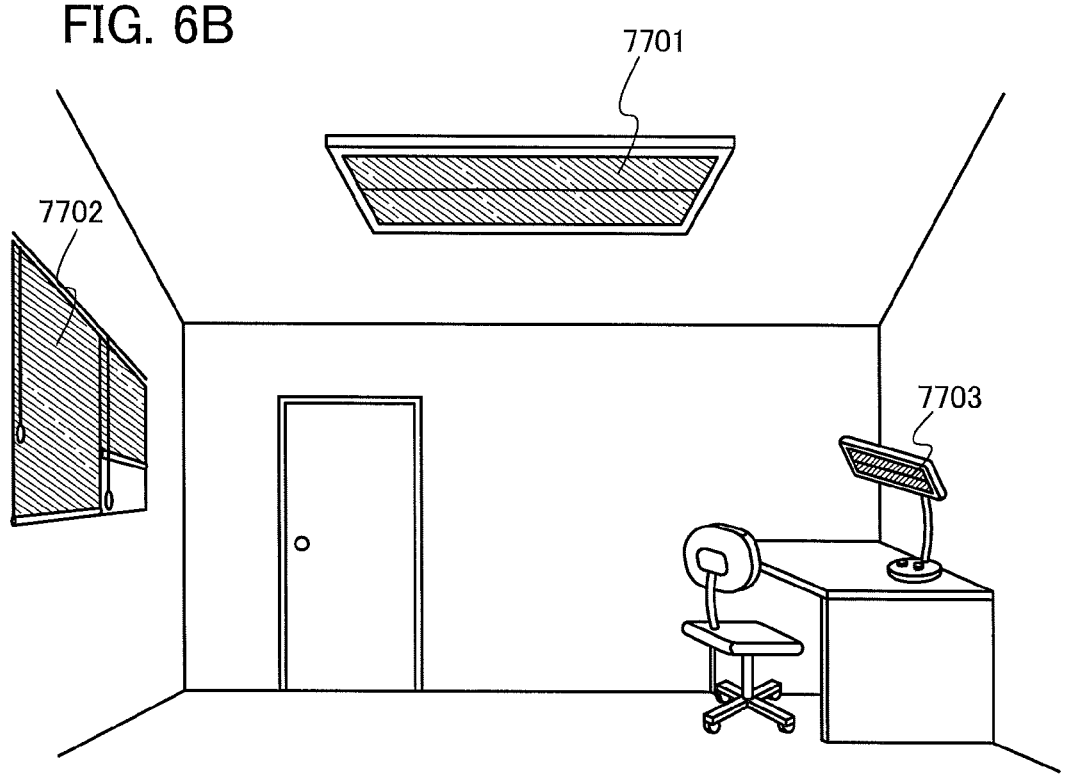

FIG. 6B illustrates an example in which the light-emitting device according to one embodiment of the present invention is used for an indoor lighting device 7701. Since the light-emitting device according to one embodiment of the present invention can have a larger area, it can be used as a large-area lighting device. In addition, the light-emitting device can be used as a roll-type lighting device 7702. As illustrated in FIG. 6B, a desk lamp 7703 described with reference to FIG. 6A may be used in a room provided with the indoor lighting device 7701.

This embodiment can be freely combined with any of the other embodiments.

Example 1

Figure 7A:
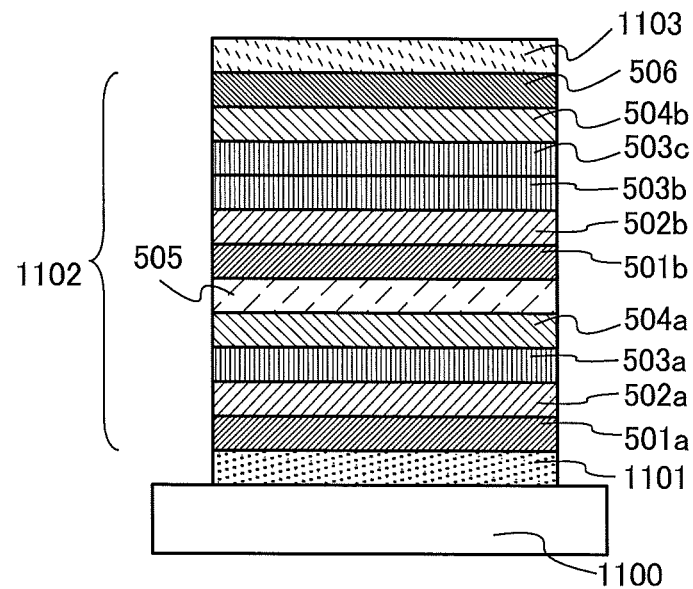
FIGS. 7A and 7B illustrate light-emitting elements in Examples.

In this example, a light-emitting element manufactured by a method for manufacturing a light-emitting element according to one embodiment of the present invention is described with reference to FIG. 7A. Chemical formulae of materials used in this example are shown below.

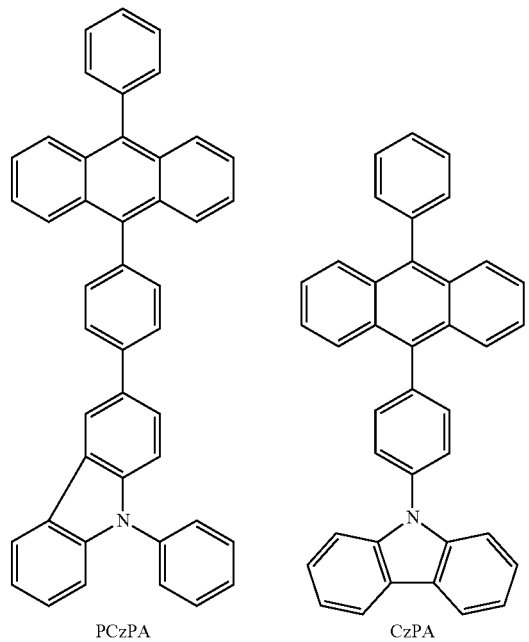

PCzPA                    CzPA

33
-continued

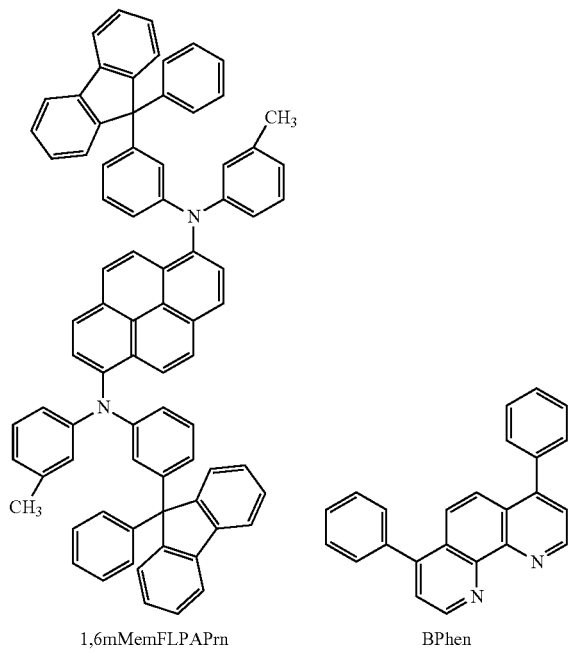

1,6mMemFLPAPrn  BPhen

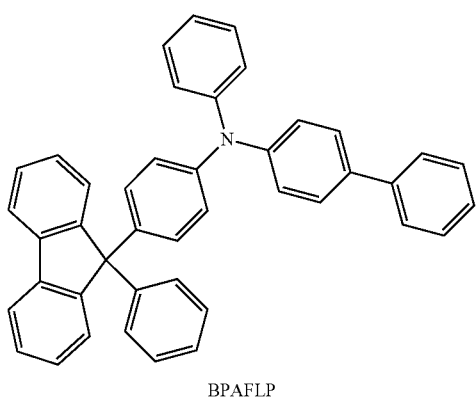

CuPc

BPAFLP

34
-continued

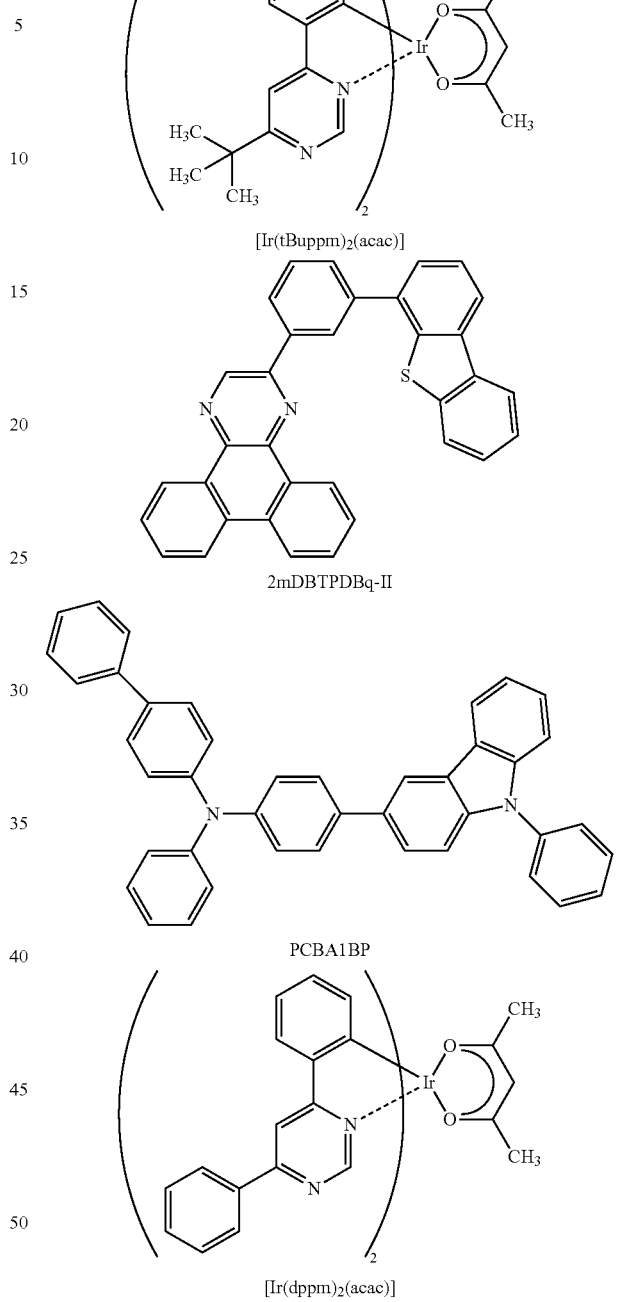

[Ir(tBuppm)₂(acac)]

2mDBTPDBq-II

PCBA1BP

[Ir(dppm)₂(acac)]

A light-emitting element 1 and a comparative light-emitting element 2 which are described in this example are provided over a substrate 1100 and have a structure in which an EL layer 1102 is provided between a first electrode 1101 and a second electrode 1103, and materials and thicknesses of layers included in the EL layers 1102 are the same. The light-emitting element 1 and the comparative light-emitting element 2 are different in a method for forming a lithium film included in an intermediate layer 505. First, common points of the two light-emitting elements about the manufacturing methods are described below, and then, different points (that is, the methods for manufacturing the lithium films) of the two elements are described.

(Method for Manufacturing Light-Emitting Element 1 and Comparative Light-Emitting Element 2)

First, a film of indium tin oxide containing silicon oxide (ITSO) was deposited over the substrate 1100 which was a glass substrate by a sputtering method to form the first electrode 1101. The thickness was 110 nm and the electrode area was 2 mm×2 mm.

Next, as pretreatment, after a substrate surface was cleaned, dry treatment was performed in a nitrogen atmosphere at 200° C. for 1 hour.

After that, the substrate was transferred into a vacuum evaporation apparatus where the pressure had been reduced to approximately $10^{-4}$ Pa, and subjected to vacuum baking at 150° C. for 1 hour in a heating chamber of the vacuum evaporation apparatus, and then, the substrate 1100 was cooled down to room temperature.

Next, the substrate 1100 was fixed to a substrate holder in the vacuum evaporation apparatus so that a surface of the substrate 1100 on which the first electrode 1101 was formed faced downward. The pressure in the vacuum evaporation apparatus was reduced to about $10^{-4}$ Pa. Then, by an evaporation method using resistance heating, 9-phenyl-3-[4-(10-phenyl-9-anthryl)phenyl]-9H-carbazole (abbreviation: PCzPA) and molybdenum(VI) oxide were co-deposited to form a first hole-injection layer 501a. The thickness of the first hole-injection layer 501a was set to 37 nm, and the mass ratio of PCzPA to molybdenum oxide was adjusted to 2:1 (=PCzPA: molybdenum oxide). Note that the co-deposition method refers to a deposition method in which deposition is carried out using a plurality of evaporation sources at the same time in one treatment chamber.

Next, PCzPA was deposited to a thickness of 30 nm over the first hole-injection layer 501a, so that a first hole-transport layer 502a was formed.

Then, 9-[4-(10-phenyl-9-anthryflphenyl]-9H-carbazole (abbreviation: CzPA) and N,N'-bis(3-methylphenyl)-N,N'-bis[3-(9-phenyl-9H-fluoren-9-yl)phenyl]-pyrene-1,6-diamine (abbreviation: 1,6 mMemFLPAPrn) were co-deposited over the first hole-transport layer 502a, so that a first light-emitting layer 503a was formed. The thickness of the first light-emitting layer 503a was set to 30 nm, and the mass ratio of CzPA to 1,6 mMemFLPAPrn was adjusted to 2:0.05 (=CzPA: 1,6 mMemFLPAPrn).

Next, over the first light-emitting layer 503a, CzPA was deposited to a thickness of 5 nm and then bathophenanthroline (abbreviation: BPhen) was deposited to a thickness of 15 nm, so that a first electron-transport layer 504a was formed.

Next, over the first electron-transport layer 504a, lithium (Li) was deposited to a thickness of 0.15 nm and then copper phthalocyanine (abbreviation: CuPc) was deposited to a thickness of 2 nm, so that the intermediate layer 505 was formed. As described above, the light-emitting element 1 and the comparative light-emitting element 2 are different in the method for forming a lithium film included in the intermediate layer 505. The details will be described later.

Next, over the intermediate layer 505, 4-phenyl-4'-(9-phenylfluoren-9-yl)triphenylamine (abbreviation: BPAFLP) and molybdenum(VI) oxide were co-deposited, so that a second hole-injection layer 501b was formed. The thickness of the second hole-injection layer 501b was 37 nm, and the mass ratio of BPAFLP to molybdenum oxide was adjusted to 2:1 (=BPAFLP: molybdenum oxide).

Next, BPAFLP was deposited to a thickness of 20 nm over the second hole-injection layer 501b, so that a second hole-transport layer 502b was formed.

Next, 2-[3-(dibenzothiophen-4-yl)phenyl]dibenzo[f,h]quinoxaline (abbreviation: 2mDBTPDBq-II), 4-phenyl-4'-(9-phenyl-9H-carbazol-3-yl)triphenylamine (abbreviation: PCBA1BP), and (acetylacetonato)bis(6-tert-butyl-4-phenylpyrimidinato)iridium(III) (abbreviation: [Ir(tBuppm)$_2$(acac)]) were co-deposited to form a second light-emitting layer 503b over the second hole-transport layer 502b. Here, the mass ratio of 2mDBTPDBq-II to PCBA1BP and [Ir(tBuppm)$_2$(acac)] was adjusted to 1.2:0.8:0.12 (=2mDBTPDBq-II: PCBA1BP: [Ir(tBuppm)$_2$(acac)]). In addition, the thickness of the second light-emitting layer 503b was set to 10 nm.

Further, 2mDBTPDBq-II, PCBA1BP, and (acetylacetonato)bis(4,6-diphenylpyrimidinato)iridium(III) (abbreviation: [Ir(dppm)$_2$(acac)]) were co-deposited, whereby a third light-emitting layer 503c was formed over the second light-emitting layer 503b. Here, the mass ratio of 2mDBTPDBq-II to PCBA1BP and [Ir(dppm)$_2$(acac)] was adjusted to 1.6:0.4:0.12 (=2mDBTPDBq-II: PCBA1BP: [Ir(dppm)$_2$(acac)]). The thickness of the third light-emitting layer 503c was set to 30 nm.

Next, over the third light-emitting layer 503c, 2mDBTP-DBq-II was deposited to a thickness of 15 nm and then BPhen was deposited to a thickness of 15 nm, so that a second electron-transport layer 504b was formed.

Further, lithium fluoride (LiF) was deposited to a thickness of 1 nm over the second electron-transport layer 504b, whereby an electron-injection layer 506 was formed.

Lastly, aluminum was deposited to a thickness of 200 nm as the second electrode 1103 functioning as a cathode. Thus, the light-emitting element of this example was manufactured.

Note that in the above deposition process, deposition was all performed by a resistance heating method.

In a glove box containing a nitrogen atmosphere, the light-emitting elements of this example were sealed with a glass substrate so as not to be exposed to the atmosphere. Then, operation characteristics of these light-emitting elements were measured. Note that the measurement was carried out at room temperature (in an atmosphere kept at 25° C.).

Here, the method for forming a lithium film included in the intermediate layer 505, which is a difference between the light-emitting element 1 and the comparative light-emitting element 2, is described with reference to FIGS. 8A and 8B, FIGS. 9A and 9B, and FIG. 10.

Figure 8A:
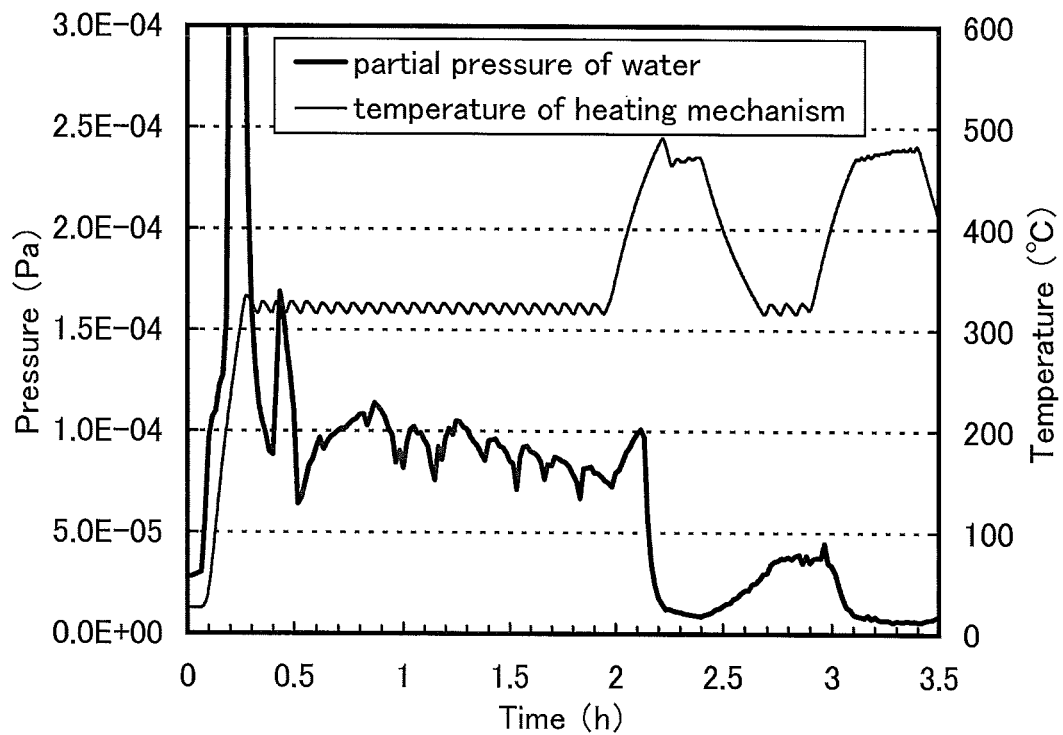
FIGS. 8A and 8B show the partial pressure of water in Example 1.
Figure 8B:
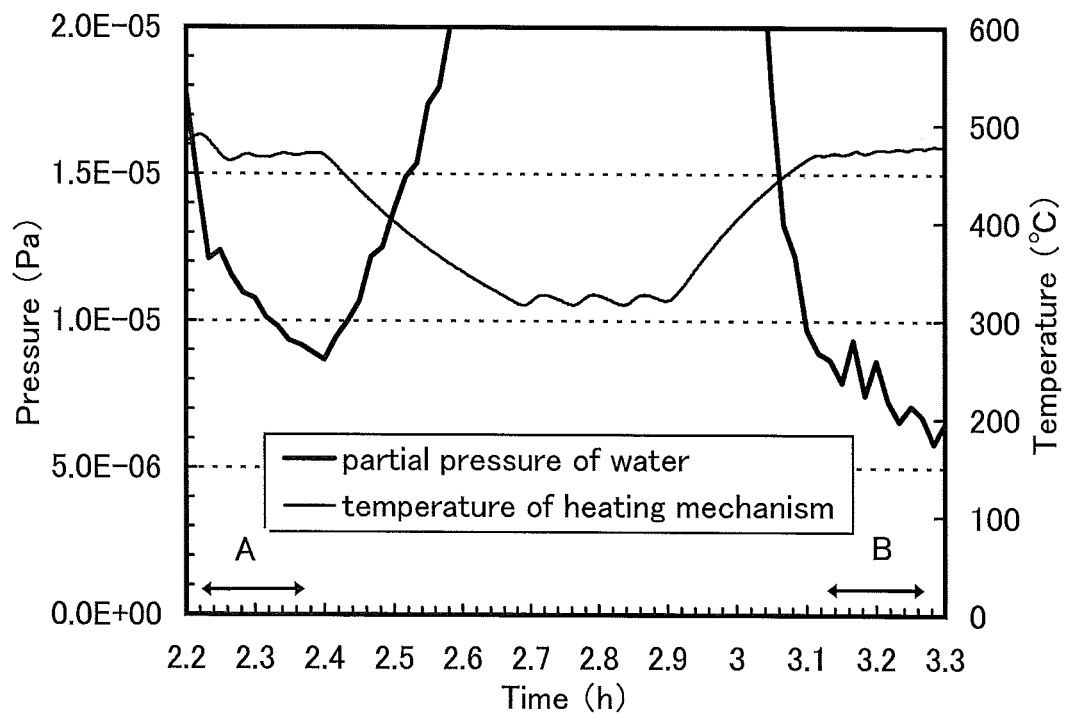
Figure 9A:
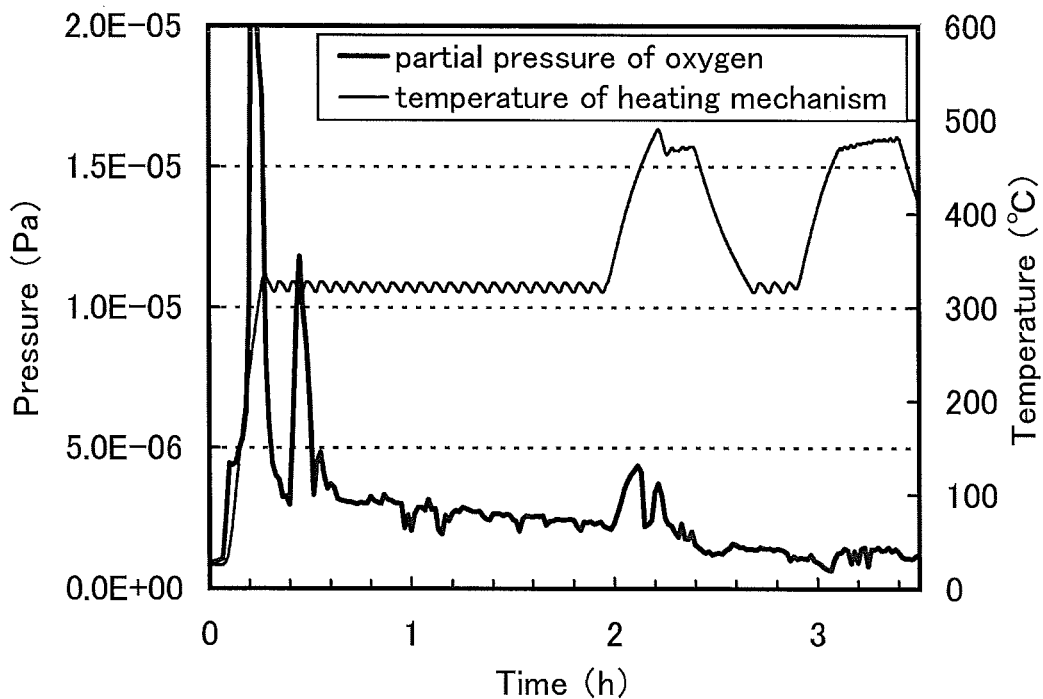
FIGS. 9A and 9B show the partial pressure of oxygen atoms in Example 1.
Figure 9B:
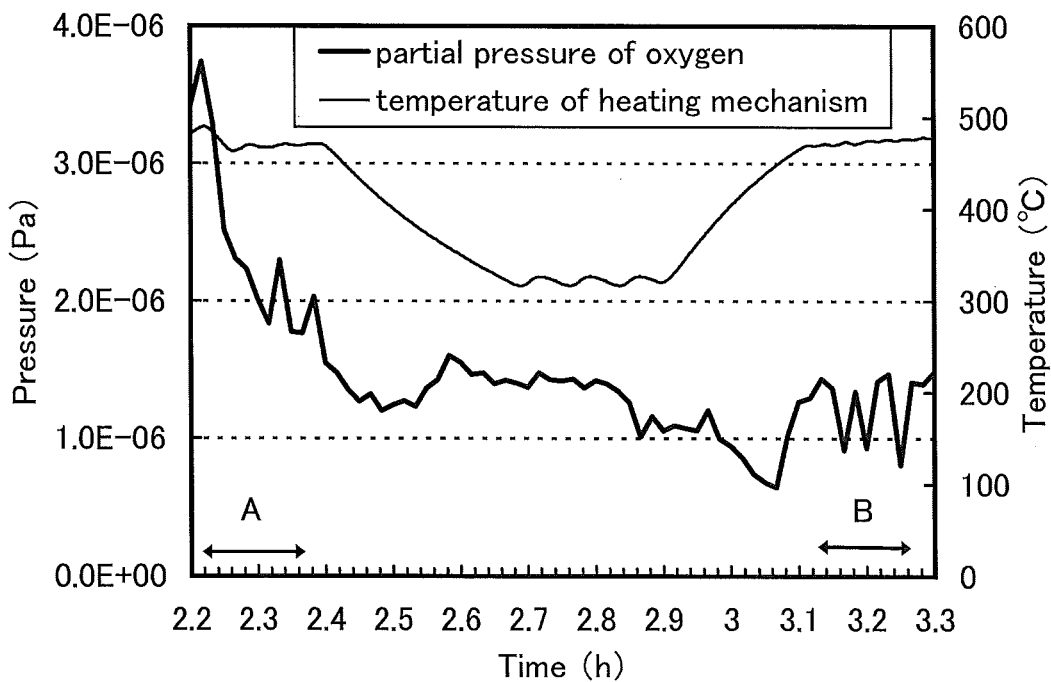

FIGS. 8A and 8B show results of the partial pressure of water ($^{18}$H$_2$O) in a deposition chamber in which a lithium film included in the light-emitting element of this example is deposited, which is measured with a quadrupole mass spectrometer. Further, FIGS. 9A and 9B show results of the partial pressure of oxygen atoms ($^{16}$O) in the deposition chamber, which is measured with a quadrupole mass spectrometer. FIG. 8A and FIG. 9A each show measurement results for 3.5 hours from the start of the measurement with the quadrupole mass spectrometer, and FIG. 8B and FIG. 9B each show measurement results in the range from 2.20 hours to 3.30 hours including a period during which the lithium films of the light-emitting element 1 and the comparative light-emitting element 2 were formed.

First, after the temperature of a heating mechanism (here, a heater) included in a deposition material holding portion was increased to 320° C., the temperature was kept at about 320° C. and moisture in a deposition material (lithium) was removed.

Next, about 1.95 hours later, the temperature of the heating mechanism was further increased to higher than or equal to a temperature at which lithium is vaporized.

Then, in the range from 2.22 hours to 2.37 hours (period A shown in each of FIG. 8B and FIG. 9B), the lithium film of the comparative light-emitting element 2 was formed. The average partial pressure of water in the period A was $1.1 \times 10^{-5}$ Pa, and the average partial pressure of oxygen atoms in the period A was $2.38 \times 10^{-6}$ Pa.

After that, a substrate placed in the deposition chamber was switched from a supporting substrate of the comparative light-emitting element 2 to a supporting substrate of the light-emitting element 1. Then, it was confirmed that the partial pressure of water became smaller than the average partial pressure of water in the period A, and the lithium film of the light-emitting element 1 was formed in the range from 3.13 hours to 3.27 hours (period B shown in each of FIG. 8B and FIG. 9B). Note that the average partial pressure of water in the period B was $7.8 \times 10^{-6}$ Pa, and the average partial pressure of oxygen atoms was $1.23 \times 10^{-6}$ Pa. As described above, the lithium film of the light-emitting element 1 was formed in the deposition chamber in which the partial pressure of water and the partial pressure of oxygen atoms were smaller than those in the comparative light-emitting element 2.

Figure 10:
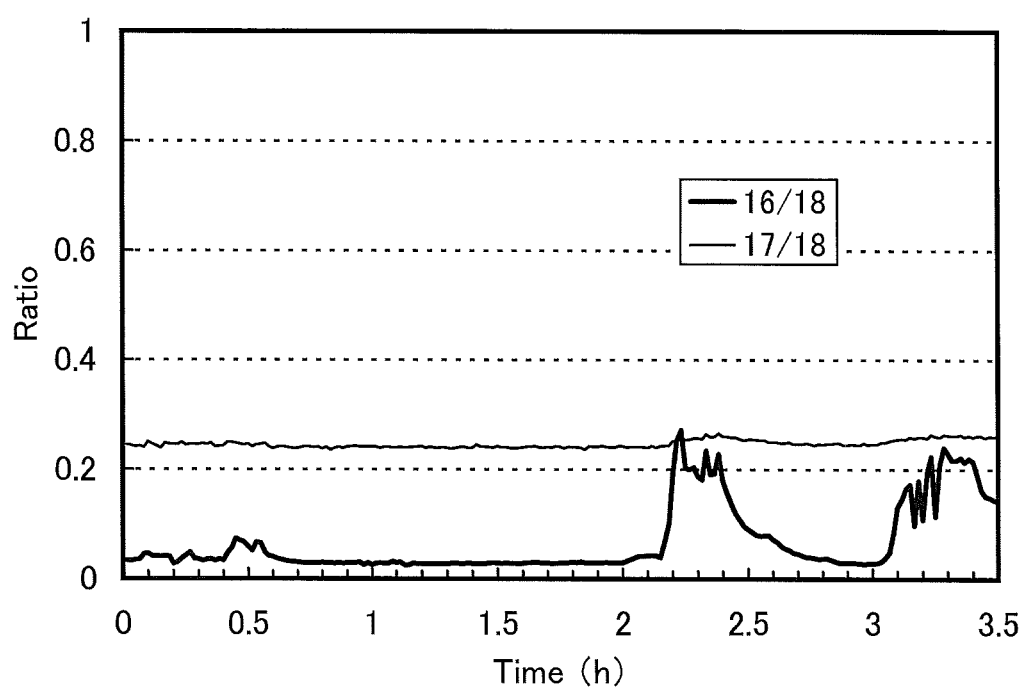
FIG. 10 shows the ratio of partial pressure in Example 1.

FIG. 10 shows the ratio (16/18) of the partial pressure of oxygen atoms ($^{16}O$) to the partial pressure of water ($^{18}H_2O$) shown in FIGS. 8A and 8B and FIGS. 9A and 9B. For comparison, FIG. 10 also shows the ratio (17/18) of the partial pressure of a hydroxide ion having a molecular weight of 17 ($^{17}OH^-$) to the partial pressure of water ($^{18}H_2O$).

In FIG. 10, the ratio of the partial pressure of a hydroxide ion having a mass number of 17 with respect to the partial pressure of water having a mass number of 18 does not change depending on the time. On the other hand, the ratio of the partial pressure of oxygen atoms having a mass number of 16 with respect to the partial pressure of water having a mass number of 18 largely changes depending on the time. This indicates that the partial pressure of a hydroxide ion having a mass number of 17 is affected by water in the deposition material or the amount of moisture in the deposition chamber. On the other hand, it is indicated that the partial pressure of oxygen atoms having a mass number of 16 is affected by not only the amount of moisture but also the amount of oxygen contained in the deposition material. It can be said from these results that in one embodiment of the present invention, deposition is preferably performed while the partial pressure of oxygen atoms ($^{16}O$) in a deposition chamber is measured with a quadrupole mass spectrometer.

Table 1 shows element structures of the light-emitting element 1 and the comparative light-emitting element 2 obtained as described above.

TABLE 1

| First electrode ITSO 110 nm | | | | | |
|---|---|---|---|---|---|
| First hole-injection layer | First hole-transport layer | First light-emitting layer | First electron-transport layer | Intermediate layer | |
| PCzPA:MoOx (=2:1) 37 nm | PCzPA 30 nm | CzPA:1,6mMemFLPAPm (=2:0.05) 30 nm | CzPA 5 nm | BPhen 15 nm | Li 0.15 nm | CuPc 2 nm |
| Second hole-injection layer | Second hole-transport layer | Second light-emitting layer | | Third light-emitting layer | |
| BPAFLP:MoOx (=2:1) 37 nm | BPAFLP 20 nm | 2mDBTPDBq-II:PCBA1BP :[Ir(tBuppm)2(acac)] (=1.2:0.8:0.12) 10 nm | | 2mDBTPDBq-II:PCBA1BP :[Ir(dppm)2(acac)] (=1.6:0.4:0.12) 30 nm | |
| Second electron-transport layer | | Electron-injection layer | Second electrode | | |
| 2mDBTPDBq-II 15 nm | BPhen 15 nm | LiF 1 nm | Al 200 nm | | |

Figure 11A:
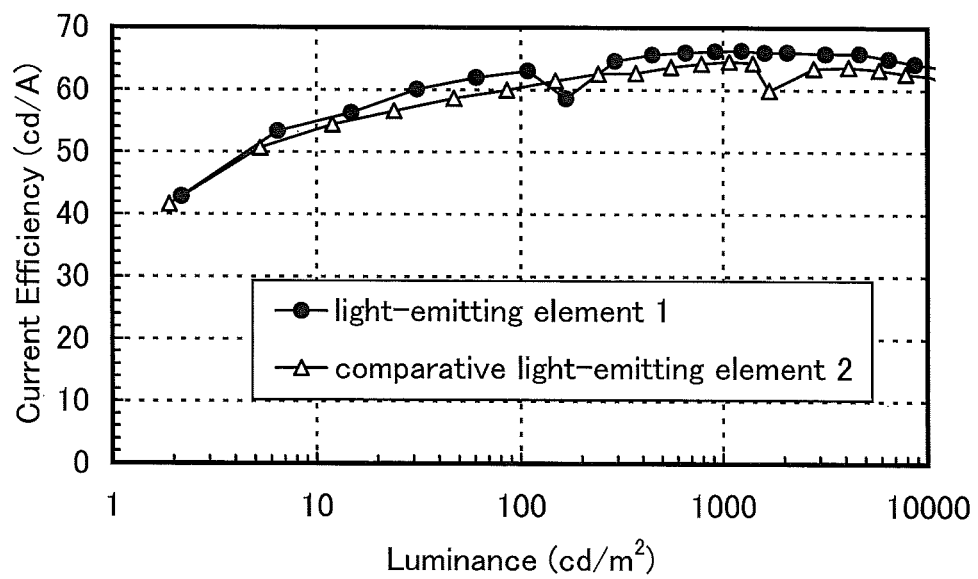
FIGS. 11A and 11B show luminance-current efficiency characteristics and voltage-current characteristics of light-emitting elements of Example 1.
Figure 11B:
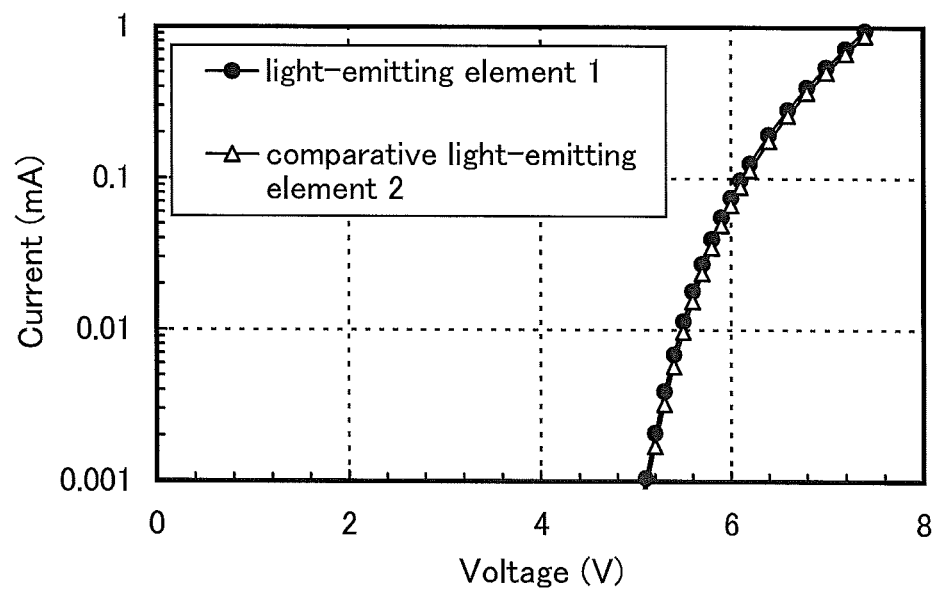
Figure 12A:
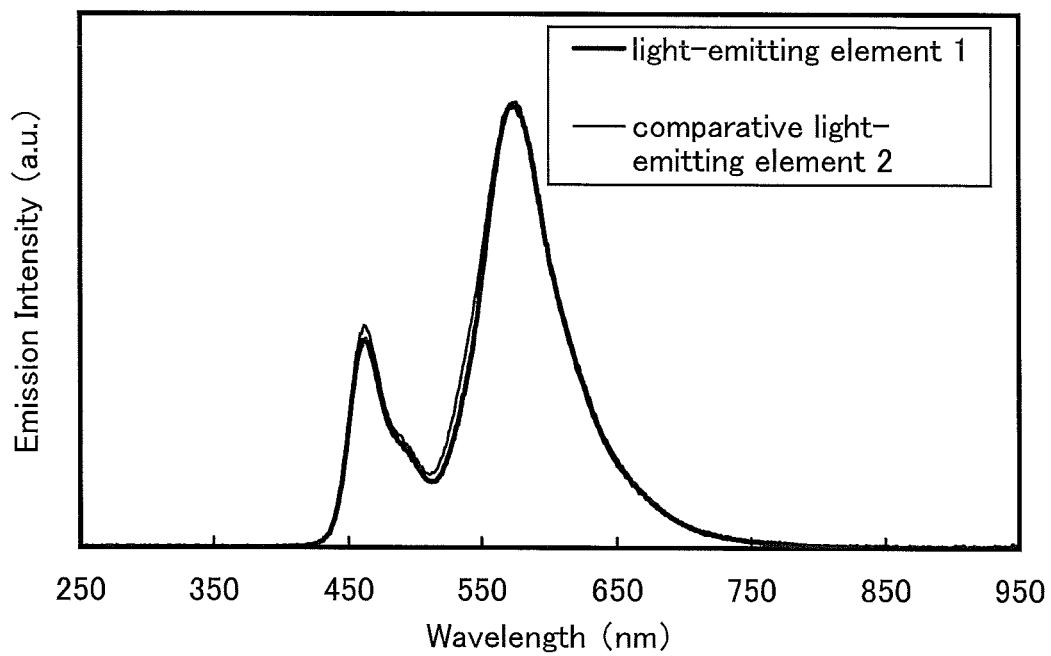
FIGS. 12A and 12B show emission spectra and results of reliability tests of light-emitting elements of Example 1.

FIG. 11A shows luminance-current efficiency characteristics of the light-emitting element 1 and the comparative light-emitting element 2. In FIG. 11A, the horizontal axis represents luminance (cd/m$^2$), and the vertical axis represents current efficiency (cd/A). FIG. 11B shows voltage-current characteristics. In FIG. 11B, the horizontal axis represents voltage (V), and the vertical axis represents current (mA). FIG. 12A shows emission spectra of the light-emitting elements of this example which were obtained by applying a current of 0.1 mA. In FIG. 12A, the horizontal axis represents wavelength (nm), and the vertical axis represents emission intensity (arbitrary unit).

Further, Table 2 shows the voltage (V), current density (mA/cm$^2$), CIE chromaticity coordinates (x, y), luminance (cd/m$^2$), current efficiency (cd/A), and power efficiency (lm/W) of each light-emitting element at a luminance of around 1000 cd/m$^2$.

TABLE 2

|  | Voltage (V) | Current density (mA/cm$^2$) | Chromaticity (x, y) | Luminance (cd/m$^2$) | Current efficiency (cd/A) | Power efficiency (lm/W) |
|---|---|---|---|---|---|---|
| Light-emitting element 1 | 5.9 | 1.38 | (0.40, 0.39) | 900 | 66 | 35 |
| Comparative light-emitting element 2 | 6.0 | 1.66 | (0.39, 0.40) | 1100 | 65 | 34 |

As shown in FIGS. 11A and 11B, luminance-current efficiency characteristics and voltage-current characteristics do not differ between the light-emitting element 1 and the comparative light-emitting element 2. Further, as shown in FIG. 12A, the light-emitting element 1 and the comparative light-emitting element 2 show almost similar emission spectra.

Figure 12B:
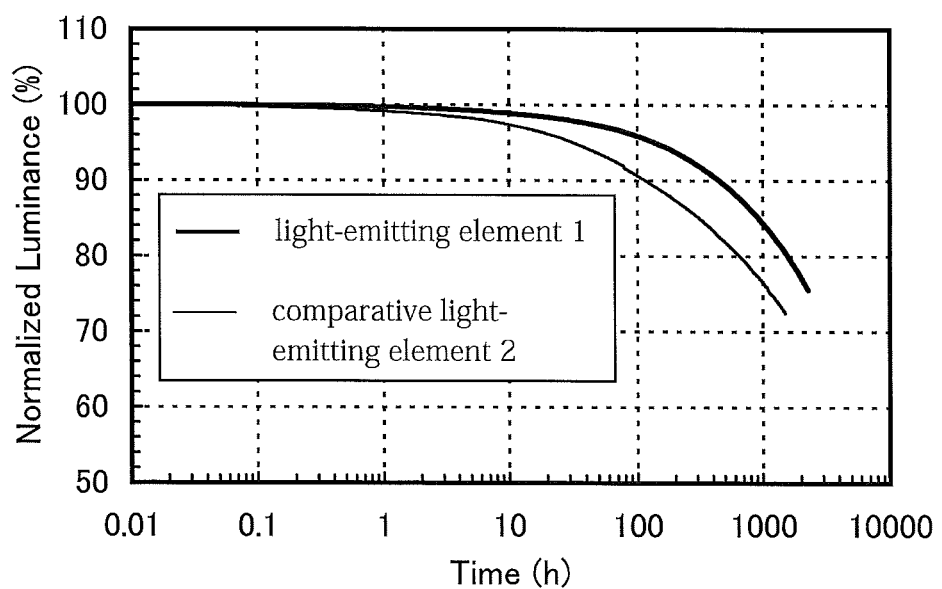

Next, the light-emitting element 1 and the comparative light-emitting element 2 were subjected to reliability tests. Results of the reliability tests are shown in FIG. 12B. In FIG. 12B, the vertical axis represents normalized luminance (%) with an initial luminance of 100%, and the horizontal axis represents driving time (h) of the elements. In the reliability tests, the light-emitting elements of this example were driven at room temperature under the conditions where the initial luminance was set to 5000 cd/m$^2$ and the current density was constant. FIG. 12B shows that the light-emitting element 1 kept 76% of the initial luminance after driving for 2300 hours and the comparative light-emitting element 2 kept 72% of the initial luminance after driving for 1500 hours. These results of the reliability tests revealed that the light-emitting element 1 has a longer lifetime than the comparative light-emitting element 2.

The manufacturing process of the light-emitting element 1 and that of the comparative light-emitting element 2 were different in an environment of the deposition chamber (the partial pressure of water and the partial pressure of oxygen atoms) at formation of the lithium films. In addition, in the comparative light-emitting element 2, there was no period during which the deposition material was heated and vaporized before a period during which the lithium film was formed (period A). On the other hand, in the light-emitting element 1 to which one embodiment of the present invention was applied, there was a period during which the deposition material was heated and vaporized (period A) before a period during which the lithium film was formed (period B). In addition, at the start of the period B, the partial pressure of water in the deposition chamber was lower than the average partial pressure of water in the period A. Further, at the start of the period B, the partial pressure of oxygen atoms in the deposition chamber was lower than the average partial pressure of oxygen atoms in the period A.

The difference of results in the reliability tests between the light-emitting element 1 and the comparative light-emitting element 2 is thought to be due to the difference of conditions at formation of the above lithium films. This example shows that a light-emitting element having a long lifetime can be manufactured by application of one embodiment of the present invention.

Example 2

Figure 7B:
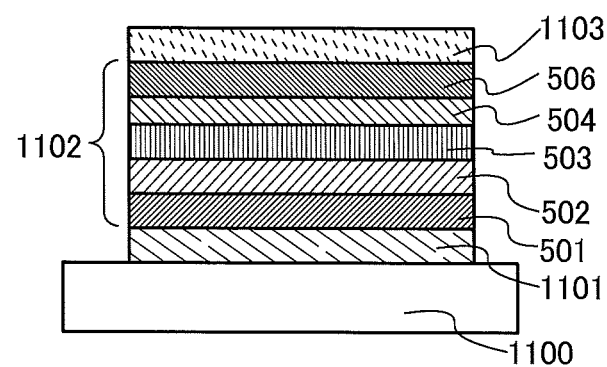

In this example, a light-emitting element manufactured by a method for manufacturing a light-emitting element according to one embodiment of the present invention is described with reference to FIG. 7B. Materials used in this example are the same as those used in Example 1, and their chemical formulae are omitted here.

A light-emitting element 3 and a comparative light-emitting element 4 which are described in this example are provided over the substrate 1100 and have a structure in which the EL layer 1102 is provided between the first electrode 1101 and the second electrode 1103, and materials and thicknesses of layers included in the EL layers 1102 are the same.

A pair of electrodes included in each of the light-emitting element 3 and the comparative light-emitting element 4 is manufactured under conditions (a material, a thickness, or the like) similar to those in Example 1. Further, the EL layer 1102 included in each of the light-emitting element 3 and the comparative light-emitting element 4 includes a hole-injection layer 501, a hole-transport layer 502, a light-emitting layer 503, an electron-transport layer 504, and the electron-injection layer 506.

The hole-injection layer 501 is formed using a material similar to that of the first hole-injection layer 501a in Example 1 and has a thickness of 50 nm. The light-emitting element 3 and the comparative light-emitting element 4 are different in a method for forming the hole-injection layer 501.

The hole-transport layer 502, the light-emitting layer 503, the electron-transport layer 504, and the electron-injection layer 506 are formed under conditions (materials, thicknesses, or the like) similar to those of the first hole-transport layer 502a, the first light-emitting layer 503a, the first electron-transport layer 504a, and the electron-injection layer 506 in Example 1, respectively.

The method for forming the hole-injection layer 501, which is a difference between the light-emitting element 3 and the comparative light-emitting element 4, is described below with reference to FIG. 13 and FIGS. 14A and 14B.

Figure 13:
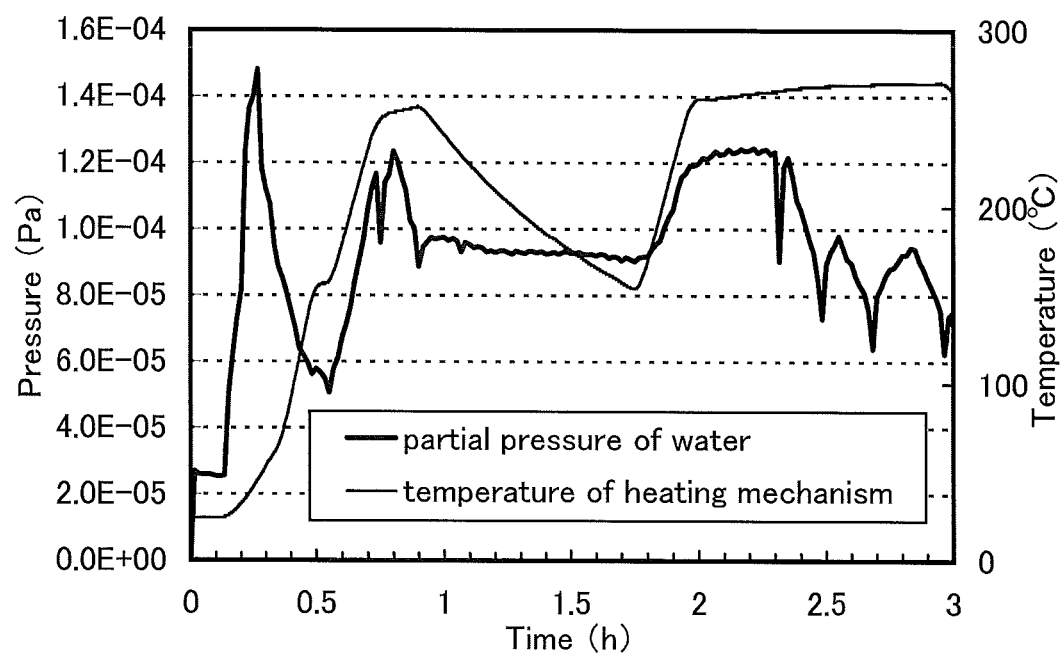
FIG. 13 shows the partial pressure of water in Example 2.
Figure 14A:
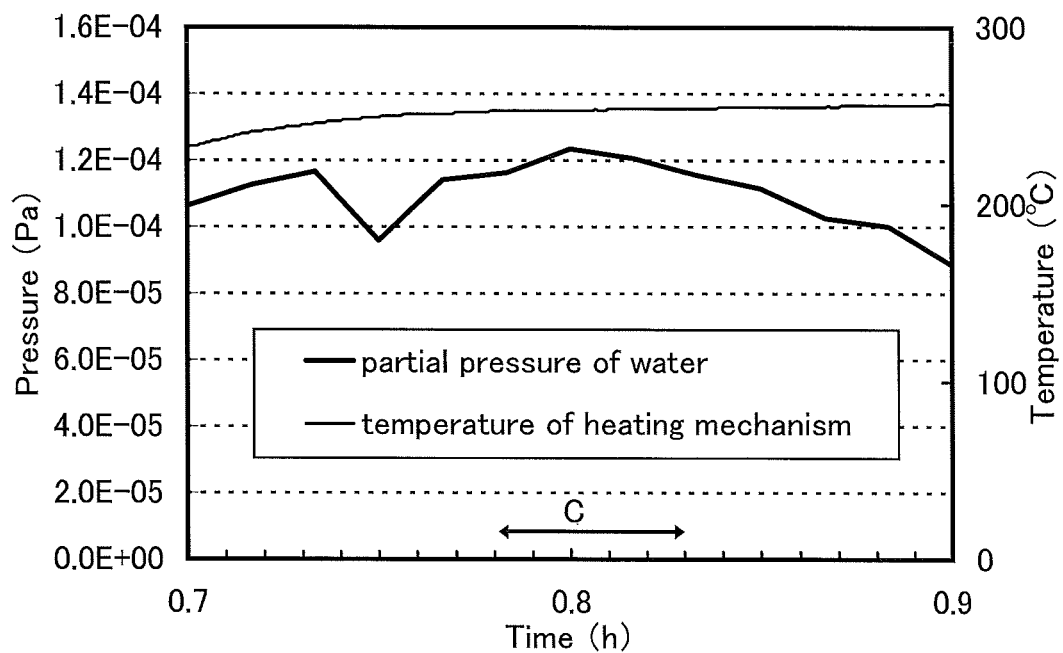
FIGS. 14A and 14B show the partial pressure of water in Example 2.
Figure 14B:
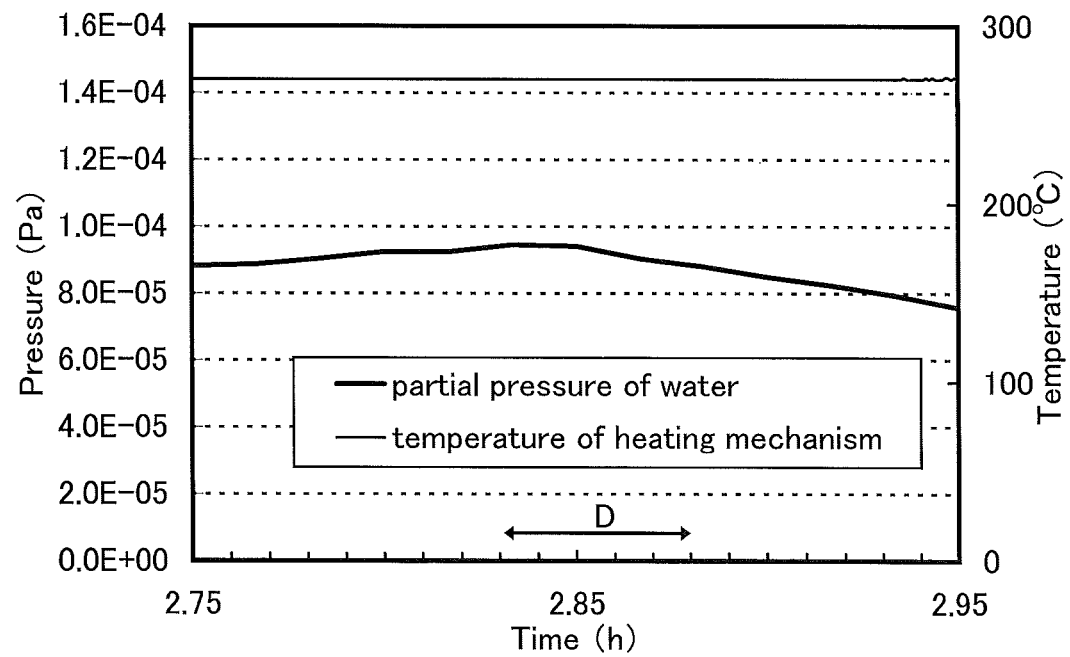

FIG. 13 and FIGS. 14A and 14B show results of the partial pressure of water ($^{18}H_2O$) in a deposition chamber in which the hole-injection layer 501 included in the light-emitting element of this example is deposited, which was measured with a quadrupole mass spectrometer. FIG. 13 shows measurement results for 3.0 hours from the start of the measurement with the quadrupole mass spectrometer, FIG. 14A shows measurement results in the range from 0.70 hours to 0.90 hours including a period during which the hole-injection layer 501 of the comparative light-emitting element 4 was formed, and FIG. 14B shows measurement results in the range from 2.75 hours to 2.95 hours including a period during which the hole-injection layer 501 of the light-emitting element 3 was formed.

First, the temperature of a heating mechanism (here, a heater) included in a deposition material holding portion was increased to 150° C., and then further increased to higher than or equal to a temperature at which PCzPA and molybdenum oxide were vaporized.

Then, in the range from 0.78 hours to 0.83 hours (period C in FIG. 14A), a hole-injection layer of the comparative light-emitting element 4 was formed. The average partial pressure of water in the period C was $1.19 \times 10^{-4}$ Pa.

After that, a substrate placed in the deposition chamber was switched from a supporting substrate of the comparative light-emitting element 4 to a supporting substrate of the light-emitting element 3. Then, it was confirmed that the partial pressure of water became smaller than the average partial pressure of water in the period C, and the hole-injection layer of the light-emitting element 3 was formed in the range from 2.83 hours to 2.88 hours (period D shown in FIG. 14B). Note that the average partial pressure of water in the period D was $9.18 \times 10^{-5}$ Pa. As described above, the hole-injection layer of the light-emitting element 3 was formed in the deposition chamber in which the partial pressure of water was smaller than that in the comparative light-emitting element 4.

Table 3 shows element structures of the light-emitting element 3 and the comparative light-emitting element 4 obtained as described above.

TABLE 3

| First electrode | Hole-injection layer | Hole-transport layer | Light-emitting layer | Electron-transport layer | Electron-injection layer | Second electrode |
|---|---|---|---|---|---|---|
| ITSO 110 nm | PCzPA:MoOx (=2:1) 50 nm | PCzPA 30 nm | CzPA:1,6mMemFLPAPm (=2:0.05) 30 nm | CzPA 5 nm | BPhen 15 nm | LiF 1 nm | Al 200 nm |

Figure 15A:
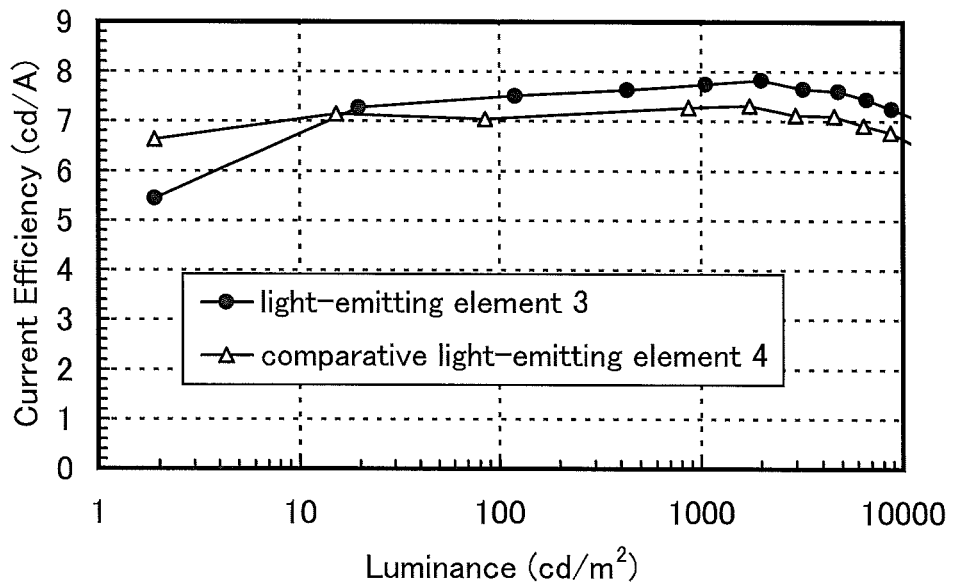
FIGS. 15A and 15B show luminance-current efficiency characteristics and voltage-current characteristics of light-emitting elements of Example 2.
Figure 15B:
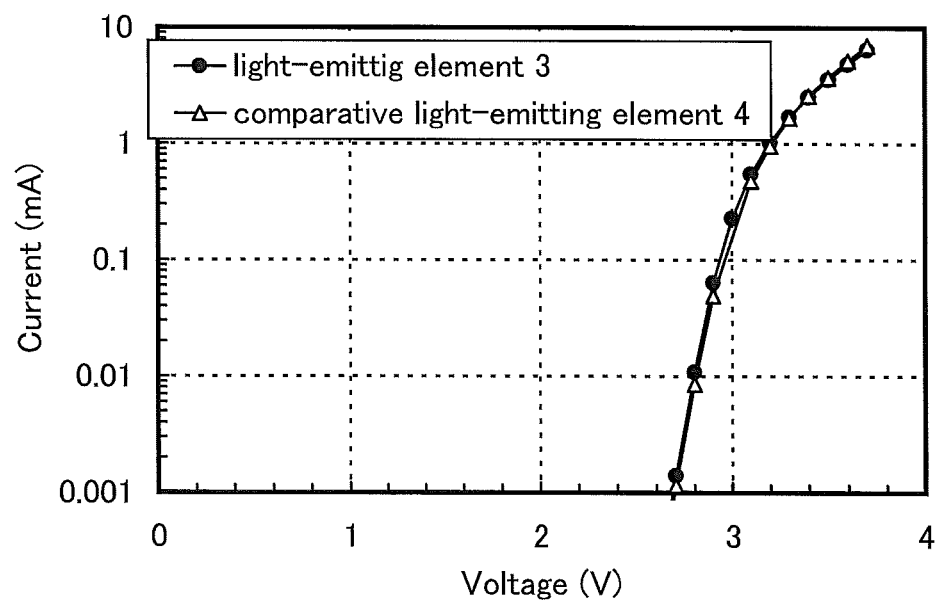
Figure 16:
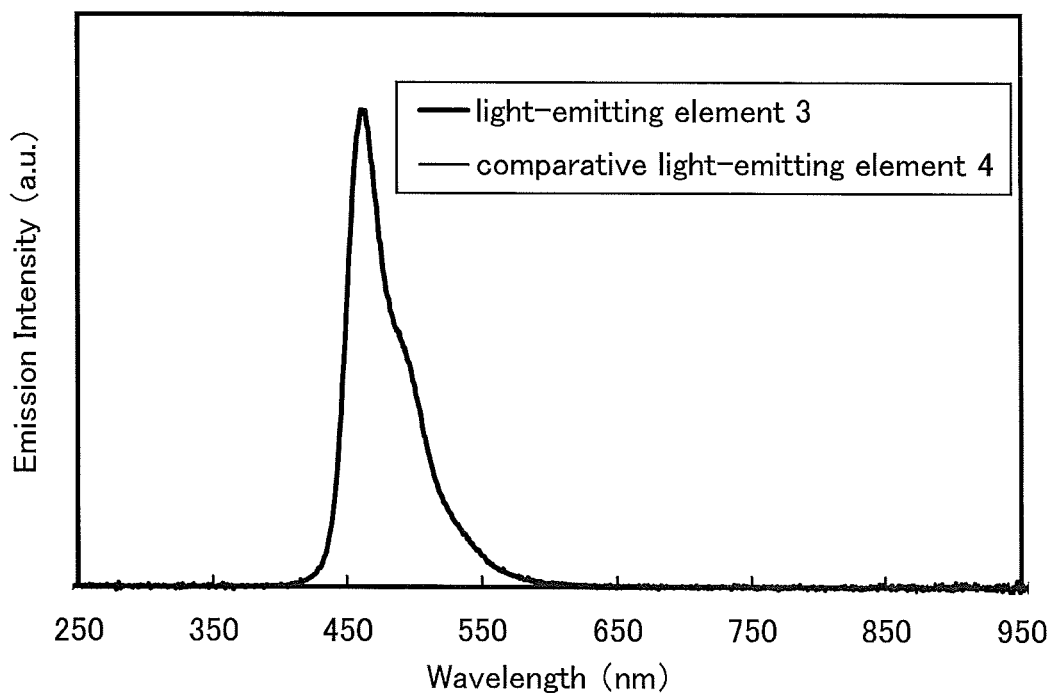
FIG. 16 shows emission spectra of light-emitting elements of Example 2.

FIG. 15A shows luminance-current efficiency characteristics of the light-emitting element 3 and the comparative light-emitting element 4. In FIG. 15A, the horizontal axis represents luminance (cd/m$^2$), and the vertical axis represents current efficiency (cd/A). FIG. 15B shows voltage-current characteristics. In FIG. 15B, the horizontal axis represents voltage (V), and the vertical axis represents current (mA). FIG. 16 shows emission spectra of the light-emitting elements of this example which were obtained by applying a current of 0.1 mA. In FIG. 16, the horizontal axis represents wavelength (nm), and the vertical axis represents emission intensity (arbitrary unit).

Further, Table 4 shows the voltage (V), current density (mA/cm$^2$), CIE chromaticity coordinates (x, y), luminance (cd/m$^2$), current efficiency (cd/A), and power efficiency (lm/W) of each light-emitting element at a luminance of around 1000 cd/m$^2$.

Figure 17:
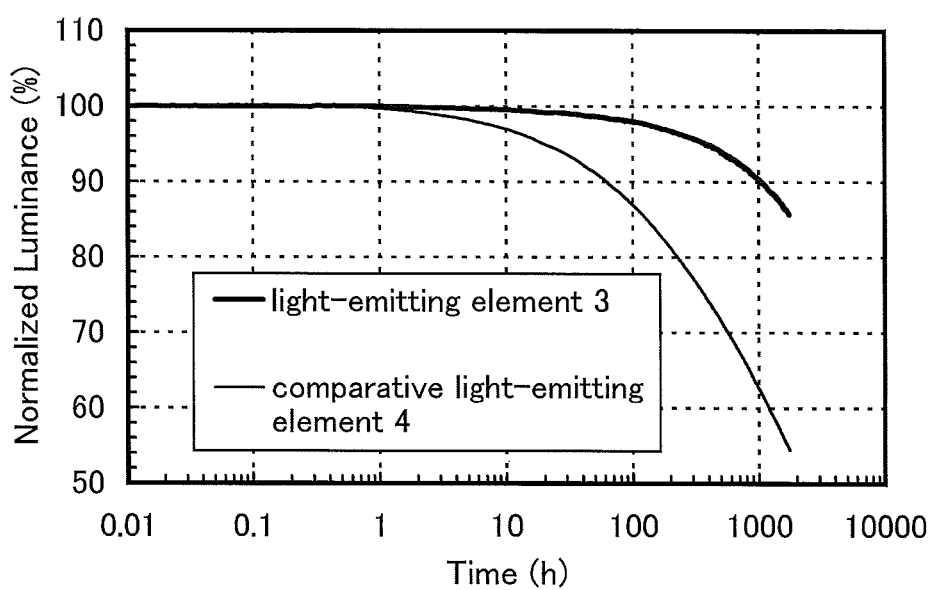
FIG. 17 shows results of reliability tests of light-emitting elements of Example 2.

Next, the light-emitting element 3 and the comparative light-emitting element 4 were subjected to reliability tests. Results of the reliability tests are shown in FIG. 17. In FIG. 17, the vertical axis represents normalized luminance (%) with an initial luminance of 100%, and the horizontal axis represents driving time (h) of the elements. In the reliability tests, the light-emitting elements of this example were driven at room temperature under the conditions where the initial luminance was set to 1000 cd/m$^2$ and the current density was constant. FIG. 17 shows that the comparative light-emitting element 4 kept lower than 70% of the initial luminance after driving for 570 hours. On the other hand, the light-emitting element 3 kept 86% of the initial luminance after the driving for 1800 hours. These results of the reliability tests revealed that the light-emitting element 3 has a longer lifetime than the comparative light-emitting element 4.

The manufacturing process of the light-emitting element 3 and that of the comparative light-emitting element 4 were different in an environment of the deposition chamber (the partial pressure of water) at formation of the hole-injection layer. In addition, in the comparative light-emitting element 4, there was no period during which the deposition material was heated and vaporized before a period during which the hole-injection layer was formed (period C). On the other hand, in the light-emitting element 3 to which one embodiment of the present invention was applied, there was a period during which the deposition material was heated and vaporized (period C) before a period during which the hole-injection layer was formed (period D). In addition, at the start of the period D, the partial pressure of water in the deposition chamber was lower than the average partial pressure of water in the period C.

The difference of results in the reliability tests between the light-emitting element 3 and the comparative light-emitting element 4 is thought to be due to the difference of conditions at formation of the above hole-injection layers. This example shows that a light-emitting element having a long

TABLE 4

| | Voltage (V) | Current density (mA/cm$^2$) | Chromaticity (x, y) | Luminance (cd/m$^2$) | Current efficiency (cd/A) | Power efficiency (lm/W) |
|---|---|---|---|---|---|---|
| Light-emitting element 3 | 3.1 | 13.7 | (0.14, 0.16) | 1100 | 7.7 | 7.8 |
| Comparative light-emitting element 4 | 3.1 | 11.9 | (0.14, 0.16) | 900 | 7.3 | 7.4 |

As shown in FIGS. 15A and 15B, luminance-current efficiency characteristics and voltage-current characteristics do not differ between the light-emitting element 3 and the comparative light-emitting element 4. Further, as shown in FIG. 16, the light-emitting element 3 and the comparative light-emitting element 4 show almost similar emission spectra.

lifetime can be manufactured by application of one embodiment of the present invention.

Example 3

In this example, a light-emitting element manufactured by a method for manufacturing a light-emitting element according to one embodiment of the present invention is described with reference to FIG. 7B. Materials used in this example are the same as those used in Example 1, and their chemical formulae are omitted here.

A light-emitting element 5 and a comparative light-emitting element 6 which are described in this example are provided over the substrate 1100 and have a structure in which the EL layer 1102 is provided between the first electrode 1101 and the second electrode 1103, and materials and thicknesses of layers included in the EL layers 1102 are the same.

A pair of electrodes included in each of the light-emitting element 5 and the comparative light-emitting element 6 is manufactured under conditions (a material, a thickness, or the like) similar to those in Example 1. Further, the EL layer 1102 included in each of the light-emitting element 5 and the comparative light-emitting element 6 includes the hole-injection layer 501, the hole-transport layer 502, the light-emitting layer 503, the electron-transport layer 504, and the electron-injection layer 506.

The hole-injection layer 501, the hole-transport layer 502, the electron-transport layer 504, and the electron-injection layer 506 are formed under conditions (materials, thicknesses, or the like) similar to those of the first hole-injection layer 501a, the first hole-transport layer 502a, the first electron-transport layer 504a, and the electron-injection layer 506 in Example 1, respectively.

The light-emitting layer 503 is formed using a material and a thickness similar to those of the first light-emitting layer 503a in Example 1. The light-emitting element 5 and the comparative light-emitting element 6 are different in a method for forming the light-emitting layer 503.

The method for forming the light-emitting layer 503, which is a difference between the light-emitting element 5 and the comparative light-emitting element 6, is described below with reference to FIG. 18 and FIGS. 19A and 19B.

Figure 18:
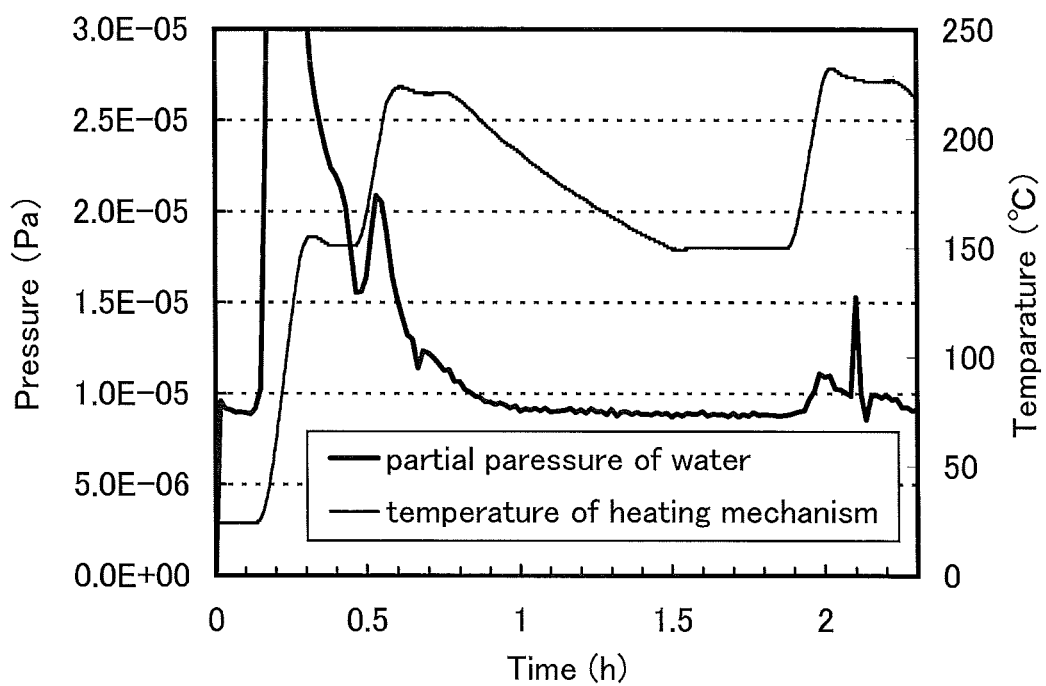
FIG. 18 shows the partial pressure of water in Example 3.
Figure 19A:
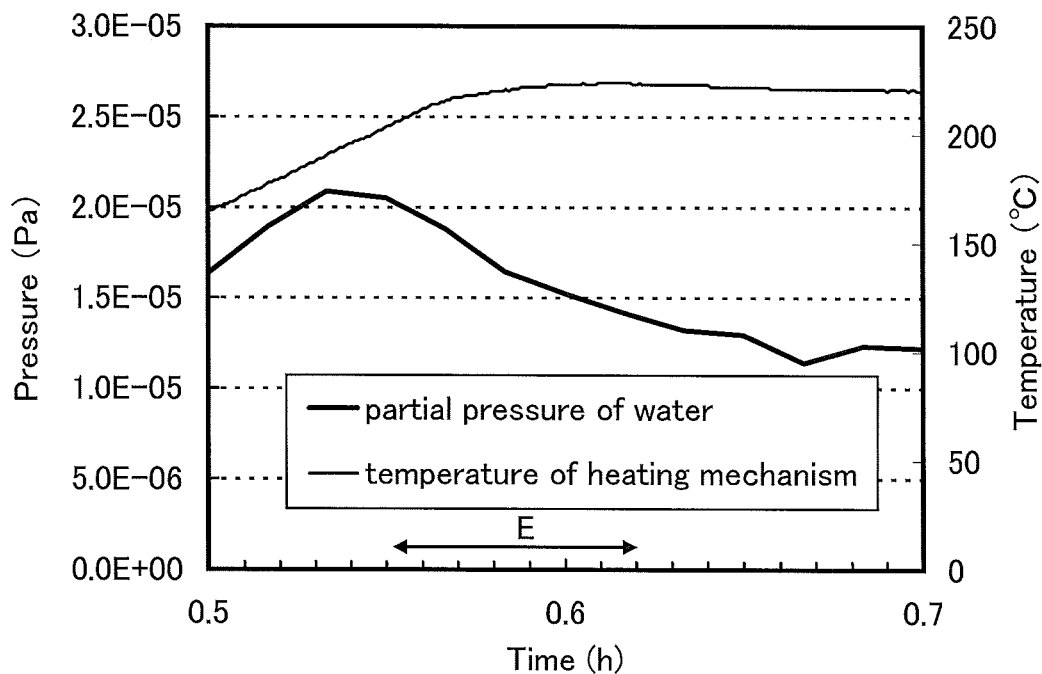
FIGS. 19A and 19B show the partial pressure of water in Example 3.
Figure 19B:
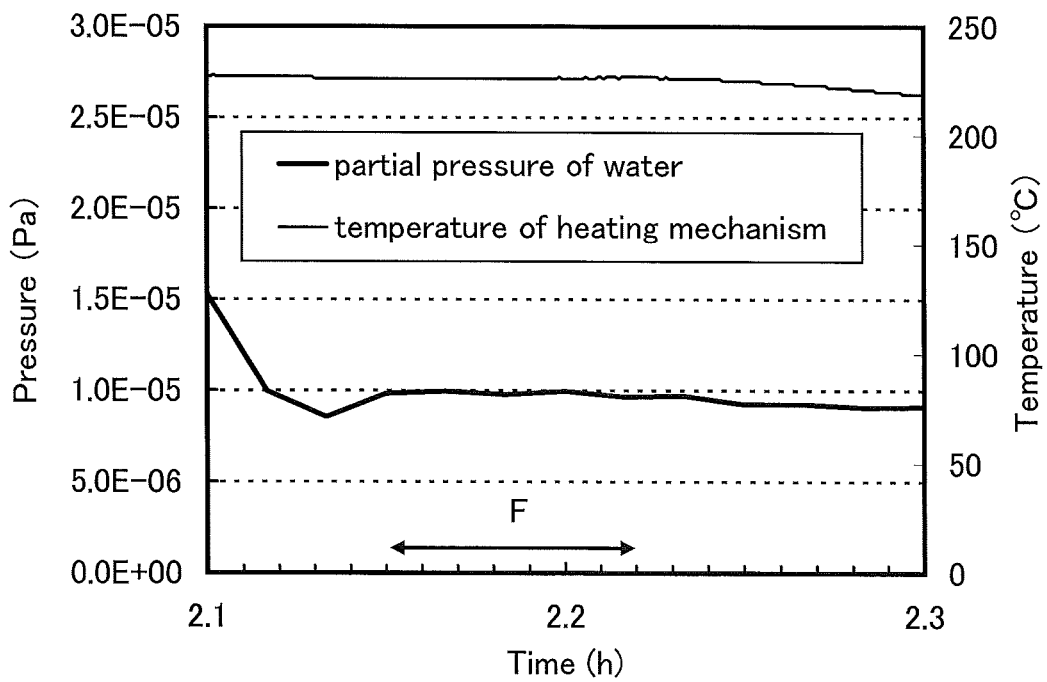

FIG. 18 and FIGS. 19A and 19B show results of the partial pressure of water ($^{18}H_2O$) in a deposition chamber in which the light-emitting layer 503 included in the light-emitting element of this example is deposited, which was measured with a quadrupole mass spectrometer. FIG. 18 shows measurement results for 2.3 hours from the start of the measurement with the quadrupole mass spectrometer, FIG. 19A shows measurement results in the range from 0.50 hours to 0.70 hours including a period during which the light-emitting layer 503 of the comparative light-emitting element 6 was formed, and FIG. 19B shows measurement results in the range from 2.10 hours to 2.30 hours including a period during which the light-emitting layer 503 of the light-emitting element 5 was formed.

First, the temperature of a heating mechanism (here, a heater) included in a deposition material holding portion was increased to 150° C., kept at around 150° C., and then further increased to higher than or equal to a temperature at which CzPA and 1,6 mMemFLPAPrn were vaporized.

Then, in the range from 0.55 hours to 0.62 hours (period E in FIG. 19A), a light-emitting layer of the comparative light-emitting element 6 was formed. The average partial pressure of water in the period E was $1.70 \times 10^{-5}$ Pa.

After that, a substrate placed in the deposition chamber was switched from a supporting substrate of the comparative light-emitting element 6 to a supporting substrate of the light-emitting element 5. Then, it was confirmed that the partial pressure of water became smaller than the average partial pressure of water in the period E, and the light-emitting layer of the light-emitting element 5 was formed in the range from 2.15 hours to 2.22 hours (period F shown in FIG. 19B). Note that the average partial pressure of water in the period F was $9.88 \times 10^{-6}$ Pa. As described above, the light-emitting layer of the light-emitting element 5 was formed in the deposition chamber in which the partial pressure of water was smaller than that of the comparative light-emitting element 6.

Table 5 shows element structures of the light-emitting element 5 and the comparative light-emitting element 6 obtained as described above.

TABLE 5

| First electrode | Hole-injection layer | Hole-transport layer | Light-emitting layer | Electron-transport layer | Electron-injection layer | Second electrode |
|---|---|---|---|---|---|---|
| ITSO 110 nm | PCzPA:MoOx (=2:1) 37 nm | PCzPA 30 nm | CzPA:1,6mMemFLPAPrn (=2:0.05) 30 nm | CzPA 5 nm | BPhen 15 nm | LiF 1 nm | Al 200 nm |

Figure 20A:
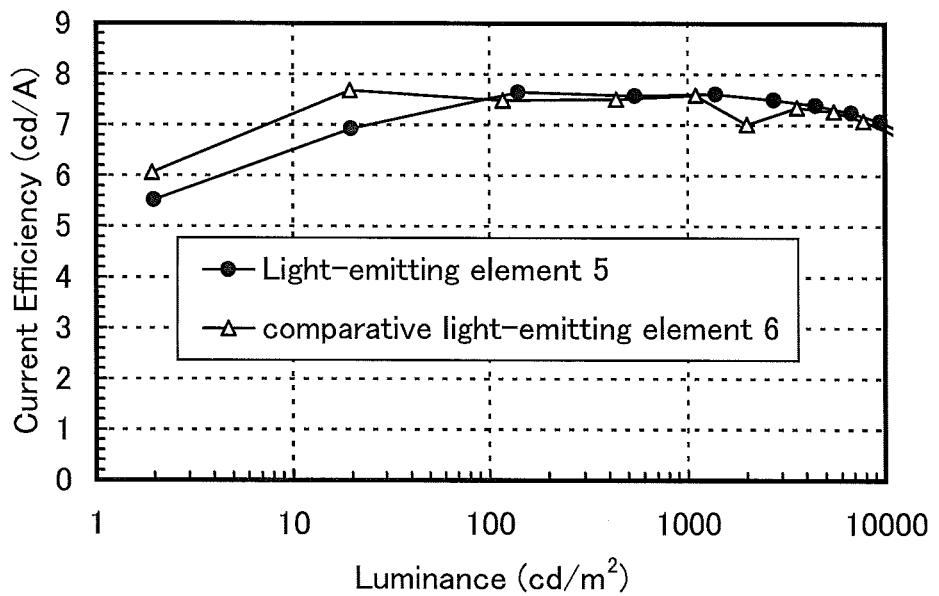
FIGS. 20A and 20B show luminance-current efficiency characteristics and voltage-current characteristics of light-emitting elements of Example 3.
Figure 20B:
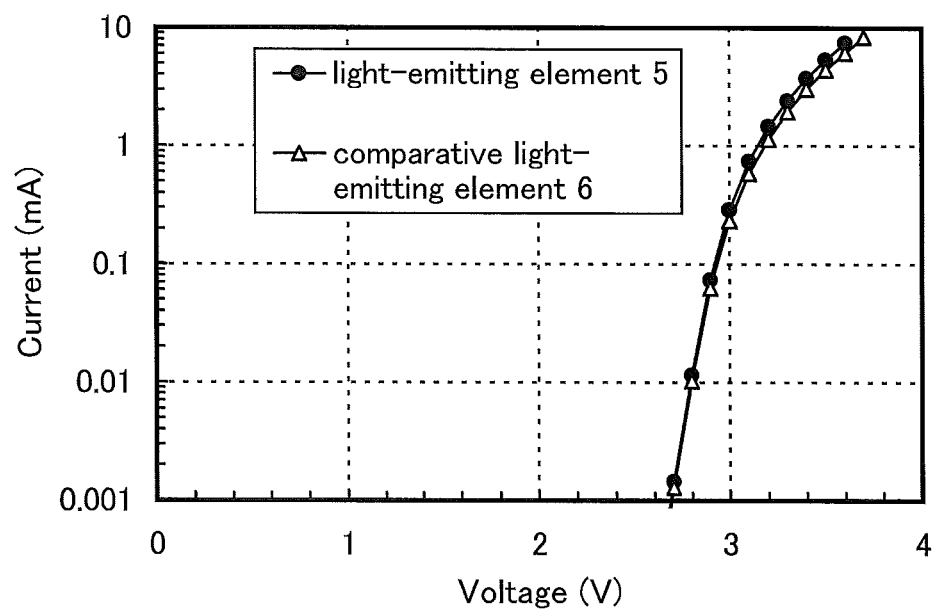
Figure 21:
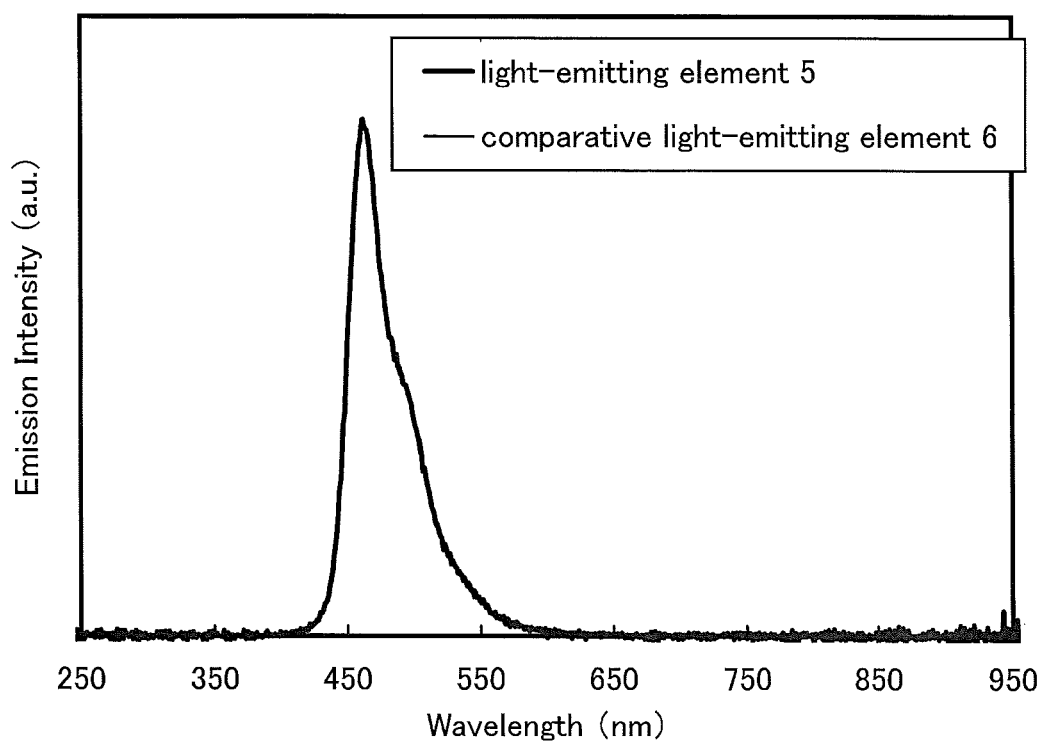
FIG. 21 shows emission spectra of light-emitting elements of Example 3.

FIG. 20A shows luminance-current efficiency characteristics of the light-emitting element 5 and the comparative light-emitting element 6. In FIG. 20A, the horizontal axis represents luminance (cd/m$^2$), and the vertical axis represents current efficiency (cd/A). FIG. 20B shows voltage-current characteristics. In FIG. 20B, the horizontal axis represents voltage (V), and the vertical axis represents current (mA). FIG. 21 shows emission spectra of the light-emitting elements of this example which were obtained by applying a current of 0.1 mA. In FIG. 21, the horizontal axis represents wavelength (nm), and the vertical axis represents emission intensity (arbitrary unit).

Further, Table 6 shows the voltage (V), current density (mA/cm$^2$), CIE chromaticity coordinates (x, y), luminance (cd/m$^2$), current efficiency (cd/A), and power efficiency (lm/W) of each light-emitting element at a luminance of around 1000 cd/m$^2$.

TABLE 6

| | Voltage (V) | Current density (mA/cm$^2$) | Chromaticity (x, y) | Luminance (cd/m$^2$) | Current efficiency (cd/A) | Power efficiency (lm/W) |
|---|---|---|---|---|---|---|
| Light-emitting element 5 | 3.1 | 18.4 | (0.14, 0.16) | 1400 | 7.6 | 7.7 |

TABLE 6-continued

|  | Voltage (V) | Current density (mA/cm$^2$) | Chromaticity (x, y) | Luminance (cd/m$^2$) | Current efficiency (cd/A) | Power efficiency (lm/W) |
|---|---|---|---|---|---|---|
| Comparative light-emitting element 6 | 3.1 | 14.6 | (0.14, 0.15) | 1100 | 7.6 | 7.7 |

As shown in FIGS. 20A and 20B, luminance-current efficiency characteristics and voltage-current characteristics do not differ between the light-emitting element 5 and the comparative light-emitting element 6. Further, as shown in FIG. 21, the light-emitting element 5 and the comparative light-emitting element 6 show almost similar emission spectra.

Figure 22:
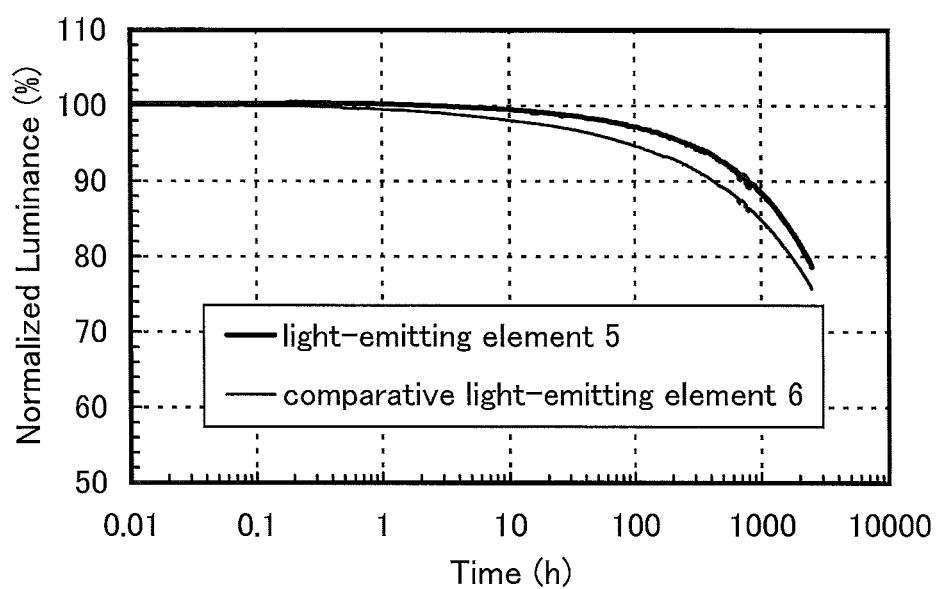
FIG. 22 shows results of reliability tests of light-emitting elements of Example 3.

Next, the light-emitting element 5 and the comparative light-emitting element 6 were subjected to reliability tests. Results of the reliability tests are shown in FIG. 22. In FIG. 22, the vertical axis represents normalized luminance (%) with an initial luminance of 100%, and the horizontal axis represents driving time (h) of the elements. In the reliability tests, the light-emitting elements of this example were driven at room temperature under the conditions where the initial luminance was set to 1000 cd/m$^2$ and the current density was constant. FIG. 22 shows that the comparative light-emitting element 6 kept 76% of the initial luminance after driving for 2500 hours. On the other hand, the light-emitting element 5 kept 79% of the initial luminance after the driving for 2500 hours. These results of the reliability tests revealed that the light-emitting element 5 has a longer lifetime than the comparative light-emitting element 6.

The manufacturing process of the light-emitting element 5 and that of the comparative light-emitting element 6 were different in an environment of the deposition chamber (the partial pressure of water) at formation of the light-emitting layer. In addition, in the comparative light-emitting element 6, there was no period during which the deposition material was heated and vaporized before a period during which the light-emitting layer was formed (period E). On the other hand, in the light-emitting element 5 to which one embodiment of the present invention was applied, there was a period during which the deposition material was heated and vaporized (period E) before a period during which the light-emitting layer was formed (period F). In addition, at the start of the period F, the partial pressure of water in the deposition chamber was lower than the average partial pressure of water in the period E.

The difference of results in the reliability tests between the light-emitting element 5 and the comparative light-emitting element 6 is thought to be due to the difference of conditions at formation of the above light-emitting layers. This example shows that a light-emitting element having a long lifetime can be manufactured by application of one embodiment of the present invention.

Example 4

In this example, a light-emitting element manufactured by a method for manufacturing a light-emitting element according to one embodiment of the present invention is described with reference to FIG. 7B. Materials used in this example are the same as those used in Example 1, and their chemical formulae are omitted here.

A light-emitting element 7 and a comparative light-emitting element 8 which are described in this example are provided over the substrate 1100 and have a structure in which the EL layer 1102 is provided between the first electrode 1101 and the second electrode 1103, and materials and thicknesses of layers included in the EL layers 1102 are the same.

A pair of electrodes included in each of the light-emitting element 7 and the comparative light-emitting element 8 is manufactured under conditions (a material, a thickness, or the like) similar to those in Example 1. Further, the EL layer 1102 included in each of the light-emitting element 7 and the comparative light-emitting element 8 includes the hole-injection layer 501, the hole-transport layer 502, the light-emitting layer 503, the electron-transport layer 504, and the electron-injection layer 506.

The hole-injection layer 501, the hole-transport layer 502, the electron-transport layer 504, and the electron-injection layer 506 are formed under conditions (materials, thicknesses, or the like) similar to the second hole-injection layer 501b, the second hole-transport layer 502b, the second electron-transport layer 504b, and the electron-injection layer 506 in Example 1, respectively. The thickness of the hole-injection layer 501 was set to 50 nm.

The light-emitting layer 503 is formed using a material similar to that of the third light-emitting layer 503c in Example 1 and has a thickness of 40 nm. The light-emitting element 7 and the comparative light-emitting element 8 are different in a method for forming the light-emitting layer 503.

The method for forming the light-emitting layer 503, which is a difference between the light-emitting element 7 and the comparative light-emitting element 8, is described below with reference to FIG. 23 and FIGS. 24A and 24B.

Figure 23:
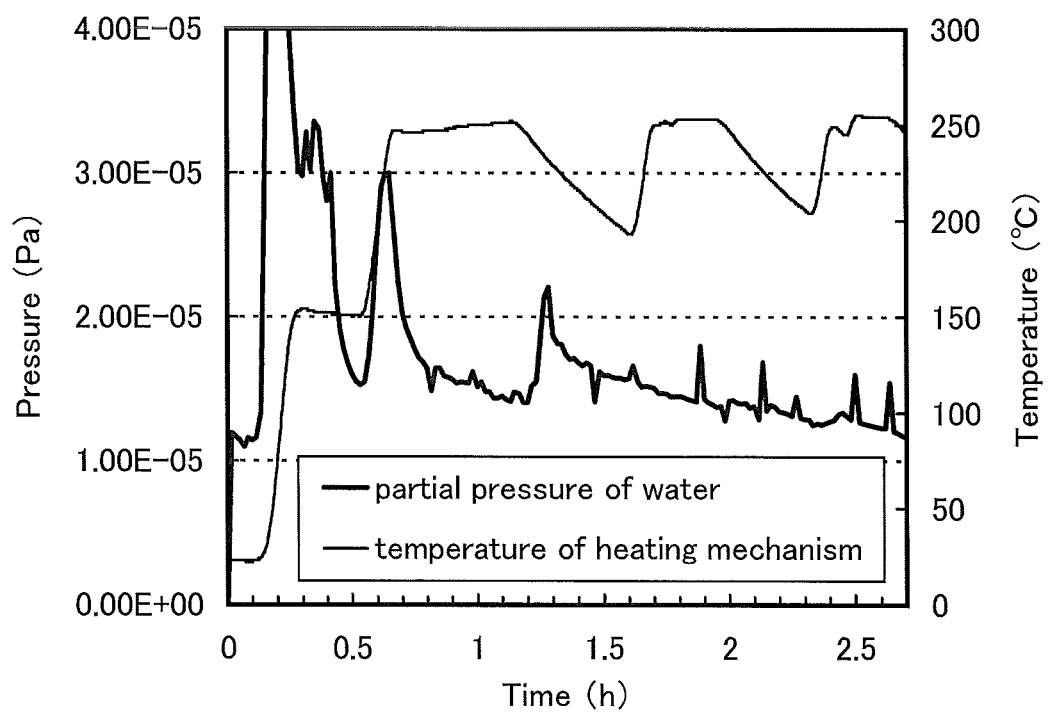
FIG. 23 shows the partial pressure of water in Example 4.
Figure 24A:
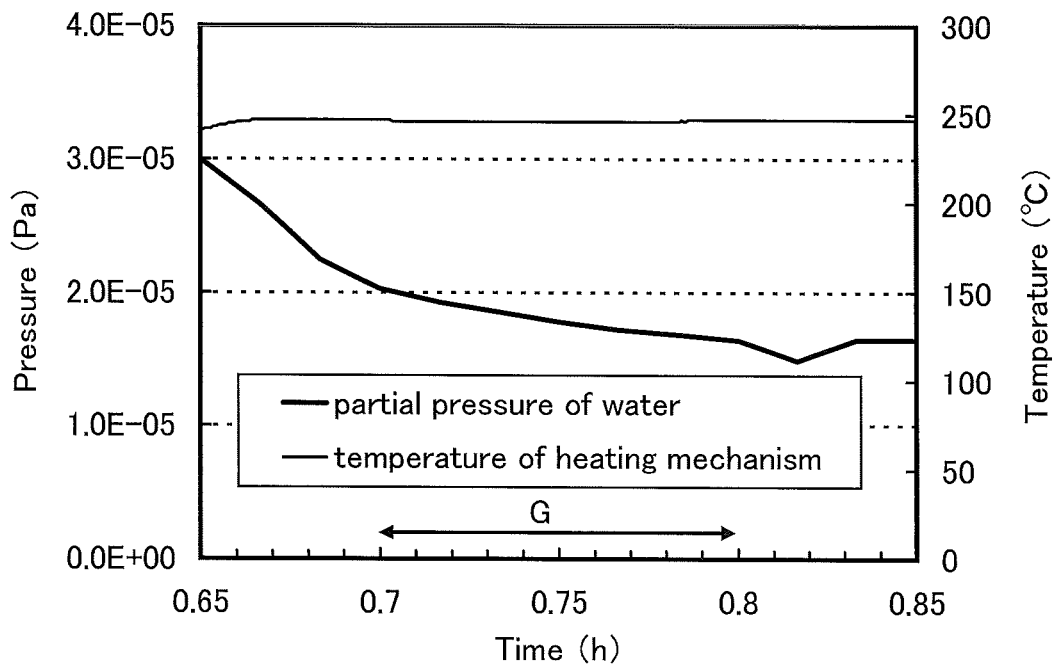
FIGS. 24A and 24B show the partial pressure of water in Example 4.
Figure 24B:
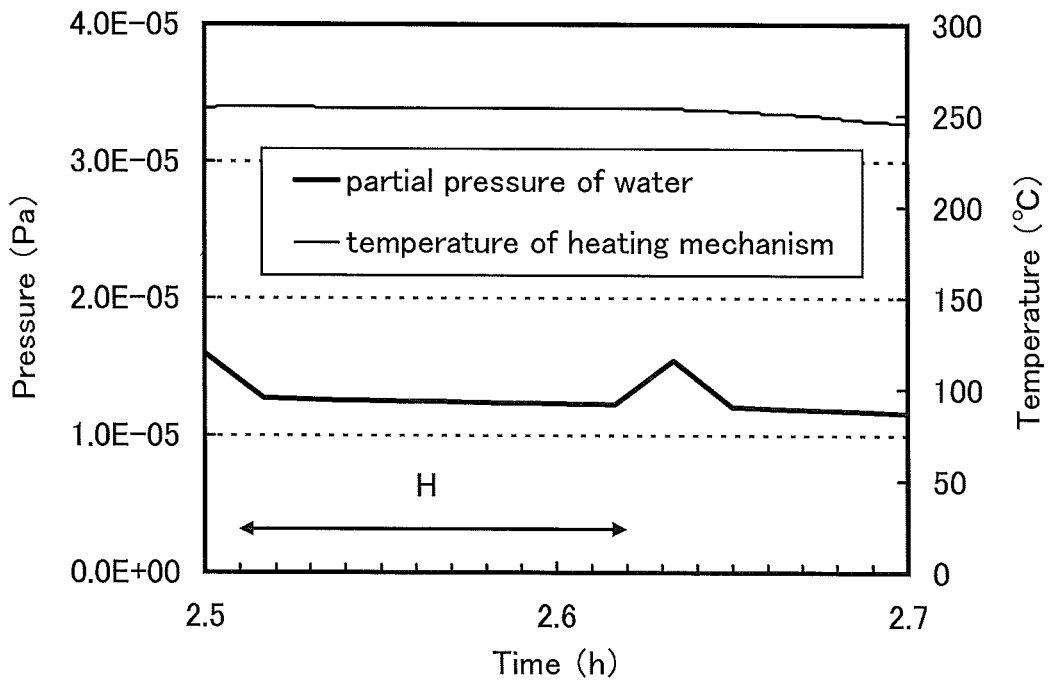

FIG. 23 and FIGS. 24A and 24B show results of the partial pressure of water ($^{18}$H$_2$O) in a deposition chamber in which the light-emitting layer 503 included in the light-emitting element of this example is deposited, which was measured with a quadrupole mass spectrometer. FIG. 23 shows measurement results for 2.7 hours from the start of the measurement with the quadrupole mass spectrometer, FIG. 24A shows measurement results in the range from 0.65 hours to 0.85 hours including a period during which the light-emitting layer 503 of the comparative light-emitting element 8 was formed, and FIG. 24B shows measurement results in the range from 2.50 hours to 2.70 hours including a period during which the light-emitting layer 503 of the light-emitting element 7 was formed.

First, the temperature of a heating mechanism (here, a heater) included in a deposition material holding portion was increased to 150° C., kept at around 150° C., and then further increased to higher than or equal to a temperature at which 2mDBTPDBq-II, PCBA1BP, and [Ir(dppm)$_2$(acac)] were vaporized.

Then, in the range from 0.70 hours to 0.80 hours (period G in FIG. 24A), a light-emitting layer of the comparative light-emitting element 8 was formed. The average partial pressure of water in the period G was 1.80×10$^{-5}$ Pa.

After that, a substrate placed in the deposition chamber was switched from a supporting substrate of the comparative light-emitting element 8 to a supporting substrate of the light-emitting element 7. Then, it was confirmed that the partial pressure of water became smaller than the average partial pressure of water in the period G, and the light-emitting layer of the light-emitting element 7 was formed in the range from 2.51 hours to 2.62 hours (period H shown in FIG. 24B). Note that the average partial pressure of water in the period H was $1.24 \times 10^{-5}$ Pa. As described above, the light-emitting layer of the light-emitting element 7 was formed in the deposition chamber in which the partial pressure of water was smaller than that in the comparative light-emitting element 8.

Table 7 shows element structures of the light-emitting element 7 and the comparative light-emitting element 8 obtained as described above.

TABLE 7

| First electrode | Hole-injection layer | Hole-transport layer | Light-emitting layer | Electron-transport layer | Electron-injection layer | Second electrode |
|---|---|---|---|---|---|---|
| ITSO 110 nm | BPAFLP:MoOx (=2:1) 50 nm | BPAFLP 20 nm | 2mDBTPDBq-II:PCBA1BP:[Ir(dppm)$_2$(acac)] (=1.6:0.4:0.12) 40 nm | 2mDBTPDBq-II 15 nm | BPhen 15 nm | LiF 1 nm | Al 200 nm |

Figure 25A:
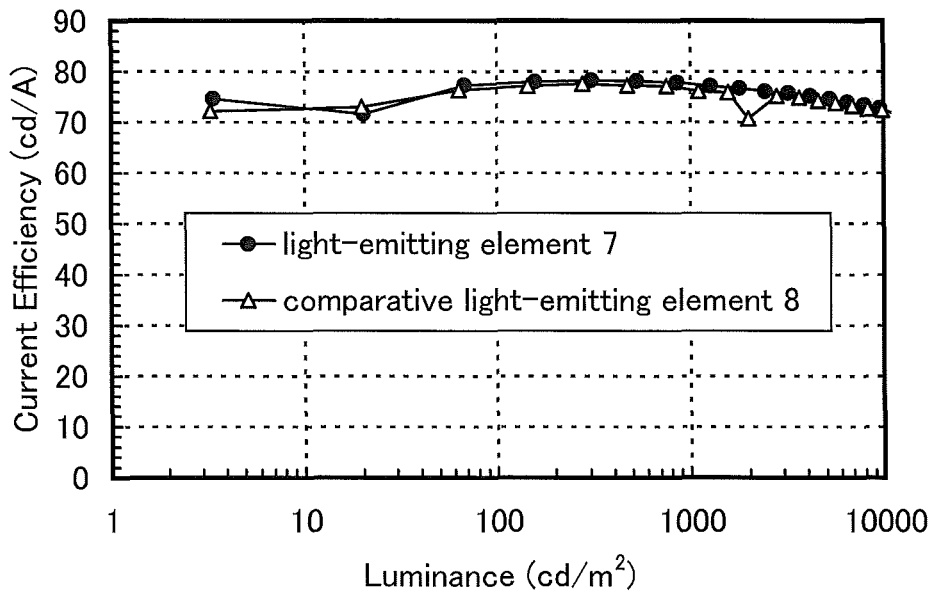
FIGS. 25A and 25B luminance-current efficiency characteristics and voltage-current characteristics of light-emitting elements of Example 4.
Figure 25B:
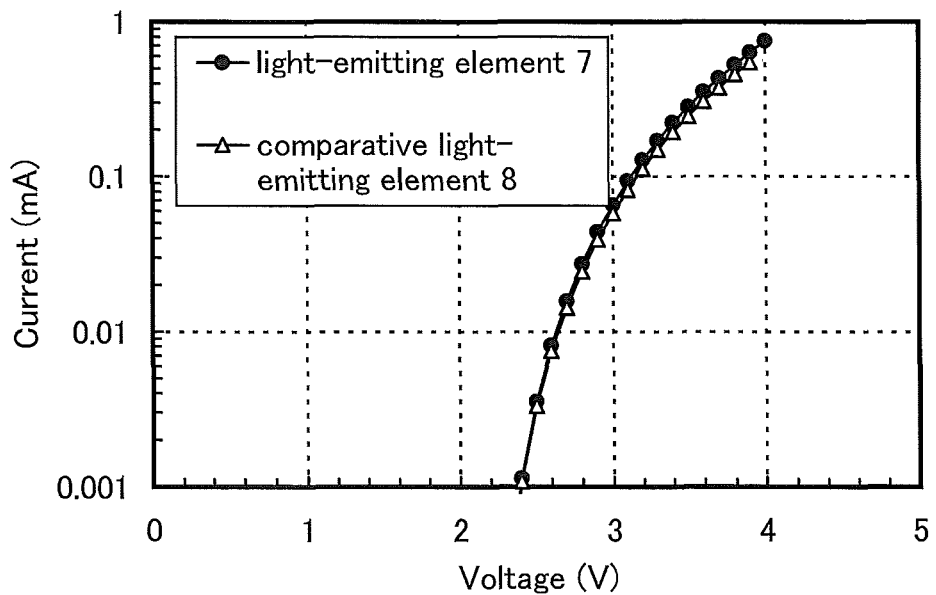
Figure 26:
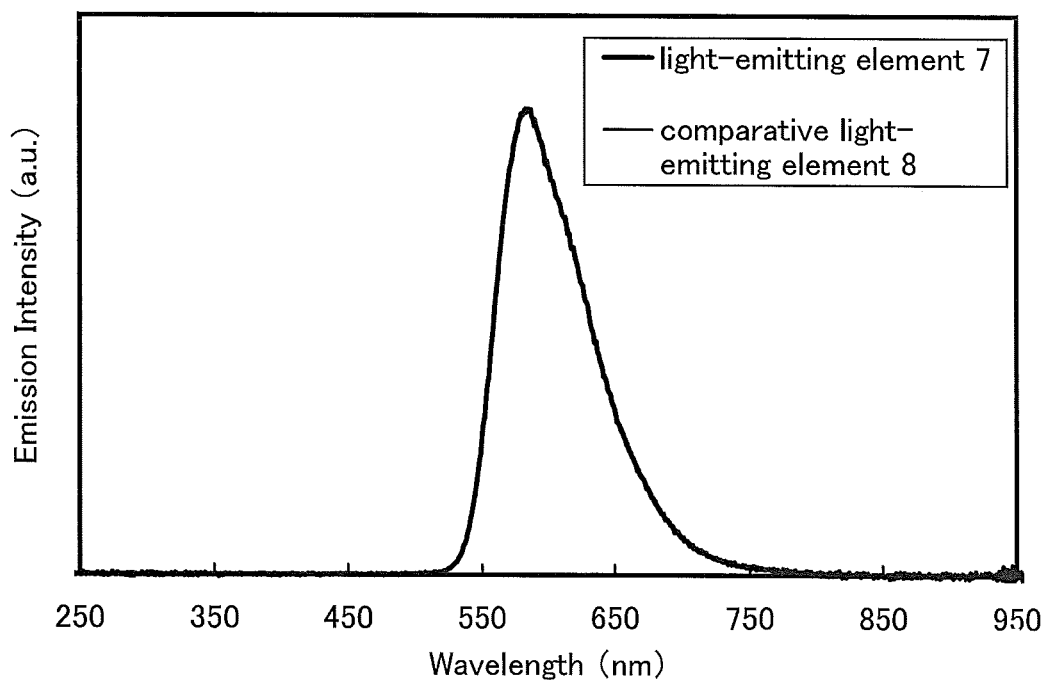
FIG. 26 shows emission spectra of light-emitting elements of Example 4.

FIG. 25A shows luminance-current efficiency characteristics of the light-emitting element 7 and the comparative light-emitting element 8. In FIG. 25A, the horizontal axis represents luminance (cd/m$^2$), and the vertical axis represents current efficiency (cd/A). FIG. 25B shows voltage-current characteristics. In FIG. 25B, the horizontal axis represents voltage (V), and the vertical axis represents current (mA). FIG. 26 shows emission spectra of the light-emitting elements of this example which were obtained by applying a current of 0.1 mA. In FIG. 26, the horizontal axis represents wavelength (nm), and the vertical axis represents emission intensity (arbitrary unit).

Further, Table 8 shows the voltage (V), current density (mA/cm$^2$), CIE chromaticity coordinates (x, y), luminance (cd/m$^2$), current efficiency (cd/A), and power efficiency (lm/W) of each light-emitting element at a luminance of around 1000 cd/m$^2$.

TABLE 8

| | Voltage (V) | Current density (mA/cm$^2$) | Chromaticity (x, y) | Luminance (cd/m$^2$) | Current efficiency (cd/A) | Power efficiency (lm/W) |
|---|---|---|---|---|---|---|
| Light-emitting element 7 | 2.9 | 1.1 | (0.56, 0.44) | 800 | 77 | 84 |
| Comparative light-emitting element 8 | 3.0 | 1.5 | (0.56, 0.44) | 1100 | 76 | 80 |

As shown in FIGS. 25A and 25B, luminance-current efficiency characteristics and voltage-current characteristics do not differ between the light-emitting element 7 and the comparative light-emitting element 8. Further, as shown in FIG. 26, the light-emitting element 7 and the comparative light-emitting element 8 show almost similar emission spectra.

Figure 27:
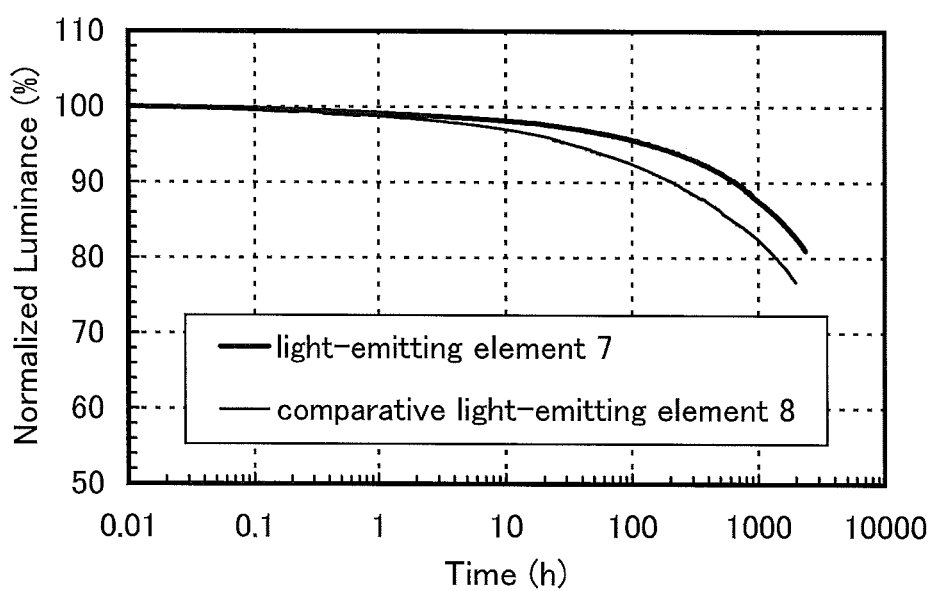
FIG. 27 shows results of reliability tests of light-emitting elements of Example 4.

Next, the light-emitting element 7 and the comparative light-emitting element 8 were subjected to reliability tests. Results of the reliability tests are shown in FIG. 27. In FIG. 27, the vertical axis represents normalized luminance (%) with an initial luminance of 100%, and the horizontal axis represents driving time (h) of the elements. In the reliability tests, the light-emitting elements of this example were driven at room temperature under the conditions where the initial luminance was set to 5000 cd/m$^2$ and the current density was constant. FIG. 27 shows that the comparative light-emitting element 8 kept 77% of the initial luminance after driving for 2000 hours. On the other hand, the light-emitting element 7 kept 81% of the initial luminance after the driving for 2400 hours. These results of the reliability tests revealed that the light-emitting element 7 has a longer lifetime than the comparative light-emitting element 8.

The manufacturing process of the light-emitting element 7 and that of the comparative light-emitting element 8 were different in an environment of the deposition chamber (the partial pressure of water) at formation of the light-emitting layer. In addition, in the comparative light-emitting element 8, there was no period during which the deposition material was heated and vaporized before a period during which the light-emitting layer was formed (period G). On the other hand, in the light-emitting element 7 to which one embodiment of the present invention was applied, there was a period during which the deposition material was heated and vaporized (period G) before a period during which the light-emitting layer was formed (period H). In addition, at the start of the period H, the partial pressure of water in the deposition chamber was lower than the average partial pressure of water in the period G.

The difference of results in the reliability tests between the light-emitting element 7 and the comparative light-emitting element 8 is thought to be due to the difference of conditions at formation of the above light-emitting layers. This example shows that a light-emitting element having a long lifetime can be manufactured by application of one embodiment of the present invention.

This application is based on Japanese Patent Application serial no. 2012-105543 filed with Japan Patent Office on May 4, 2012, Japanese Patent Application serial no. 2012-105544 filed with Japan Patent Office on May 4, 2012, and Japanese Patent Application serial no. 2013-053385 filed with Japan Patent Office on Mar. 15, 2013, the entire contents of which are hereby incorporated by reference.

What is claimed is:

1. A method for manufacturing a light-emitting element comprising the step of:
    forming a first electrode over a substrate;
    evaporating an organic compound under a reduced pressure to form a layer containing the organic compound over the first electrode in a chamber while measuring a partial pressure of water in the chamber; and forming a second electrode over the layer containing the organic compound.

2. The method for manufacturing the light-emitting element according to claim 1, wherein the evaporating step is performed while a wall of the chamber is cooled.

3. The method for manufacturing the light-emitting element according to claim 1, wherein the evaporating step is performed at the partial pressure of water lower than or equal to $1\times10^{-4}$ Pa.

4. The method for manufacturing the light-emitting element according to claim 1, wherein the evaporating step is performed at a partial pressure of an oxygen atom lower than or equal to $2\times10^{-6}$ Pa.

5. The method for manufacturing the light-emitting element according to claim 1, wherein the partial pressure of water is measured by a mass spectrometer.

6. The method for manufacturing the light-emitting element according to claim 1, wherein the partial pressure of water is measured by a quadrupole mass spectrometer.

7. The method for manufacturing the light-emitting element according to claim 1, further comprising a step:

evaporating a second organic compound under a reduced pressure to form a layer containing the second organic compound over the layer containing the organic compound in a second chamber while measuring a partial pressure of water in the second chamber.

8. The method for manufacturing the light-emitting element according to claim 1, wherein a partial pressure of oxygen in the chamber is also measured during the step of evaporating the organic compound.

9. The method for manufacturing the light-emitting element according to claim 1, wherein a second organic compound is also evaporated during the step of evaporating the organic compound so that the layer containing the organic compound also contains the second organic compound.

10. A method for manufacturing a light-emitting element, comprising the steps of:

a first step of keeping a deposition material at a first temperature at which the deposition material is not vaporized and water is vaporized in a deposition chamber while measuring a partial pressure of water in the deposition chamber;

a second step of keeping the deposition material at a second temperature at which the deposition material is vaporized in the deposition chamber after the first step while measuring the partial pressure of water in the deposition chamber; and a third step of starting deposition of the deposition material over a substrate after the second step while measuring the partial pressure of water in the deposition chamber, wherein the partial pressure of water in the deposition chamber at a time when the deposition is started is lower than an average partial pressure of water in the first step and the second step.

11. The method for manufacturing the light-emitting element according to claim 10, wherein deposition of the deposition material is not performed at the first step and the second step.

12. The method for manufacturing the light-emitting element according to claim 10, wherein the first step, the second step and the third step are performed while measuring the partial pressure of water with use of a mass spectrometer.

13. The method for manufacturing the light-emitting element according to claim 12, wherein the mass spectrometer is a quadrupole mass spectrometer.

14. The method for manufacturing the light-emitting element according to claim 10, comprising the step of stopping heating the deposition material between the second step and the third step.

15. The method for manufacturing the light-emitting element according to claim 10, wherein the first step and the second step are performed while a wall of the deposition chamber is heated.

16. The method for manufacturing the light-emitting element according to claim 10, wherein the third step is performed while a wall of the deposition chamber is cooled.

17. The method for manufacturing the light-emitting element according to claim 10, wherein the third step is performed at the partial pressure of water lower than or equal to $1\times10^{-4}$ Pa.

18. The method for manufacturing the light-emitting element according to claim 10, wherein the third step is performed at a partial pressure of an oxygen atom lower than or equal to $2\times10^{-6}$ Pa.

19. The method for manufacturing the light-emitting element according to claim 10, wherein the partial pressure of water in the deposition chamber at the time when the deposition is started is lower than or equal to $1\times10^{-4}$ Pa.

20. The method for manufacturing the light-emitting element according to claim 10, further comprising steps:

forming a first electrode over the substrate before the third step; and forming a second electrode over the substrate before the third step.

21. The method for manufacturing the light-emitting element according to claim 10, wherein a partial pressure of oxygen in the deposition chamber is also measured in the first step.

22. The method for manufacturing the light-emitting element according to claim 10, wherein a partial pressure of oxygen in the deposition chamber is also measured in the second step.

23. The method for manufacturing the light-emitting element according to claim 10, wherein a partial pressure of oxygen in the deposition chamber is also measured in the third step.

* * * * *